(12) United States Patent
Motoyoshi

(10) Patent No.: US 6,958,503 B2
(45) Date of Patent: Oct. 25, 2005

(54) NONVOLATILE MAGNETIC MEMORY DEVICE

(75) Inventor: Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 40 days.

(21) Appl. No.: 10/751,747

(22) Filed: Jan. 5, 2004

(65) Prior Publication Data

US 2004/0135184 A1    Jul. 15, 2004

(30) Foreign Application Priority Data

Jan. 6, 2003    (JP)    ............................ P2003-000485

(51) Int. Cl.⁷ ............................................. H01L 29/76
(52) U.S. Cl. ..................... 257/295; 257/298; 257/303; 257/306; 257/324; 257/421; 438/3; 438/240
(58) Field of Search ................... 257/68, 71, 295–314, 257/324–326; 438/3, 240

(56) References Cited

U.S. PATENT DOCUMENTS

| 5,940,319 A | * | 8/1999 | Durlam et al. .............. 365/171 |
| 6,174,737 B1 | * | 1/2001 | Durlam et al. ................. 438/3 |
| 6,703,676 B2 | * | 3/2004 | Hirai et al. ................. 257/421 |

* cited by examiner

*Primary Examiner*—Andy Huynh
(74) *Attorney, Agent, or Firm*—Sonnenschein, Nath & Rosenthal LLP

(57) ABSTRACT

The MRAM has a transistor for selection, a lower insulating interlayer, a first connecting hole, a first wiring formed on the lower insulating interlayer, a tunnel magnetoresistance device formed on the first wiring through an insulating film, an upper insulating interlayer, and a second wiring, in which a lower surface of the tunnel magnetoresistance device is electrically connected to the first connecting hole through a second connecting hole, and the tunnel magnetoresistance device, the insulating film and the first wiring have nearly the same widths along the second direction.

5 Claims, 38 Drawing Sheets

[STEP-115]

[STEP-120]

[STEP-125]

[STEP-125] CONTINUED

[STEP-125] CONTINUED

[STEP-125] CONTINUED

[STEP-125] CONTINUED

[STEP-130]

[STEP-135]

[STEP-140]

[STEP-200]

[STEP-205]

[STEP-210]

[STEP-210] CONTINUED

[STEP-210] CONTINUED

[STEP-210] CONTINUED

[STEP-210] CONTINUED

[STEP-215]

[STEP-220]

[STEP-225]

[STEP-230]

[STEP-235]

[STEP-520]

[STEP-525]

[STEP-530]

[STEP-535]

[STEP-540]

NONVOLATILE MAGNETIC MEMORY DEVICE

BACKGROUND OF THE INVENTION AND RELATED ART STATEMENT

The present invention relates to a nonvolatile magnetic memory device and a manufacturing method thereof. More specifically, the present invention relates to a nonvolatile magnetic memory device called a TMR (Tunnel Magnetoresistance) type MRAM (Magnetic Random Access Memory) and a manufacturing method thereof.

With great diffusion of information communication machines, particularly, personal small machines such as personal digital assistances, various semiconductor devices such as a memory, a logic and so on, constituting such machines are being demanded to cope with higher performances such as a higher degree of integration, faster operation capability and lower power consumption. Particularly, a nonvolatile memory is considered indispensable in the ubiquitous era. Even if the depletion of a power supply or some troubles occur or a server is disconnected to a network due to some failure, important information can be stored or protected with a nonvolatile memory. Further, recently available personal digital assistances are designed such that the power consumption is reduced to a lowest level possible by maintaining non-operating circuit blocks in a standby state, and the waste of power consumption and a memory can be avoided if a nonvolatile memory capable of working as a fast-speed work memory and a mass-storage memory can be realized. Further, if a fast-speed and mass-storage nonvolatile memory can be realized, the "instant-on" function of booting in the instance of turning on power can be made possible.

The nonvolatile memory includes a flash memory using a semiconductor material and a ferroelectric nonvolatile semiconductor memory (FERAM, Ferroelectric Random Access Memory) using a ferroelectric material. However, the flash memory has a defect that the writing speed is slow since it is in the order of microseconds. On the other hand, in FERAM, the number of times of re-writability thereof is $10^{12}$ to $10^{14}$, and the number cannot be said to be sufficient for replacing SRAM or DRAM with FERAM, and there is pointed out another problem that the micro-fabrication of a ferroelectric layer is difficult.

As a nonvolatile memory free of the above defects, a nonvolatile memory device called MRAM (Magnetic Random Access Memory) is in the limelight. The MRAM at an early development stage was based on a spin valve using a GMR (Giant magnetoresistance) effect. Since, however, the memory cell resistance against a load is as low as 10 to 100 Ω, the power consumption per bit on readout is large, and the defect is that it is difficult to attain the capacity of mass storage.

While the MRAM using a TMR (Tunnel Magnetoresistance) effect had a resistance change ratio of 1–2% at room temperature at an early development stage, it has come to be possible to obtain a resistance change ratio close to 20% in recent years, so that the MRAM using the TMR effect is highlighted. The TMR-type MRAM has a simple structure and enables easy scaling, and recording is made by the rotation of a magnetic moment, so that the number of times of possible re-writing is great. Further, it is expected that the TMR-type MRAM is very rapid with regard to an access time period, and it is already said that the TMR-type MRAM is capable of an operation at 100 MHz.

FIG. 34 shows a schematic partial cross-sectional view of a conventional TMR-type MRAM (to be simply referred to as "MRAM" hereinafter). The MRAM comprises a transistor for selection TR made of a MOS-type FET and a tunnel magnetoresistance device 130.

The tunnel magnetoresistance device 130 has a stacking structure composed of a first ferromagnetic layer, a tunnel barrier 133 and a second ferromagnetic layer. More specifically, the first ferromagnetic layer has a two-layer structure, for example, of an anti-ferromagnetic layer 131 positioned below and a ferromagnetic layer (called a reference layer or pinned magnetic layer 132 as well) positioned above and has an intense unidirectional magnetic anisotropy due to an exchange interaction working between these two layers. The second ferromagnetic layer of which the magnetization direction rotates relatively easily is also called a free layer or memory layer 134. The tunnel barrier 133 works to cut a magnetic coupling between the memory layer 134 and the pinned magnetic layer 132 and also to flow a tunnel current. A bit line BL for connecting the MRAMs is formed on an insulating interlayer 126. A top coating film 135 formed between the bit line BL and the memory layer 134 works to prevent mutual diffusion of atoms constituting the bit line BL and atoms constituting the memory layer 134, to reduce a contact resistance and to prevent the oxidation of the memory layer 134. In Figure, reference numeral 136 indicates a lead electrode connected to a lower surface of the anti-ferromagnetic layer 131.

Further, a write-in word line RWL is arranged below the tunnel magnetoresistance device 130 through an insulating interlayer 124. Generally, the extending direction (first direction) of the write-in word line RWL and the extending direction (second direction) of the bit line BL cross each other at right angles.

The transistor for selection TR is formed in that portion of a semiconductor substrate 110 which portion is surrounded by a device isolation region 111, and the transistor for selection TR is covered with an insulating interlayer 121. One source/drain region 114B is connected to the lead electrode 136 of the tunnel magnetoresistance device 130 through a tungsten plug 122, a landing pad 123 and a tungsten plug 125. The other source/drain region 114A is connected to a sense line 116 through a tungsten plug 115. In Figure, reference numeral 112 indicates a gate electrode, and reference numeral 113 indicates a gate insulating film.

In an MRAM array, the MRAM is arranged in an intersecting point of the bit line BL and the write-in word line RWL.

When data is written into the above-constituted MRAM, current is flowed in the bit line BL and the write-in word line RWL, to form a synthetic magnetic field, and the direction of magnetization of the second ferromagnetic layer (memory layer 134) is changed by means of the synthetic magnetic field, whereby, "1" or "0" is recorded into the second ferromagnetic layer (memory layer 134).

Data is read out by bringing the transistor for selection TR into an ON-state, flowing a current in the bit line BL and detecting a tunnel current change caused by a magnetoresistance effect with the sense line 116. When the magnetization direction of the memory layer 134 and the counterpart of the pinned magnetic layer 132 are the same, a low-resistance state results (this state represents, for example, "0"), and when the magnetization direction of the memory layer 134 and the counterpart of the pinned magnetic layer 132 are antiparallel, a high-resistance state results (this state represents, for example, "1").

FIG. 35 shows an asteroid curve of the MRAM. A current is flowed in the bit line BL and the write-in word line RWL, and as a result, a synthetic magnetic field is generated. Data is written into the tunnel magnetoresistance device 130 constituting the MRAM on the basis of the synthetic magnetic field. A magnetic field ($H_{EA}$) in the easy-magnetization axis direction of the memory layer 134 is formed due to a writing current flowing in the bit line BL, and a magnetic field ($H_{HA}$) in the difficult-magnetization axis direction of the memory layer 134 is formed due to a current flowing the write-in word line RWL. In some MRAM constitution, a magnetic field ($H_{HA}$) in the difficult-magnetization axis direction of the memory layer 134 is formed due to a writing current flowing in the bit line BL, and a magnetic field ($H_{EA}$) in the easy-magnetization axis direction of the memory layer 134 is formed due to a current flowing the write-in word line RWL.

The asteroid curve shows an inversion threshold value of magnetization direction of the memory layer 134 due to the synthetic magnetic field (synthesis of magnetic field vectors of the magnetic field $H_{HA}$ and the magnetic field $H_{EA}$ to be exerted on the memory layer 134). When a synthetic magnetic field corresponding to an outside ($OUT_1$, $OUT_2$) of the asteroid curve is generated, the magnetization direction of the memory layer 134 is inverted, so that writing of data is performed. When a synthetic magnetic field corresponding to an inside (IN) of the asteroid curve is generated, the inversion of magnetization of the memory layer 134 does not take place. Further, in the MRAM other than the MRAM which is positioned in the intersecting point of the write-in word line RWL and the bit line BL in which the current is flowing, a magnetic field is additionally generated by the write-in word line RWL or bit line BL alone, and when such a magnetic field is greater than a unidirectional inversion magnetic field $H_K$ [in a region ($OUT_2$) outside dotted lines in FIG. 35], the magnetization direction of the memory layer 134 constituting the MRAM other than the MRAM which is positioned in the intersecting point is also inverted. Therefore, only when the synthetic magnetic field is outside the asteroid curve and is in a region ($OUT_1$) inside the dotted lines in FIG. 35, selective writing into the selected MRAM is possible.

The TMR-type MRAM has advantages that it is easy to attain higher speed and higher degree of integration as described above, while it has a defect that the current consumption for writing is greater than that in any other memory device. Writing data into the TMR-type MRAM is performed by a synthetic magnetic field formed by a current flowing the bit line BL and a current flowing the write-in word line RWL. The magnetic field for inverting the magnetization direction of the memory layer 134 is approximately 20 to 200 oersteds (Oe), and the current required for the inversion amounts to several milliamperes to several tens milliamperes. Such a large current value is a big problem when the TMR-type MRAM is used in a personal small item. Further, since a driver for large-current driving is required, the area occupied by such a driver is large, which can inhibit the attaining of a higher integration degree.

From the viewpoint of a higher integration degree, the line width of the bit line and the write-in word line is required to be a line width close to a minimum line width determined depending upon lithography technology. When the bit line BL and the write-in word line RWL (these will be sometimes generally referred to as "wiring" hereinafter) are supposed to have a line width of 0.3 $\mu$m and a thickness of 0.5 $\mu$m, a current flowing in the wiring comes to have a current density of $6 \times 10^6$ A/cm$^2$, and even when copper (service current density: $0.5 \times 10^6$ A/cm$^2$ to $1 \times 10^6$ A/cm$^2$) is used as a material for constituting the wiring, there is caused a crucial problem that the service life and the reliability of the wiring is decreased due to electromigration. Further, as the MRAM is gradually minimized in size, it is required to reduce the dimensions of the wiring, so that the reliability problem of the wiring becomes more crucial.

Moreover, due to minimizing of the MRAM in size, a magnetic field is exerted on an adjacent MRAM due to the leak of a magnetic flux, so that there is caused a disturbance problem.

In an MRAM disclosed in U.S. Pat. No. 5,940,319, a wiring positioned above and/or below a tunnel magnetoresistance device has a portion that does not face the tunnel magnetoresistance device and which is covered with a material for concentrating magnetic fluxes. FIG. 36 shows a schematic partial cross-sectional view of the MRAM disclosed in the above U.S. Pat. In the MRAM shown in FIG. 36, a magnetic flux concentration structure is applied to a write-in word line RWL. That is, side surfaces and a lower surface of the write-in word line RWL are covered with a high magnetic permeability material 140, whereby the effect of concentrating magnetic fluxes on the memory layer 134 is enhanced.

FIGS. 37 and 38 show simulation results of magnetic flux distributions in the vicinity of tunnel magnetoresistance devices in the conventional MRAMs having structures shown in FIGS. 34 and 36. In FIGS. 37 and 38, the tunnel magnetoresistance devices are indicated by TMR.

One of causes for preventing the attaining of a higher integration degree of the MRAM is that the write-in word line RWL is formed below the tunnel magnetoresistance device 130 through the insulating interlayer 124. That is, for attaining a high integration degree of the MRAM, in other words, for materializing a minimum cell size, it is said that the width of the tunnel magnetoresistance device 130 is required to be equal to, or smaller than, the width of the write-in word line RWL. Generally, however, a mask alignment deviation exists between the lithography step for forming the write-in word line RWL and the lithography step for forming the tunnel magnetoresistance device 130, so that it is difficult to materialize the minimum cell size.

In the MRAM disclosed in U.S. Pat. No. 5,940,319, there is produced an effect of enhancing the concentration of magnetic fluxes on the memory layer 134. However, the write-in word line RWL and the memory layer 134 are away from each other, so that the effect of concentrating the magnetic fluxes is not sufficient. As a result, there is involved a problem that the current consumption is not fully decreased. Further, since the write-in word line RWL and the tunnel magnetoresistance device 130 are formed in different mask steps as described above, not only it is difficult to materialize the minimum cell size, but also there is a problem that when a mask alignment deviation takes place, the asteroid curve comes to be asymmetric, which results in large fluctuation in writing characteristics.

OBJECT AND SUMMARY OF THE INVENTION

Therefore, it is a first object of the present invention to provide a TMR-type MRAM structured so that the minimum size cell can be materialized and a manufacturing method thereof. In addition to the above first object, it is a second object of the present invention to provide a TMR-type MRAM structured so that the effect of concentrating magnetic fluxes on the memory layer can be improved and a manufacturing method thereof.

The nonvolatile magnetic memory device (more specifically, TMR-type MRAM) of the present invention for achieving the above first object is a nonvolatile magnetic memory device comprising;

(A) a transistor for selection which is formed in a semiconductor substrate, (B) a lower insulating interlayer which covers the transistor for selection, (C) a first connecting hole which is formed in a first opening portion made through the lower insulating interlayer and is connected to the transistor for selection, (D) a first wiring which is formed on the lower insulating interlayer, is composed of an electrically conductive layer, and extends in a first direction, (E) a tunnel magnetoresistance device which is formed on the first wiring through an insulating film, and has a stacking structure formed of a first ferromagnetic layer, a tunnel barrier and a second ferromagnetic layer which are positioned in this order from below, (F) an upper insulating interlayer which covers the tunnel magnetoresistance device, the lower insulating interlayer and an extending portion of the first wiring, and (G) a second wiring which is formed on the upper insulating interlayer, is electrically connected to the top surface of the tunnel magnetoresistance device, and extends in a second direction different from the first direction (for example, crossing the second direction at right angles), in which a lower surface of the tunnel magnetoresistance device is electrically connected to the first connecting hole through a second connecting hole which is formed in a second opening portion made through at least the insulating film and the first wiring and is electrically insulated from the first wiring, and the tunnel magnetoresistance device, the insulating film and the first wiring have nearly the same widths along the second direction.

In the nonvolatile magnetic memory device having the above structure, provided by the present invention, the tunnel magnetoresistance device, the insulating film and the first wiring have nearly the same widths along the second direction, so that the minimum cell size can be materialized and that the nonvolatile magnetic memory device comes to be free of the problem that the asteroid curve comes to be asymmetric, which results in great fluctuation of writing characteristics.

In the nonvolatile magnetic memory device of the present invention, a sidewall may be formed on each of two side surfaces of the tunnel magnetoresistance device along the second direction. In this case, the tunnel magnetoresistance device including the sidewalls, the insulating film and the first wiring have the same widths along the second direction. For including the above embodiment, it is described that the tunnel magnetoresistance device, the insulating film and the first wiring have "nearly" the same widths along the second direction. Further, depending upon fluctuation of processing conditions in the steps of manufacturing the nonvolatile magnetic memory device, there are some cases where the tunnel magnetoresistance device, the insulating film and the first wiring may not have strictly the same widths along the second direction. The above description therefore includes "nearly" for including the above cases as well.

The second wiring is electrically connected to the top surface of the tunnel magnetoresistance device, and this constitution includes an embodiment in which the second wiring is indirectly connected to the top surface of the tunnel magnetoresistance device.

For achieving the above second object, the nonvolatile magnetic memory device of the present invention may have a constitution in which said first wiring comprises a first high-permeability material layer and said electrically conductive layer which are positioned in this order from below, a sidewall made of an insulating material is formed on each side surface of said tunnel magnetoresistance device, said insulating film and said first wiring along the first direction, and the sidewall is covered with a second high-permeability material layer.

The nonvolatile magnetic memory device having the above constitution, provided by the present invention, will be referred to as "nonvolatile magnetic memory device having the first constitution" for convenience. In the nonvolatile magnetic memory device having the first constitution, the sidewall is formed on each side surface of the tunnel magnetoresistance device, the insulating film and the first wiring, and the second high-permeability material layer is formed on the sidewall, so that magnetic fluxes can be concentrated on the second ferromagnetic layer, and as a result, the current consumption can be fully reduced.

Alternatively, for achieving the above second object, the nonvolatile magnetic memory device of the present invention may have a constitution in which said first wiring comprises a first high-permeability material layer and said electrically conductive layer which are positioned in this order from below, a first sidewall made of an insulating material is formed on each side surface of said tunnel magnetoresistance device, said insulating film and said first wiring along the first direction, a second sidewall made of an insulating material is formed on said first sidewall so as to cover each side surface of said first ferromagnetic layer, said insulating film and said first wiring along the first direction, and said first sidewall and said second sidewall are covered with a second high-permeability material layer.

The nonvolatile magnetic memory device having the above constitution, provided by the present invention, will be referred to as "nonvolatile magnetic memory device having the second-A constitution" for convenience. In the nonvolatile magnetic memory device having the second-A constitution, the sidewall is formed on each side surface of the tunnel magnetoresistance device, the insulating film and the first wiring, and the second high-permeability material layer is formed on the sidewall, so that magnetic fluxes can be effectively concentrated on the second ferromagnetic layer, and as a result, the current consumption can be fully reduced. Further, the sidewall is constituted of the first sidewall and the second sidewall, so that the distance between the second high-permeability material layer and the second ferromagnetic layer can be decreased by fully decreasing the thickness of the first sidewall, and as a result, magnetic fluxes can be more effectively concentrated on the second ferromagnetic layer.

Alternatively, for achieving the above second object, the nonvolatile magnetic memory device of the present invention may have a constitution in which said first wiring comprises a first high-permeability material layer and said electrically conductive layer which are positioned in this order from below, a first sidewall made of an insulating material is formed on each side surface of said first ferromagnetic layer, said insulating film and said first wiring along the first direction, a second sidewall made of an insulating material is formed on said first sidewall so as to cover each side surface of said tunnel magnetoresistance device, said insulating film and said first wiring along the first direction, and said second sidewall is covered with a second high-permeability material layer.

The nonvolatile magnetic memory device having the above constitution, provided by the present invention, will be referred to as "nonvolatile magnetic memory device having the second-B constitution" for convenience. In the nonvolatile magnetic memory having the second-B constitution, the sidewall is formed on each side surface of the tunnel magnetoresistance device, the insulating film and the first wiring, and the second high-permeability material layer is formed on the sidewall, so that magnetic fluxes can be concentrated on the second ferromagnetic layer, and as a result, the current consumption can be fully reduced. Further, the sidewall is constituted of the first sidewall and the second sidewall, so that the distance between the second high-permeability material layer and the second ferromagnetic layer can be decreased by fully decreasing the thickness of the second sidewall, and as a result, magnetic fluxes can be more effectively concentrated on the second ferromagnetic layer.

Alternatively, for achieving the above second object, the nonvolatile magnetic memory device of the present invention may have a constitution in which said first wiring comprises a first high-permeability material layer and said electrically conductive layer which are positioned in this order from below, a sidewall made of an insulating material is formed on the side surface of said tunnel magnetoresistance device along the first direction, and said sidewall and each side surface of said insulating film and said first wiring are covered with a second high-permeability material layer.

The nonvolatile magnetic memory device having the above constitution, provided by the present invention, will be referred to as "nonvolatile magnetic memory device having the third constitution" for convenience. In the nonvolatile magnetic memory device having the third constitution, the sidewall is formed on the side surface of the tunnel magnetoresistance device, and the second high-permeability material layer is formed on the sidewall, so that magnetic fluxes can be effectively concentrated on the second ferromagnetic layer, and as a result, the current consumption can be fully reduced. Further, the side surface of the first high-permeability material layer and the second high-permeability material layer are in contact, so that magnetic fluxes can be more effectively concentrated on the second ferromagnetic layer.

The manufacturing method of a nonvolatile magnetic memory device (more specifically, TMR-type MRAM) according to a first aspect of the present invention for achieving the above first object, is a manufacturing method of the nonvolatile magnetic memory device of the present invention, comprising the steps of;

(a) forming a transistor for selection in a semiconductor substrate, (b) forming a lower insulating interlayer on the entire surface, (c) forming a first opening portion through the lower insulating interlayer, and forming a first connecting hole connected to the transistor for selection in said first opening portion, (d) forming an electrically conductive layer and an insulating film on the lower insulating interlayer, (e) forming a second opening portion at least through portions of the insulating film and the electrically conductive layer which portions are positioned above the first connecting hole, and forming a second connecting hole electrically insulated from the electrically conductive layer and connected to the first connecting hole in said second opening portion, (f) forming a stacking structure on the insulating film, said stacking structure being formed of at least a first ferromagnetic layer electrically connected to the second connecting hole, a tunnel barrier and a second ferromagnetic layer, (g) patterning the stacking structure, the insulating film and the electrically conductive layer in the form of a stripe extending in a first direction, and thereby obtaining a first wiring comprising the electrically conductive layer and extending in the first direction, (h) selectively removing the stacking structure patterned in the form of a stripe, and thereby forming a tunnel magnetoresistance device having the tunnel barrier sandwiched between the first and second ferromagnetic layers, (i) forming an upper insulating interlayer on the entire surface, and (j) forming a second wiring on the upper insulating interlayer, said second wiring being electrically connected to the second ferromagnetic layer and extending in a second direction different from the first direction (for example, crossing the first direction at right angles).

The first ferromagnetic layer is electrically connected to the second connecting hole, and this constitution includes an embodiment in which the first ferromagnetic layer is indirectly connected to the second connecting hole. Further, the second wiring is electrically connected to the second ferromagnetic layer, and this constitution includes an embodiment in which the second wiring is indirectly connected to the second ferromagnetic layer.

In the manufacturing method of a nonvolatile magnetic memory device according to the first aspect of the present invention, the stacking structure, the insulating film and the electrically conductive layer are patterned in the form of a stripe extending in the first direction in the above step (g), so that the lithography step is free of a mask alignment deviation, and that the minimum cell size can be materialized.

The manufacturing method of a nonvolatile magnetic memory device (more specifically, TMR-type MRAM) according to a second aspect of the present invention for achieving the above first and second objects, is a manufacturing method of the nonvolatile magnetic memory device having the first constitution, comprising the steps of;

(a) forming a transistor for selection in a semiconductor substrate, (b) forming a lower insulating interlayer on the entire surface, (c) forming a first opening portion through the lower insulating interlayer, and forming a first connecting hole connected to the transistor for selection in said first opening portion, (d) forming a first high-permeability material layer, an electrically conductive layer and an insulating film on the lower insulating interlayer, (e) forming a second opening portion at least through portions of the insulating film, the electrically conductive layer and the first high-permeability material layer which portions are positioned above the first connecting hole, and forming a second connecting hole electrically insulated from the electrically conductive layer and connected to the first connecting hole in said second opening portion, (f) forming a stacking structure on the insulating film, said stacking structure being formed of at least a first ferromagnetic layer electrically connected to the second connecting hole, a tunnel barrier and a second ferromagnetic layer, (g) patterning the stacking structure, the insulating film, the electrically conductive layer and the first high-permeability material layer in the form of a stripe extending in a first direction, and thereby obtaining a first wiring comprising the electrically conductive layer and the first high-permeability material layer and extending in the first direction, (h) forming a sidewall on each side surface of the stacking structure, the insulating film, the electrically conductive layer and the first high-permeability material layer, (i) forming a second high-permeability material layer on the sidewall, (j) selectively removing the stacking structure patterned in the form of a stripe and the sidewalls, and thereby forming a tunnel magnetoresistance device having the tunnel barrier sandwiched between the first and second ferromagnetic layers, (k) forming an upper insulating interlayer on the entire surface, and (l) forming a second wiring on the upper insulating interlayer, said second wiring being electrically connected to the second ferromagnetic layer and extending in a second direction different from the first direction (for example, crossing the first direction at right angles).

The first ferromagnetic layer is electrically connected to the second connecting hole, and this constitution includes an embodiment in which the first ferromagnetic layer is indirectly connected to the second connecting hole. Further, the second wiring is electrically connected to the second ferromagnetic layer, and this constitution includes an embodiment in which the second wiring is indirectly connected to the second ferromagnetic layer.

In the manufacturing method of a nonvolatile magnetic memory device according the second aspect of the present invention, the stacking structure, the insulating film, the electrically conductive layer and the first high-permeability material layer are patterned in the form of a stripe extending in the first direction in the above step (g), so that the lithography step is free of a mask alignment deviation, and that the minimum cell size can be materialized. Further, in the above step (h), the sidewall is formed on each side surface of the stacking structure, the insulating film, the electrically conductive layer and the first high-permeability material layer, and in the above step (i), the second high-permeability material layer is formed on the sidewall, so that magnetic fluxes can be effectively concentrated on the second ferromagnetic layer, and as a result, the current consumption can be fully reduced.

The manufacturing method of a nonvolatile magnetic memory device according to the second aspect of the present invention may have a constitution in which the sidewall has a stacking structure of a first sidewall and a second sidewall, and in the above step (h), the first sidewall is formed so as to cover each side surface of the stacking structure, the insulating film, the electrically conductive layer and the first high-permeability material layer, and then, the second sidewall is formed on the first sidewall so as to cover each side surface of the first ferromagnetic layer, the insulating film, the electrically conductive layer and the first high-permeability material layer.

When the above constitution is employed, the nonvolatile magnetic memory device having the second-A constitution of the present invention can be manufactured. And, the distance between the second high-permeability material layer and the second ferromagnetic layer can be decreased by employing the above constitution and fully decreasing the thickness of the first sidewall, and as a result, magnetic fluxes can be more effectively concentrated on the second ferromagnetic layer.

Alternatively, the manufacturing method of a nonvolatile magnetic memory device according to the second aspect of the present invention may have a constitution in which the sidewall has a stacking structure of a first sidewall and a second sidewall, and in the above step (h), the first sidewall is formed so as to cover each side surface of the first ferromagnetic layer, the insulating film, the electrically conductive layer and the first high-permeability material layer, and then, the second sidewall is formed on the first sidewall so as to cover each side surface of the stacking structure, the insulating film, the electrically conductive layer and the first high-permeability material layer.

When the above constitution is employed, the nonvolatile magnetic memory device having the second-B constitution of the present invention can be manufactured. The distance between the second high-permeability material layer and the second ferromagnetic layer can be fully decreased by employing the above constitution and fully decreasing the thickness of the second sidewall, and as a result, magnetic fluxes can be more effectively concentrated on the second ferromagnetic layer.

The manufacturing method of a nonvolatile magnetic memory device (more specifically, TMR-type MRAM) according to a third aspect of the present invention for achieving the above first and second objects, is a manufacturing method of the nonvolatile magnetic memory device having the third constitution of the present invention, comprising the steps of;

(a) forming a transistor for selection in a semiconductor substrate, (b) forming a lower insulating interlayer on the entire surface, (c) forming a first opening portion through the lower insulating interlayer, and forming a first connecting hole connected to the transistor for selection in said first opening portion, (d) forming a first high-permeability material layer, an electrically conductive layer and an insulating film on the lower insulating interlayer, (e) forming a second opening portion through at least portions of the insulating film, the electrically conductive layer and the first high-permeability material layer which portions are positioned above the first connecting hole, and forming a second connecting hole electrically insulated from the electrically conductive layer and connected to the first connecting hole in said second opening portion, (f) forming a stacking structure on the insulating film, said stacking structure being formed of at least a first ferromagnetic layer electrically connected to the second connecting hole, a tunnel barrier and a second ferromagnetic layer, (g) patterning the stacking structure in the form of a stripe extending in a first direction, (h) forming a sidewall on each side surface of the stacking structure, (i) patterning the insulating film, the electrically conductive layer and the first high-permeability material layer in the form of a stripe extending in the first direction with using the stacking structure and the sidewalls as a mask, and thereby obtaining a first wiring which comprises the electrically conductive layer and the first high-permeability material layer and extends in the first direction, (j) forming a second high-permeability material layer on the sidewall and on each side surface of the insulating film, the electrically conductive layer and the first high-permeability material layer, (k) selectively removing the stacking structure patterned in the form of a stripe and the sidewalls, and thereby forming a tunnel magnetoresistance device having the tunnel barrier sandwiched between the first and second ferromagnetic layers, (l) forming an upper insulating interlayer on the entire surface, and (m) forming a second wiring on the upper insulating interlayer, said second wiring being connected to the second ferromagnetic layer and extending in a second direction different from the first direction (for example, crossing the first direction at right angles).

The first ferromagnetic layer is electrically connected to the second connecting hole, and this constitution includes an embodiment in which the first ferromagnetic layer is indirectly connected to the second connecting hole. Further, the second wiring is electrically connected to the second ferromagnetic layer, and this constitution includes an embodiment in which the second wiring is indirectly connected to the second ferromagnetic layer.

In the manufacturing method of a nonvolatile magnetic memory device according to the third aspect of the present invention, the stacking structure is patterned in the form of a stripe extending in the first direction in the above step (g), and in the above step (i), the insulating film, the electrically conductive layer and the first high-permeability material layer are patterned in the form of a stripe extending in the first direction with using the stacking structure and the sidewalls as a mask, so that the lithography step is free of a mask alignment deviation, and that the minimum cell size can be materialized. Further, in the above step (h), the sidewall is formed on each side surface of the stacking structure, and in the above step (j), the second high-permeability material layer is formed on the sidewall and each side surface of the insulating film, the electrically conductive layer and the first high-permeability material layer, so that the side surface of the first high-permeability material layer and the second high-permeability material layer come into a contact state, and as a result, magnetic fluxes can be more effectively concentrated on the second ferromagnetic layer, and the current consumption can be fully reduced.

In the nonvolatile magnetic memory device of the present invention including the first, second-A, second-B and third constitutions and the manufacturing method of a nonvolatile magnetic memory according to any one of the first to third aspects of the present invention (these will be sometimes simply referred to as "the present invention" hereinafter), preferably, the first ferromagnetic layer more specifically has a two-layer structure of an anti-ferromagnetic layer and a ferromagnetic layer (called a reference layer or a pinned magnetic layer as well) which are positioned in this order from below, whereby the first ferromagnetic layer can have an intense unidirectional magnetic anisotropy due to an exchange interaction working between these two layers. The second ferromagnetic layer of which the magnetization direction relatively easily rotates is also called a free layer or a memory layer. The tunnel barrier works to disconnect a magnetic coupling between the second ferromagnetic layer (memory layer) and the pinned magnetic layer and to flow a tunnel current.

The ferromagnetic layer (reference layer or pinned magnetic layer) and the second ferromagnetic layer (memory layer or free layer) can be constituted, for example, of a ferromagnetic material composed of a transition metal magnetic element, specifically, such as nickel (Ni), iron (Fe) or cobalt (Co) or a ferromagnetic material containing an alloy of these elements (for example, Co—Fe, Co—Fe—Ni, Ni—Fe or the like) as a main component. Further, a so-called half-metallic ferromagnetic material or an amorphous ferromagnetic material such as CoFe—B may be also used. Examples of the material for constituting the anti-ferromagnetic layer include an iron-manganese alloy, a nickel-manganese alloy, a platinum-manganese alloy, an iridium-manganese alloy, a rhodium-manganese alloy, a cobalt oxide and a nickel oxide. The above layers can be formed by a physical vapor deposition (PVD) method such as a sputtering method, an ion beam deposition method and a vacuum vapor deposition method, or a CVD method typified such as an ALD (Atomic Layer Deposition) method.

The insulating material for constituting the tunnel barrier includes an aluminum oxide ($AlO_x$), an aluminum nitride (AlN), a magnesium oxide (MgO), a magnesium nitride, a silicon oxide and a silicon nitride. Further, it also includes Ge, NiO, $CdO_x$, $HfO_2$, $Ta_2O_5$, BN and ZnS. The tunnel barrier can be obtained, for example, by oxidizing or nitriding a metal film formed by a sputtering method. More specifically, when an aluminum oxide ($AlO_x$) is used as an insulating material for constituting the tunnel barrier, the method for forming the tunnel barrier includes a method in which aluminum formed by a sputtering method is oxidized in atmosphere, a method in which aluminum formed by a sputtering method is plasma-oxidized, a method in which aluminum formed by a sputtering method is oxidized with IPC plasma, a method in which aluminum formed by a sputtering method is subject to natural oxidation in oxygen gas, a method in which aluminum formed by a sputtering method is oxidized with oxygen radicals, a method in which aluminum formed by a sputtering method is irradiated with ultraviolet ray while it is subjected to natural oxidation in oxygen gas, a method in which aluminum is formed by a reactive sputtering method, and a method in which an aluminum oxide is formed by a sputtering method. Alternatively, the tunnel barrier can be formed by a CVD method typified by an ALD method.

The material for constituting the first high-permeability material layer or the second high-permeability material layer includes soft magnetic materials such as a cobalt-iron alloy, a nickel-iron alloy and an amorphous magnetic material. These layers can be formed, for example, by a PVD method such as a sputtering method, an ion beam deposition method and a vacuum deposition method, a CVD method typified by an ALD method, or a plating method.

The electrically conductive layer constituting the first or second wiring is composed, for example, of aluminum, an aluminum alloy such as Al—Cu, or copper (Cu), and it can be formed, for example, by a PVD method such as a sputtering method, a CVD method, or a plating method typified by an electrolytic plating method.

The first connecting hole or the second connecting hole can be constituted of a polysilicon doped with an impurity, and a refractory metal or metal silicide such as W, Ti, Pt, Pd, Cu, TiW, TiNW, $WSi_2$ or $MoSi_2$. It can be formed by a chemical vapor deposition method (CVD method), or a PVD method such as a sputtering method. Further, the second connecting hole can be also constituted of ruthenium (Ru).

The stacking structure, the insulating film, the electrically conductive layer and the like can be patterned, for example, by a reactive ion etching (RIE) method or an ion milling method. They can be also patterned by a so-called lift-off method as required.

The transistor for selection can be constituted, for example, of a well-known MIS-type FET or MOS-type FET or a bipolar transistor.

Examples of the material for constituting the lower insulating interlayer or the upper insulating interlayer include silicon oxide ($SiO_2$), silicon nitride (SiN), SiON, SOG, NSG, BPSG, PSG, BSG, FSG, SiOC, SiC, an organic film (so-called Low-k material) and LTO. The material for constituting the insulating film can be selected from those materials which have been described as materials for constituting the lower insulating interlayer or the upper insulating interlayer, or alumina ($Al_2O_3$).

The material for constituting the sidewall, the first sidewall or the second sidewall can be selected from those materials which have been described as materials for constituting the lower insulating interlayer or the upper insulating interlayer, or alumina ($Al_2O_3$). The sidewall, the first sidewall or the second sidewall can be formed by a sputtering method, a CVD method or an ALD method. The material for constituting the first sidewall and the material for constituting the second sidewall are sometimes required to secure etching selectivity.

In the manufacturing method of a nonvolatile magnetic memory device according to any one of the first to third aspects of the present invention, the second connecting hole electrically insulated from the electrically conductive layer is formed in the second opening portion, and for this purpose, the side wall of the second opening portion can be covered with an insulating layer. The insulating layer can be constituted of an insulating material such as $SiO_2$ formed, for example, by a CVD method such as a plasma CVD method or an insulating material such as $Al_2O_3$ or SiN formed, for example, by an ALD method or a sputtering method.

BRIEF DESCRIPTION OF THE DRAWINGS

FIG. 3B, is a schematic partial cross-sectional view of the first insulating interlayer, etc., for explaining the manufacturing method of a nonvolatile magnetic memory device in Example 1.

FIG. 4, is a schematic partial cross-sectional view of the first insulating interlayer, etc., for explaining the manufacturing method of a nonvolatile magnetic memory device in Example 1.

FIG. 5, are schematic partial cross-sectional views of the first insulating interlayer, etc., for explaining the manufacturing method of a nonvolatile magnetic memory device in Example 1.

FIG. 6B, is a schematic partial cross-sectional view of the first insulating interlayer, etc., for explaining the manufacturing method of a nonvolatile magnetic memory device in Example 1.

FIG. 7, is a schematic partial cross-sectional view of the first insulating interlayer, etc., for explaining the manufacturing method of a nonvolatile magnetic memory device in Example 1.

FIG. 8, are schematic partial cross-sectional views of the first insulating interlayer, etc., for explaining the manufacturing method of a nonvolatile magnetic memory device in Example 1.

FIG. 12B, is a schematic partial cross-sectional view of the first insulating interlayer, etc., for explaining the manufacturing method of a nonvolatile magnetic memory device in Example 2.

FIG. 13, is a schematic partial cross-sectional view of the first insulating interlayer, etc., for explaining the manufacturing method of a nonvolatile magnetic memory device in Example 2.

FIG. 14, are schematic partial cross-sectional views of the first insulating interlayer, etc., for explaining the manufacturing method of a nonvolatile magnetic memory device in Example 2.

FIG. 15B, is a schematic partial cross-sectional view of the first insulating interlayer, etc., for explaining the manufacturing method of a nonvolatile magnetic memory device in Example 2.

FIG. 16, is a schematic partial cross-sectional view of the first insulating interlayer, etc., for explaining the manufacturing method of a nonvolatile magnetic memory device in Example 2.

FIG. 17, is a schematic partial cross-sectional view of the first insulating interlayer, etc., for explaining the manufacturing method of a nonvolatile magnetic memory device in Example 2.

FIG. 18, is a schematic partial cross-sectional view of the first insulating interlayer, etc., for explaining the manufacturing method of a nonvolatile magnetic memory device in Example 2.

FIG. 19, are schematic partial cross-sectional views of the first insulating interlayer, etc., for explaining the manufacturing method of a nonvolatile magnetic memory device in Example 2.

FIG. 30, is a schematic partial cross-sectional view of the first insulating interlayer, etc., for explaining the manufacturing method of a nonvolatile magnetic memory device in Example 5.

FIG. 31, is a schematic partial cross-sectional view of the first insulating interlayer, etc., for explaining the manufacturing method of a nonvolatile magnetic memory device in Example 5.

FIG. 32, are schematic partial cross-sectional views of the first insulating interlayer, etc., for explaining the manufacturing method of a nonvolatile magnetic memory device in Example 5.

DESCRIPTION OF THE PREFERRED EMBODIMENTS

The present invention will be explained on the basis of Example with reference to drawings.

EXAMPLE 1

Figure 1:
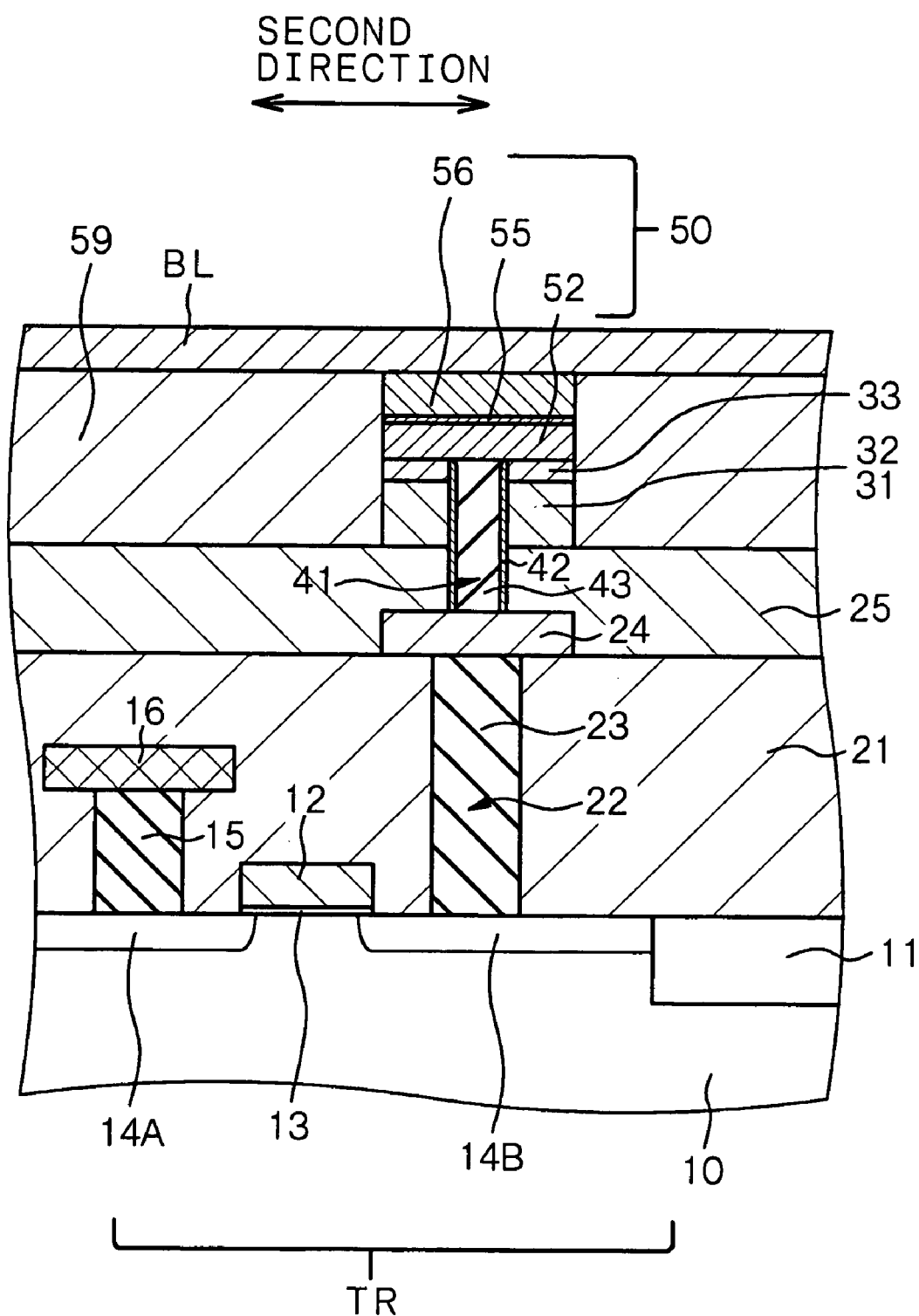
FIG. 1 is a schematic partial cross-sectional view of a nonvolatile memory device in Example 1.
Figure 2:
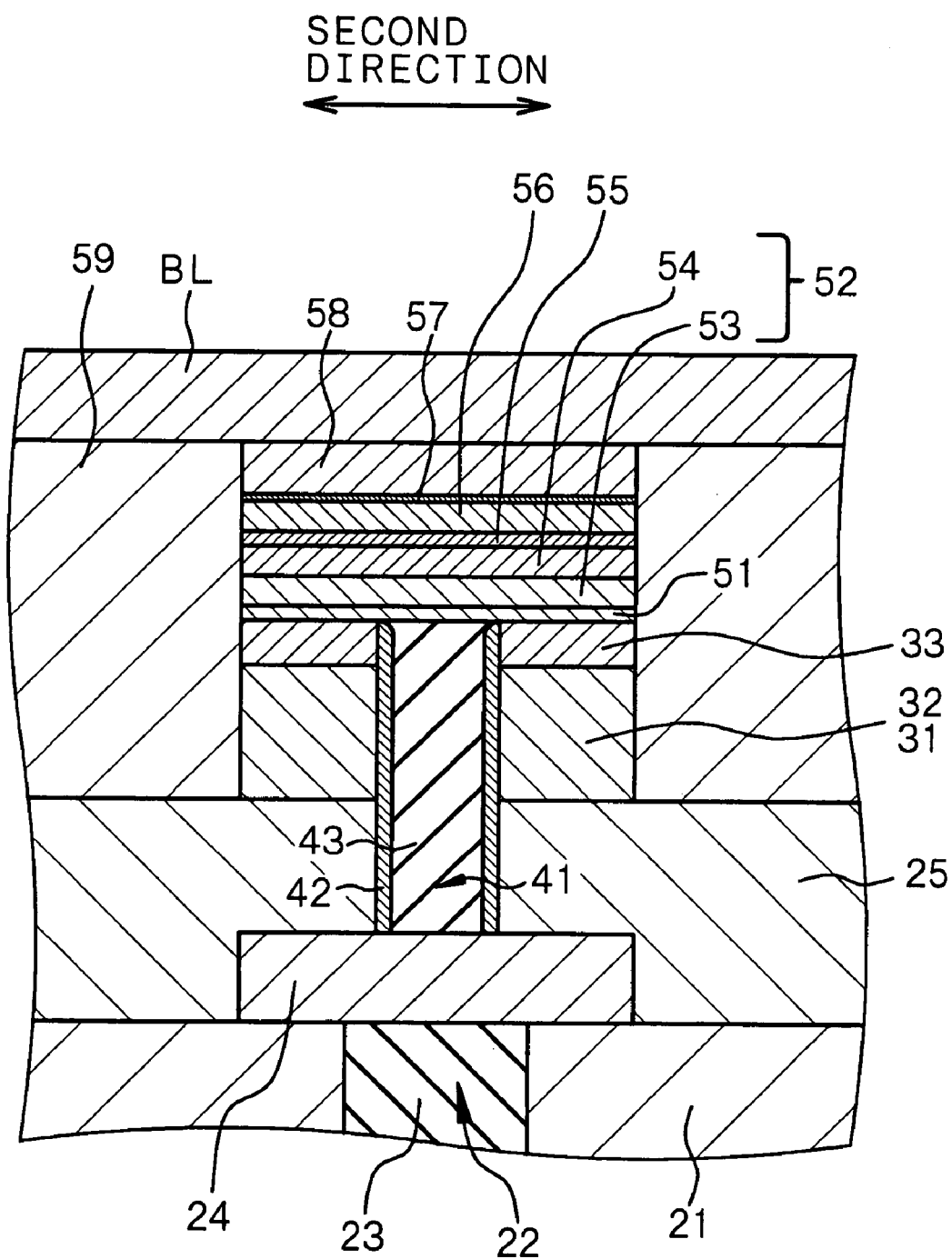
FIG. 2 is an enlarged schematic partial cross-sectional view of a circumferential portion of a tunnel magnetoresistance device of the nonvolatile magnetic memory device in Example 1.
Figure 3A:
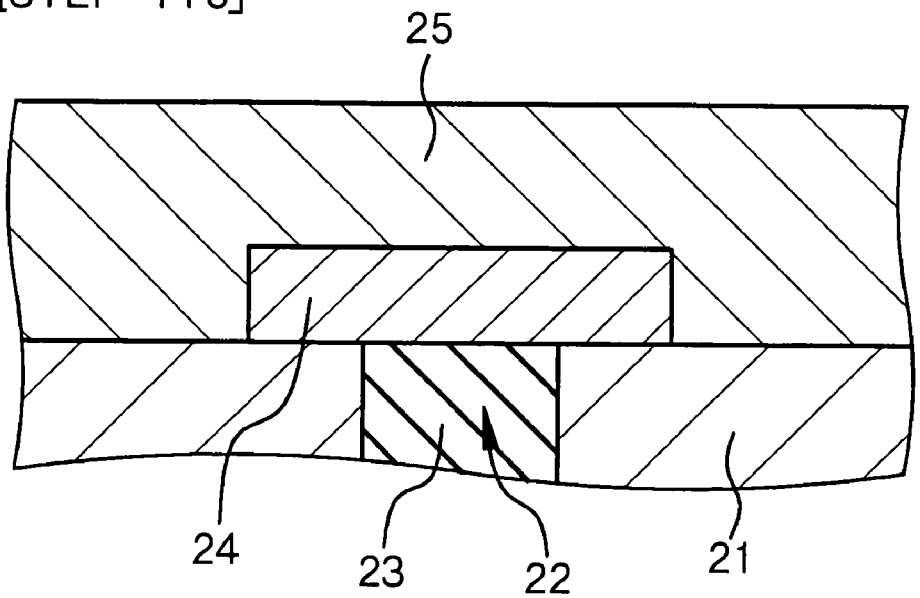
FIGS. 3A and 3B are schematic partial cross-sectional views of a first insulating interlayer, etc., for explaining a manufacturing method of a nonvolatile magnetic memory device in Example 1.
Figure 3B:
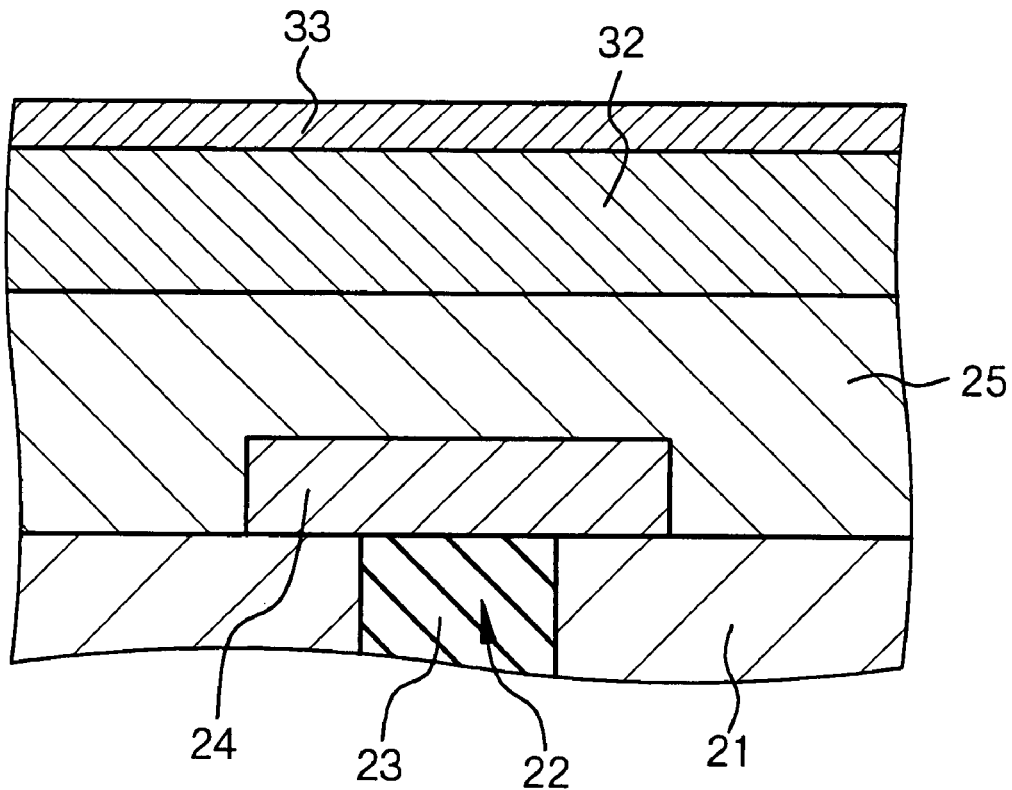

Example 1 is concerned with the nonvolatile magnetic memory device (to be referred to as "MRAM" hereinafter) of the present invention and the manufacturing method of an MRAM according to the first aspect of the present invention. FIG. 1 shows a schematic partial cross-sectional view of the TMR-type MRAM of Example 1, and FIG. 2 shows an enlarged schematic partial cross-sectional view of a circumferential portion of a tunnel magnetoresistance device.

This MRAM has a transistor for selection TR, a lower insulating interlayer (a first insulating interlayer 21 and a second insulating interlayer 25), a first connecting hole 23, a first wiring (write-in word line) 31, a tunnel magnetoresistance device 50, an upper insulating interlayer (third insulating interlayer 59), and a second wiring (bit line BL).

The transistor for selection TR is formed in a semiconductor substrate 10 and comprises a MOS-type FET. More specifically, the transistor for selection TR is formed in an active region surrounded by a device isolation region 11, and comprises a gate electrode 12, a gate insulating film 13 and source/drain regions 14A and 14B. The first insulating interlayer 21 (lower layer of a lower insulating interlayer) made, for example, of $SiO_2$ and BPSG covers the transistor for selection TR. The first connecting hole 23 made of tungsten is formed in a first opening portion 22 formed through the first insulating interlayer 21 constituting the lower layer of the lower insulating interlayer, and is connected to one source/drain region 14B of the transistor for selection TR. The first connecting hole 23 is further connected to a landing pad 24 formed on the first insulating interlayer 21. The second insulating interlayer 25 constituting the upper layer of the lower insulating interlayer is formed on the first insulating interlayer 21. The first wiring 31 (constituted of an electrically conductive layer 32 made of an Al—Cu alloy) called a write-in word line is formed on the second insulating interlayer 25 (upper layer of the lower insulating interlayer), and extends in a first direction (direction perpendicular to the paper surface of the drawing). The other source/drain region 14A of the transistor for selection TR is connected to a sense line 16 through a contact hole 15.

The tunnel magnetoresistance device 50 is formed on the first wiring 31 with an insulating film 33 made of alumina ($Al_2O_3$) interposed between them and has a stacking structure of a first ferromagnetic layer 52, a tunnel barrier 55 made of $AlO_x$ and a second ferromagnetic layer 56 (also called a free layer or a memory layer) made of an Ni—Fe alloy which are positioned in this order from below. More specifically, the first ferromagnetic layer 52 has a two-layer structure of an anti-ferromagnetic layer 53 made of an Fe—Mn alloy and a pinned magnetic layer 54 made of an Ni—Fe alloy which are positioned in this order from below. The above pinned magnetic layer 54 has its magnetization direction pinned by an exchange coupling with the anti-ferromagnetic layer 53. Due to an externally applied magnetic field, the magnetization direction of the second ferromagnetic layer (memory layer) 56 is changed to the direction in parallel or antiparallel with the magnetization direction of the pinned magnetic layer 54.

The upper insulating interlayer (third insulating interlayer 59) covers the tunnel magnetoresistance device 50, the second insulating interlayer 25 (the upper layer of the lower insulating interlayer) and an extending portion of the first wiring 31. The bit line BL as a second wiring is formed on the third insulating interlayer 59, is electrically connected to the top surface of the tunnel magnetoresistance device 50, and extends in a second direction different from the first direction (specifically, the direction crossing the first direction at right angles).

The lower surface of the tunnel magnetoresistance device 50 is electrically connected to the first connecting hole 23 through a second connecting hole 43 (more specifically, it is connected to the landing pad 24). The second connecting hole 43 is formed in a second opening portion 41 formed through at least the insulating film 33 and the first wiring 31 (more specifically, formed through the insulating film 33, the first wiring 31 and the second insulating interlayer 25), and is electrically insulated from the first wiring 31 with the insulating layer 42.

The widths of the tunnel magnetoresistance device 50, the insulating film 30 and the first wiring 31 along the second direction are the same.

The operation and array constitution of the MRAM in Example 1 or any one of Examples 2 to 5 to be described later are basically the same as the operation (write and readout operations) and array constitution of a conventional MRAM.

The manufacturing method of an MRAM in Example 1 will be explained below with reference to FIGS. 3A, 3B, 4, 5, 6A, 6B, 7, 8, 9A and 9B that are schematic partial cross-sectional views of the first insulating interlayer 21 and the like.

[Step-100]

The MOS-type FFT to work as a transistor for selection TR is formed in the semiconductor substrate 10 made of a silicon semiconductor substrate. For this purpose, the device isolation region 11 having, for example, a trench structure is formed by a known method. The device isolation region may have a LOCOS structure or a combination of LOCOS and trench structures. Then, the surface of the semiconductor substrate 10 is oxidized, for example by a pyrogenic method, to form the gate insulating film 13. Then, a polysilicon layer doped with an impurity is formed on the entire surface by a CVD method, and then, the polysilicon layer is patterned to form the gate electrode 12. The gate electrode 12 may be constituted of a polycide or a metal silicide instead of the polysilicon layer. Then, the semiconductor substrate 10 is ion-implanted, to form an LDD structure (not shown). Then, an $SiO_2$ layer is formed on the entire surface by a CVD method, and the $SiO_2$ layer is etched back to form a side-wall (not shown) on each side surface of the gate electrode 12. Then, the semiconductor substrate 10 is ion-implanted and the ion-implanted impurity is annealed for activation thereof, to form the source/drain regions 14A and 14B.

[Step-105]

Then, a lowermost layer, made of $SiO_2$, of the lower insulating interlayer is formed on the entire surface by a CVD method, and then, the lowermost layer of the lower insulating interlayer is polished by a chemical/mechanical polishing method (CMP method). Then, an opening portion is formed through the lowermost layer of the lower insulating interlayer above the source/drain region 14A by lithography and RIE methods, and then, a polysilicon layer doped with an impurity is formed on the lowermost layer of the lower insulating interlayer including an inside of the opening portion. Then, the polysilicon layer on the lowermost layer of the lower insulating interlayer is patterned, whereby the sense line 16 can be formed on the lowermost layer of the lower insulating interlayer. The sense line 16 and the source/drain region 14A are connected to each other through the contact hole 15 formed through the lowermost layer of the lower insulating interlayer. Then, an intermediate layer, made of BPSG, of the lower insulating interlayer is formed on the entire surface by a CVD method. After the formation of the intermediate layer, made of BPSG, of the lower insulating interlayer, preferably, the intermediate layer of the lower insulating interlayer is allowed to reflow in a nitrogen gas atmosphere at 900° C. for 20 minutes. Further, desirably, the top surface of the intermediate layer of the lower insulating interlayer is chemically and mechanically polished, for example, by a CMP method to flatten the intermediate layer of the lower insulating interlayer, or the intermediate layer of the lower insulating interlayer is flattened by a resist-etch-back method, as required. The lowermost layer and the intermediate layer of the lower insulating interlayer will be collectively and simply referred to as the first insulating interlayer 21 (lower layer of the lower insulating interlayer).

[Step-110]

Then, the first opening portion 22 is formed through the first insulating interlayer 21 above the source/drain region 14B by an RIE method, and then, the first connecting hole 23 connected to the source/drain region 14B of the transistor for selection TR is formed in the first opening portion 22. The top surface of the first connecting hole 23 is nearly on level with the surface of the first insulating interlayer 21. The first opening portion 22 is filled with tungsten by a blanket tungsten CVD method to form the first connecting hole 23. Before filling the first opening portion 22 with tungsten, preferably, a Ti layer and a TiN layer are consecutively formed on the first insulating interlayer 21 including an inside of the first opening portion 22, for example, by magnetron sputtering methods. The reason for forming the above Ti layer and TiN layer is that an ohmic low-contact resistance is obtained, that damage of the semiconductor substrate 10 by the blanket tungsten CVD method is prevented, and that the adhesion of the tungsten is improved. In the drawing, showing of the Ti layer and TiN layer is omitted. The tungsten layer, the TiN layer and the Ti layer on the first insulating interlayer 21 may be removed by a CMP method. Further, the above tungsten may be replaced with a polysilicon doped with an impurity.

[Step-115]

Then, the second insulating interlayer 25 (upper layer of the lower insulating interlayer) is formed on the entire surface. Specifically, first, the landing pad 24 connected to the first connecting hole 23 is formed on the first insulating interlayer 21, the 1 µm thick second insulating interlayer 25 made of $SiO_2$ is formed on the entire surface by an HDP (High Density Plasma) CVD method, and then, the second insulating interlayer 25 is flattened so as to have a thickness of 0.5 µm on the landing pad 24. In this manner, a structure shown in FIG. 3A can be obtained.

[Step-120]

Then, the electrically conductive layer 32 and the insulating film 33 are formed on the second insulating interlayer 25 (upper layer of the lower insulating interlayer). Specifically, a 20 nm thick Ti layer and a 20 nm thick TiN layer (these are not shown) are formed on the second insulating interlayer 25 by sputtering methods, and then, the 0.3 µm thick electrically conductive layer 32 made of Al—Cu is formed by a sputtering method. And, a 10 nm thick Ti layer and a 0.1 µm thick TiN layer (these are not shown) are consecutively formed thereon, and then, the 50 nm thick insulating film 33 made of alumina ($Al_2O_3$) is formed by a sputtering method. In this manner, a structure shown in FIG. 3B can be obtained.

[Step-125]

Then, the second opening portion 41 is formed through at least portions of the insulating film 33 and the electrically conductive layer 32 (more specifically, portions of the insulating film 33, the electrically conductive layer 32 and the second insulating interlayer 25) which portions are positioned above the first connecting hole 23 (more specifically, the landing pad 24). Then, the second connecting hole 43 electrically insulated from the electrically conductive layer 32 and connected to the first connecting hole 23 (more specifically, the landing pad 24) is formed in the second opening portion 41.

Figure 4:
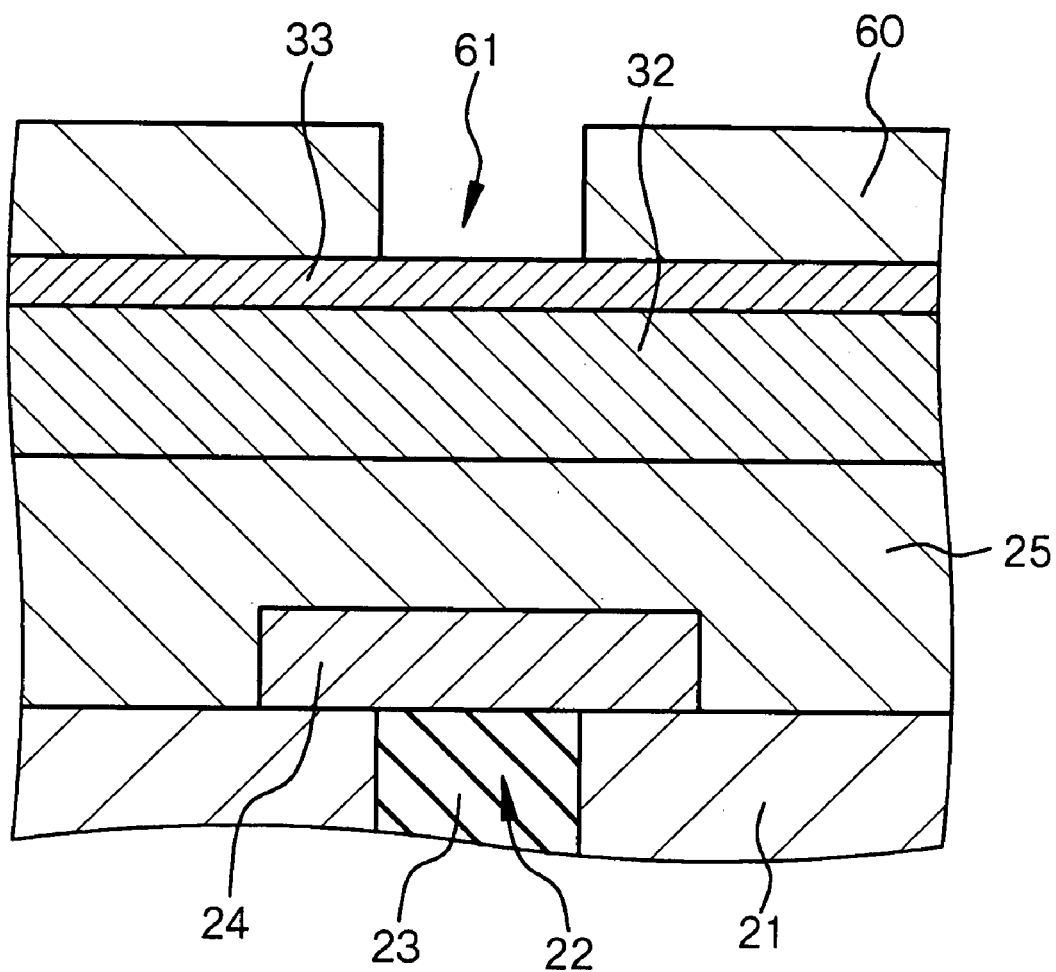
FIG. 4, following
Figure 5:
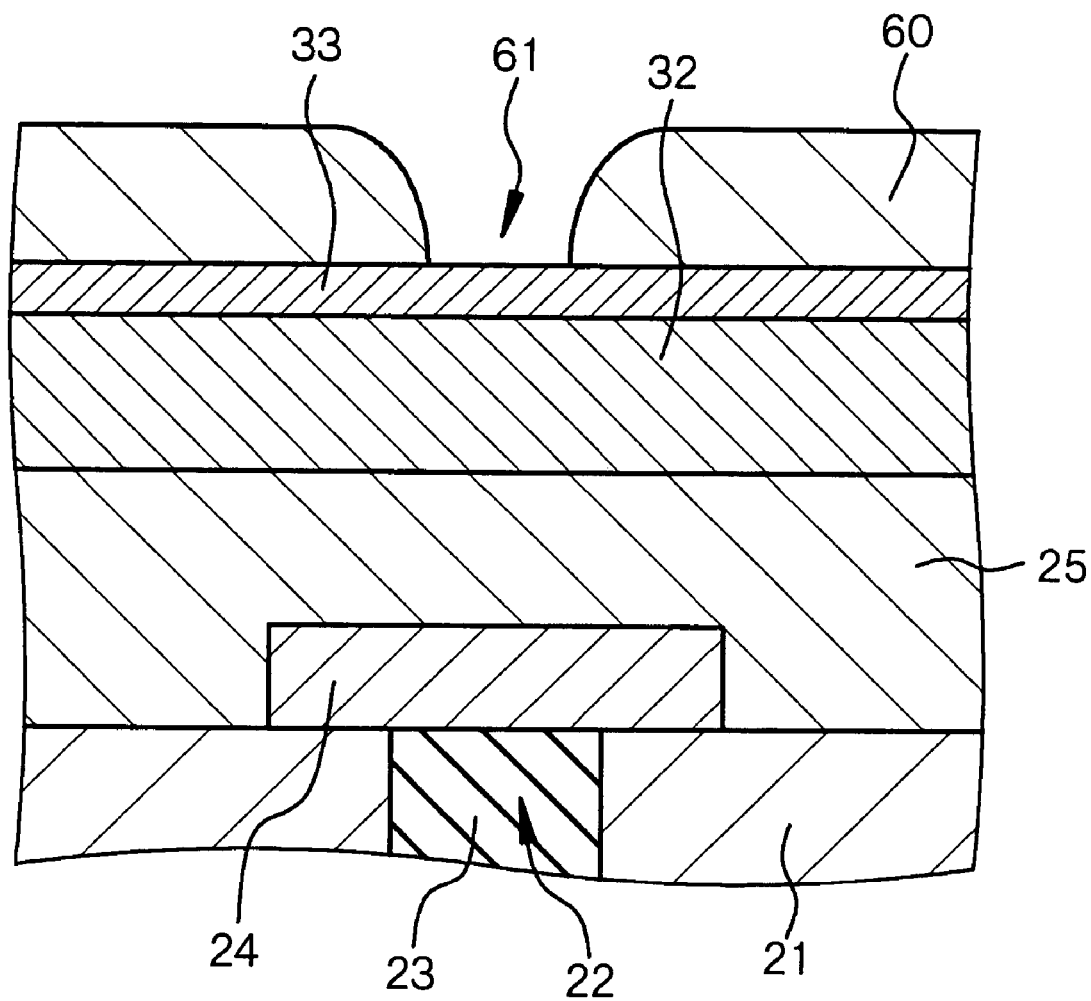
FIG. 5, following

Specifically, a photoresist layer 60 is formed on the entire surface, and an opening 61 is formed through the photoresist layer 60 by a lithography technique (see FIG. 4). Then, the photoresist layer 60 is allowed to reflow by heat treatment at 200 to 300° C., to decrease the diameter of the opening 61 (see FIG. 5). The method of decreasing the diameter of the opening 61 in the photoresist layer 60 is not limited to the above method, and for example, there may be employed a method reported in T. Toyoshima et. al., 1998 IEDM, pp 333–336. Further, after the formation of the opening 61, a sidewall made of an insulating material may be formed on the side surface of the opening 61, to decrease the diameter of the opening 61.

Then, the insulating film 33, the electrically conductive layer 32 and the second insulating interlayer 25 are consecutively etched with using the photoresist layer 60 as a mask, to form the second opening portion 41, and then, the photoresist layer 60 is removed. In this manner, a structure shown in FIG. 6A can be obtained.

Figure 6A:
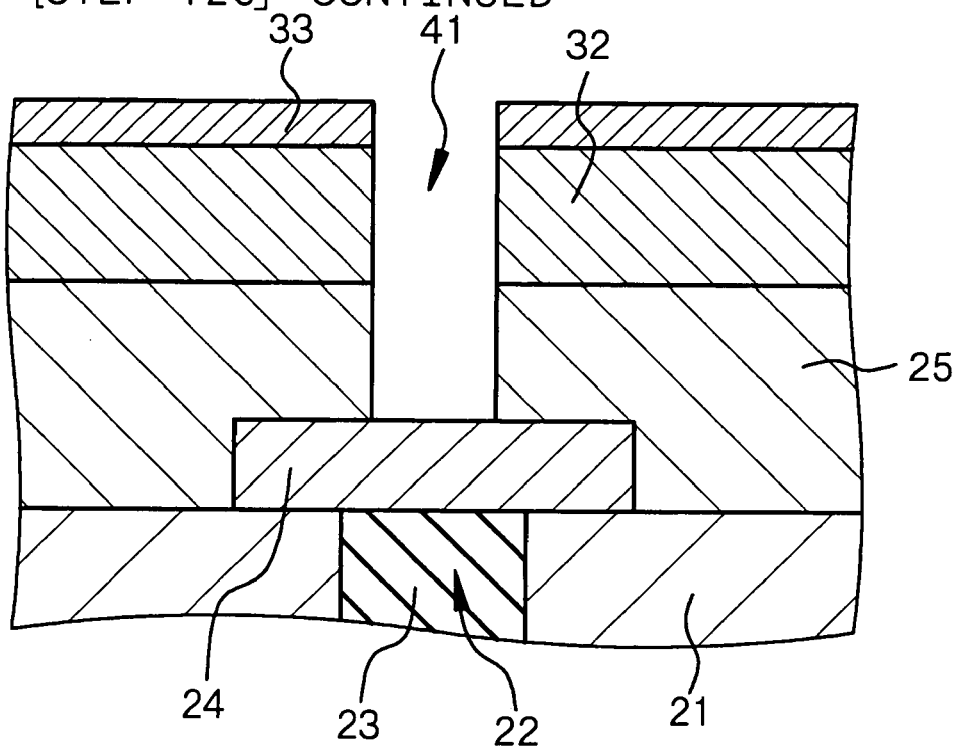
FIGS. 6A and 6B, following
Figure 6B:
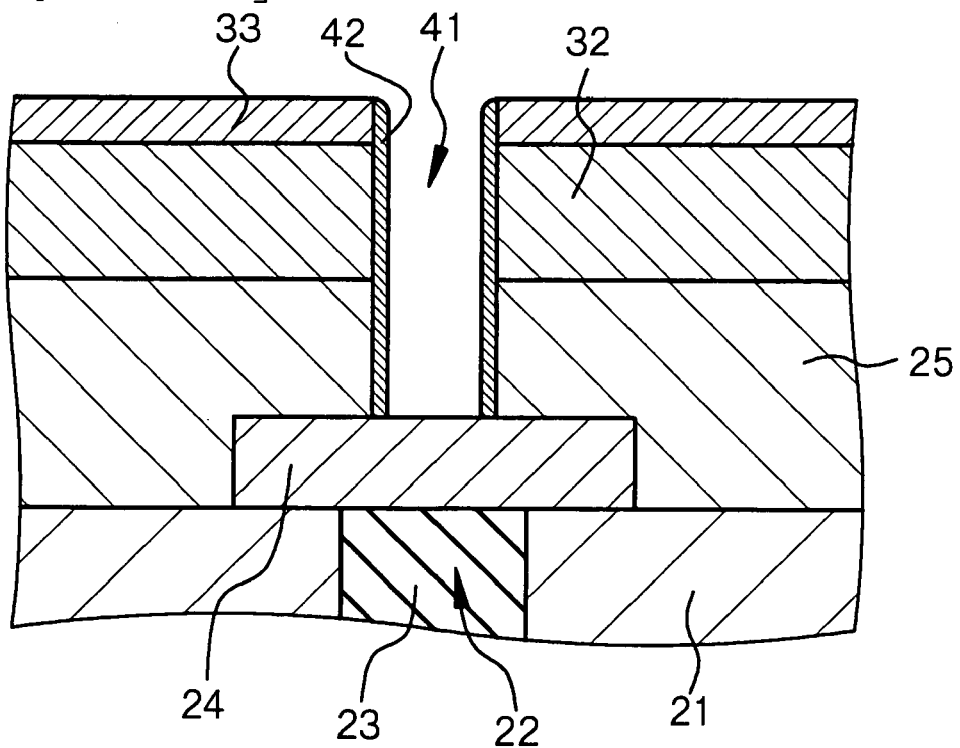

Then, a 20 nm thick insulating layer 42 made of $SiO_2$ is formed on the entire surface including an inside of the second opening portion 41 by a plasma CVD method, and then, the insulating layer 42 is etched back to retain the insulating layer 42 on the side surface of the second opening portion 41 (see FIG. 6B). The insulating layer 42 may be constituted of an insulating material such as $Al_2O_3$, SiN or the like formed by an ALD method or a sputtering method.

Figure 7:
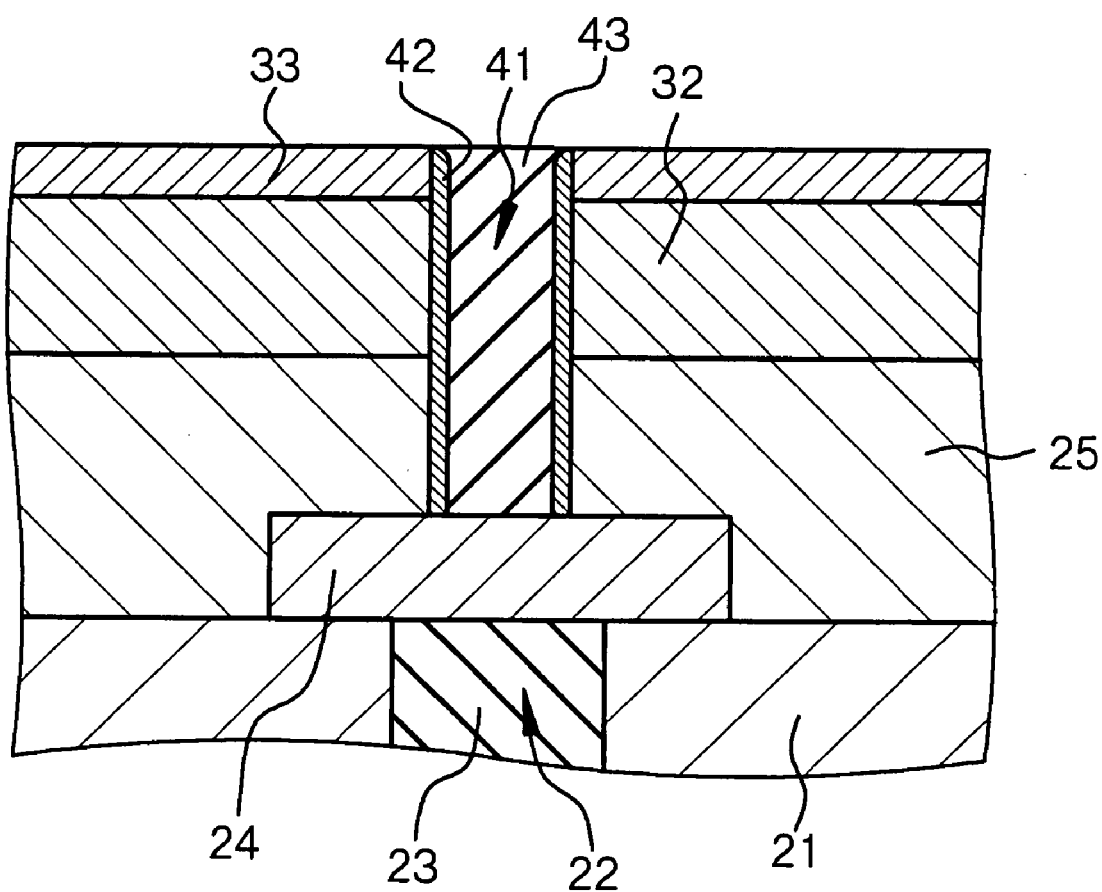
FIG. 7, following
Figure 8:
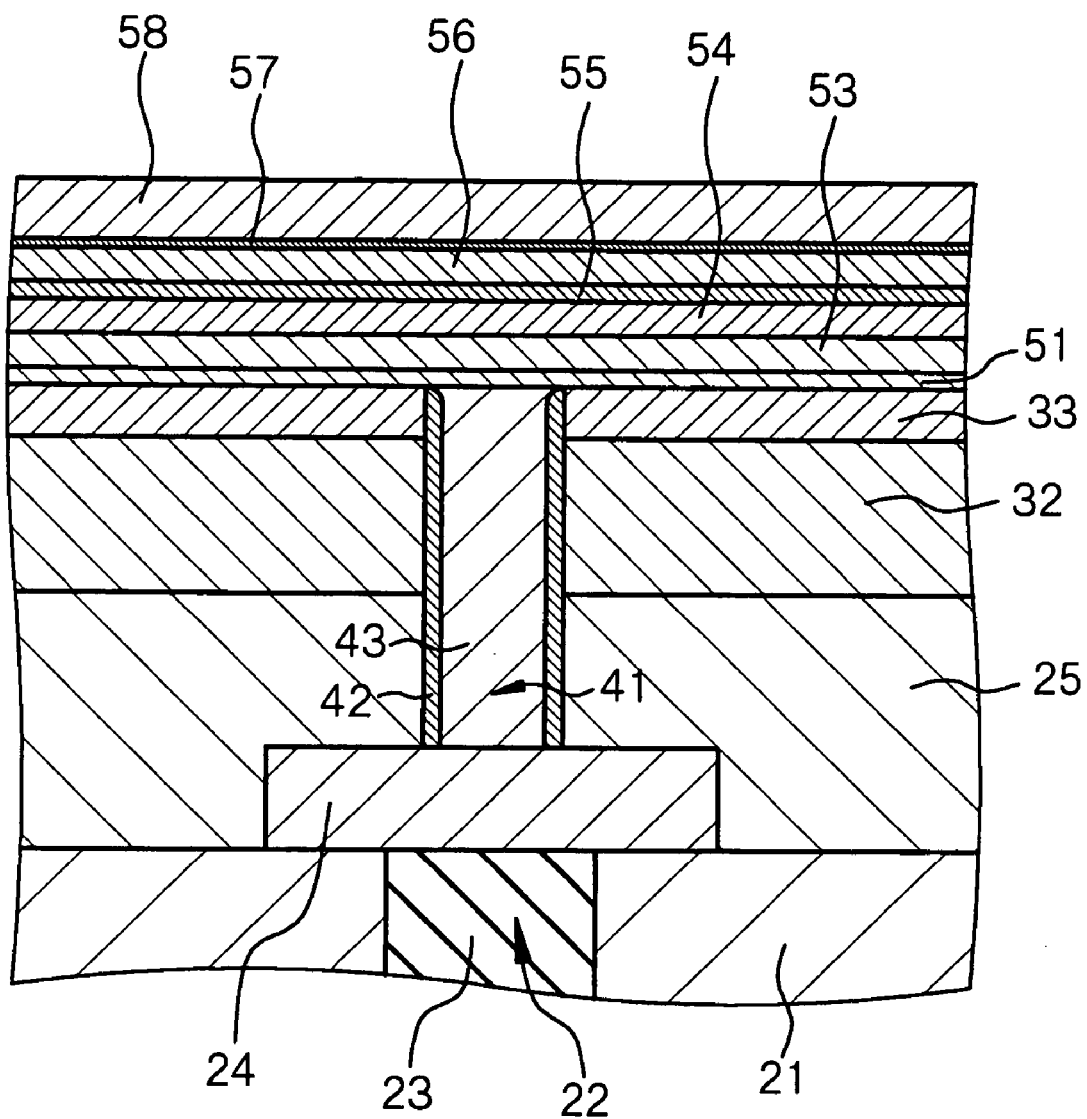
FIG. 8, following

Then, a tungsten film is formed on the entire surface including an inside of the second opening portion 41 by a CVD method, and then, the tungsten film on the insulating film 33 is removed by a CMP method, whereby there can be formed the second connecting hole 43 electrically insulated from the electrically conductive layer 32 with the insulating layer 42 in the second opening portion 41 (see FIG. 7). The above tungsten film may be replaced, for example, with a film of a metal such as ruthenium (Ru) that can be formed into a film at a low temperature of approximately 315° C.

[Step-130]

Then, on the insulating film 33, there is formed a stacking structure of the first ferromagnetic layer 52 at least electrically connected to the second connecting hole 43, the tunnel barrier 55 and the second ferromagnetic layer 56.

Specifically, a barrier layer 51 made of titanium nitride, tantalum or tantalum nitride, the anti-ferromagnetic layer 53, the pinned magnetic layer 54, the tunnel barrier 55, the second ferromagnetic layer (memory layer) 56 and a cap layer (top coating film) 57 made of the same material as that of the barrier layer 51 are consecutively formed by PVD methods. Then, a 50 nm thick electrically conductive material layer 58 made of tungsten or TiN is formed on the cap layer 57 by a CVD method. In this manner, a structure shown in FIG. 8 can be obtained. The tunnel barrier 55 is constituted, for example, of $AlO_x$. Since the tunnel barrier 55 has a very small thickness of 0.5 nm to 5 nm, so that it is preferred to form it by forming an aluminum thin film by an ALD method or a sputtering method, and then, plasma-oxidizing the aluminum thin film. However, the method of forming the tunnel barrier 55 shall not be limited thereto.

[Step-135]

Then, the stacking structure, the insulating film 33 and the electrically conductive layer 32 are patterned in the form of a stripe extending in the first direction (direction perpendicular to the paper surface of the drawing) by lithography and etching techniques. In this manner, there can be obtained the first wiring 31 that is formed of the electrically conductive layer 32 and extends in the first direction (see FIG. 9A). In this state, the first wiring 31 and the insulating film 33 extend in the direction perpendicular to the paper surface of the drawing, and the stacking structure formed on the insulating film 33 also extends in the direction perpendicular to the drawing.

[Step-140]

Figure 9A:
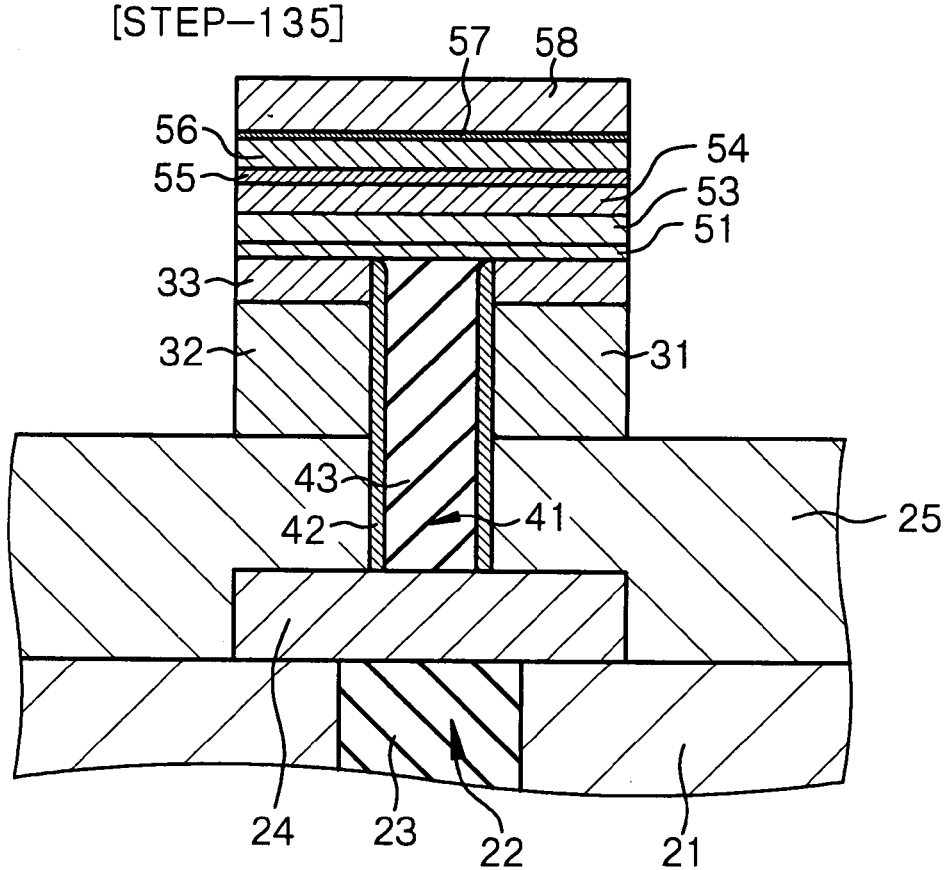
FIGS. 9A and 9B, following
Figure 9B:
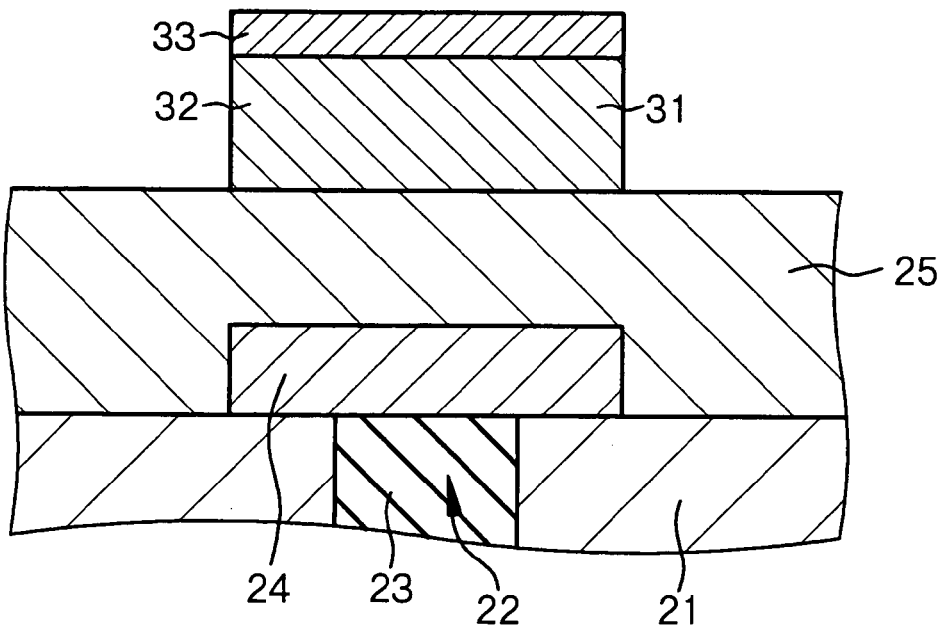

Then, the stacking structure patterned in the form of a stripe is selectively removed, to form the tunnel magnetoresistance device 50 having the tunnel barrier 55 sandwiched between the first and second ferromagnetic layers 53, 54 and 56. A portion where the tunnel magnetoresistance device 50 is formed has a schematic partial cross-sectional view as shown in FIG. 9A. The stacking structure patterned in the form of a stripe is selectively removed, and the first wiring 31 and the insulating film 33 are left between the tunnel magnetoresistance device 50 and the tunnel magnetoresistance device 50, which state is shown as a schematic partial cross-sectional view in FIG. 9B.

[Step-145]

Then, a 0.1 $\mu$m thick upper insulating interlayer (the third insulating interlayer 59) made of $SiO_2$ is formed on the entire surface by a plasma CVD method, and then, the third insulating interlayer 59 is flattened by a CMP method, to expose the electrically conductive material layer 58.

[Step-150]

Then, the second wiring (bit line BL) is formed on the upper insulating interlayer (third insulating interlayer 59). The second wiring is electrically connected to the second ferromagnetic layer 56 (specifically, is connected to the electrically conductive material layer 58) and extends in the second direction (leftward and rightward on the drawing) crossing the first direction at right angles (see FIGS. 1 and 2). In this case, a wiring of a peripheral circuit (not shown) and a bonding pad region (not shown) are formed as well. Further, a silicon nitride film (not shown) is deposited on the entire surface by a plasma CVD method, and the bonding pad portion (not shown) is opened in the silicon nitride film, to complete the manufacturing steps of an MRAM.

In the MRAM of Example 1, the tunnel magnetoresistance device 50, the insulating film 33 and the first wiring 31 have the same widths along the second direction, so that the minimum cell size can be materialized and that there is not caused the problem that the fluctuation of writing characteristics increases due to asymmetricity of the asteroid curve.

In the manufacturing method of MRM in Example 1, the stacking structure, the insulating film 33 and the electrically conductive layer 32 are patterned in the form of a strip extending in the first direction in the above [Step-135], so that the lithography step is free of a mask alignment deviation, and that the minimum cell size can be materialized.

EXAMPLE 2

Figure 10:
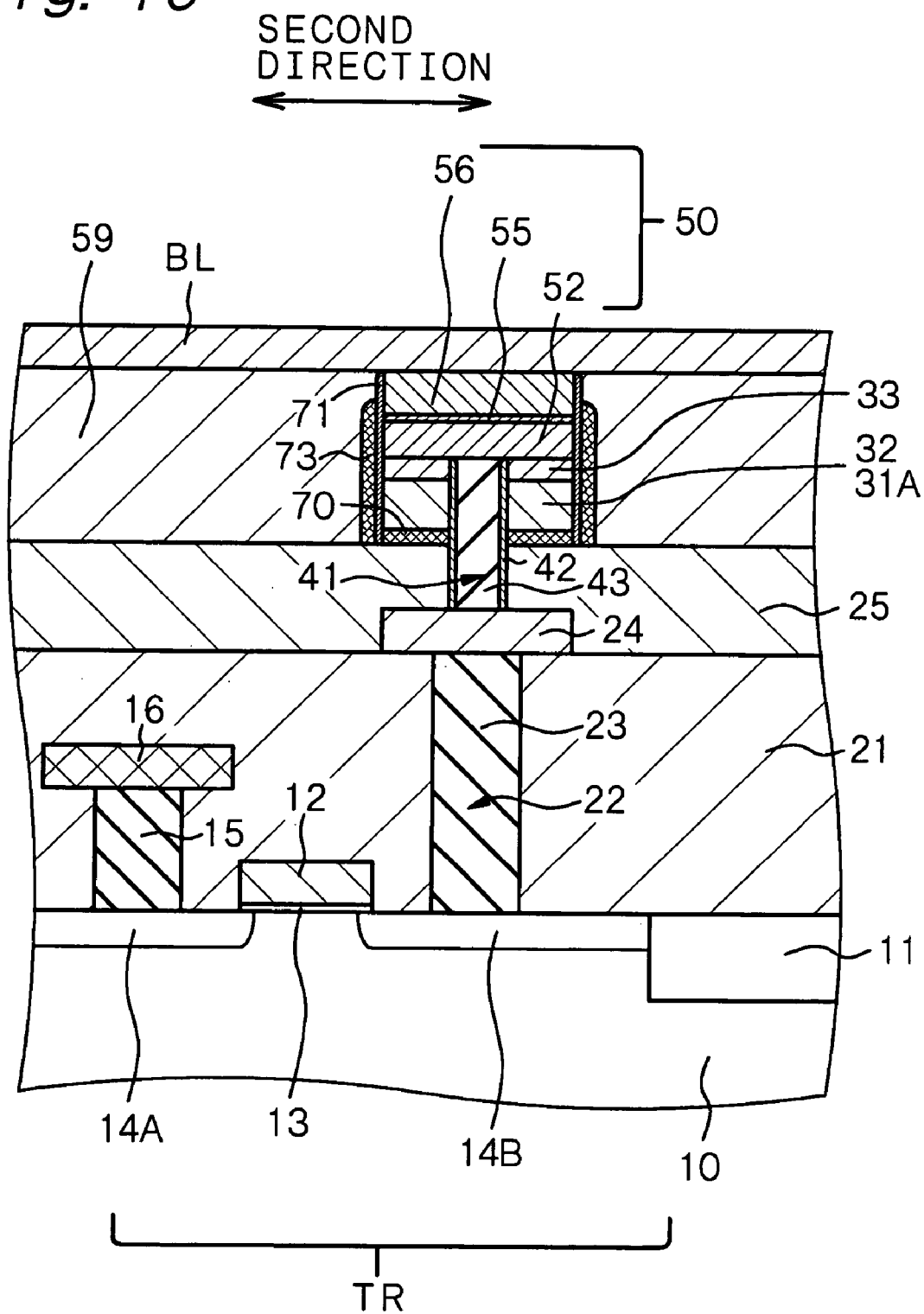
FIG. 10 is a schematic partial cross-sectional view of a nonvolatile magnetic memory device in Example 2.
Figure 11:
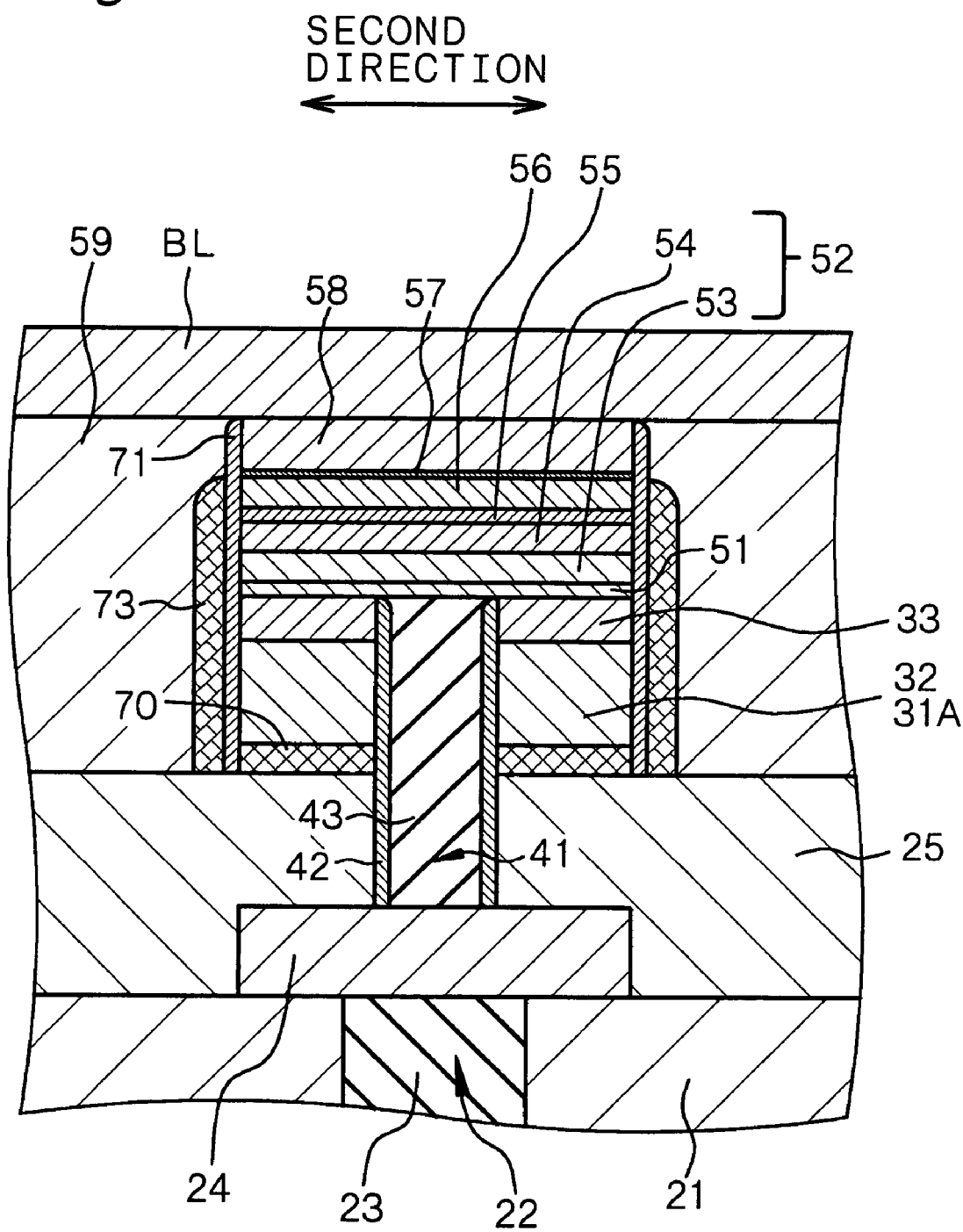
FIG. 11 is an enlarged schematic partial cross-sectional view of a circumferential portion of a tunnel magnetoresistance device of the nonvolatile magnetic memory device in Example 2.
Figure 12A:
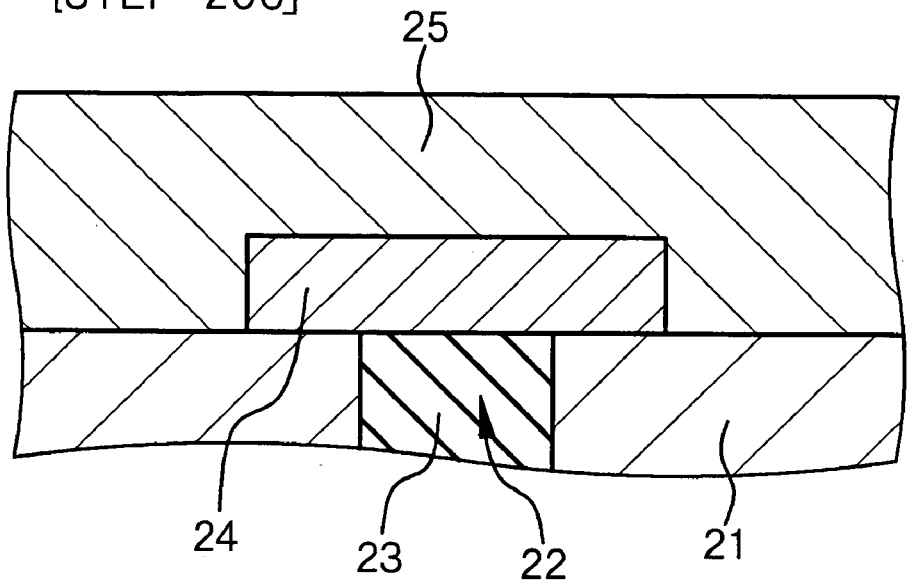
FIGS. 12A and 12B are schematic partial cross-sectional views of a first insulating interlayer, etc., for explaining a manufacturing method of a nonvolatile memory device in Example 2.
Figure 12B:
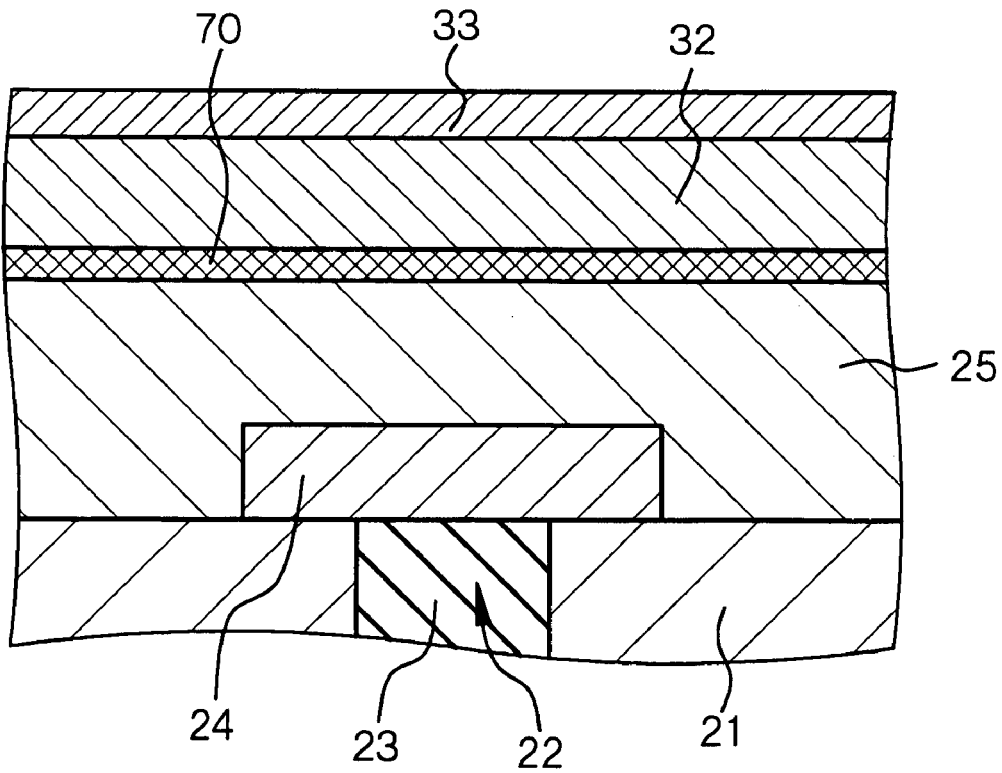
Figure 13:
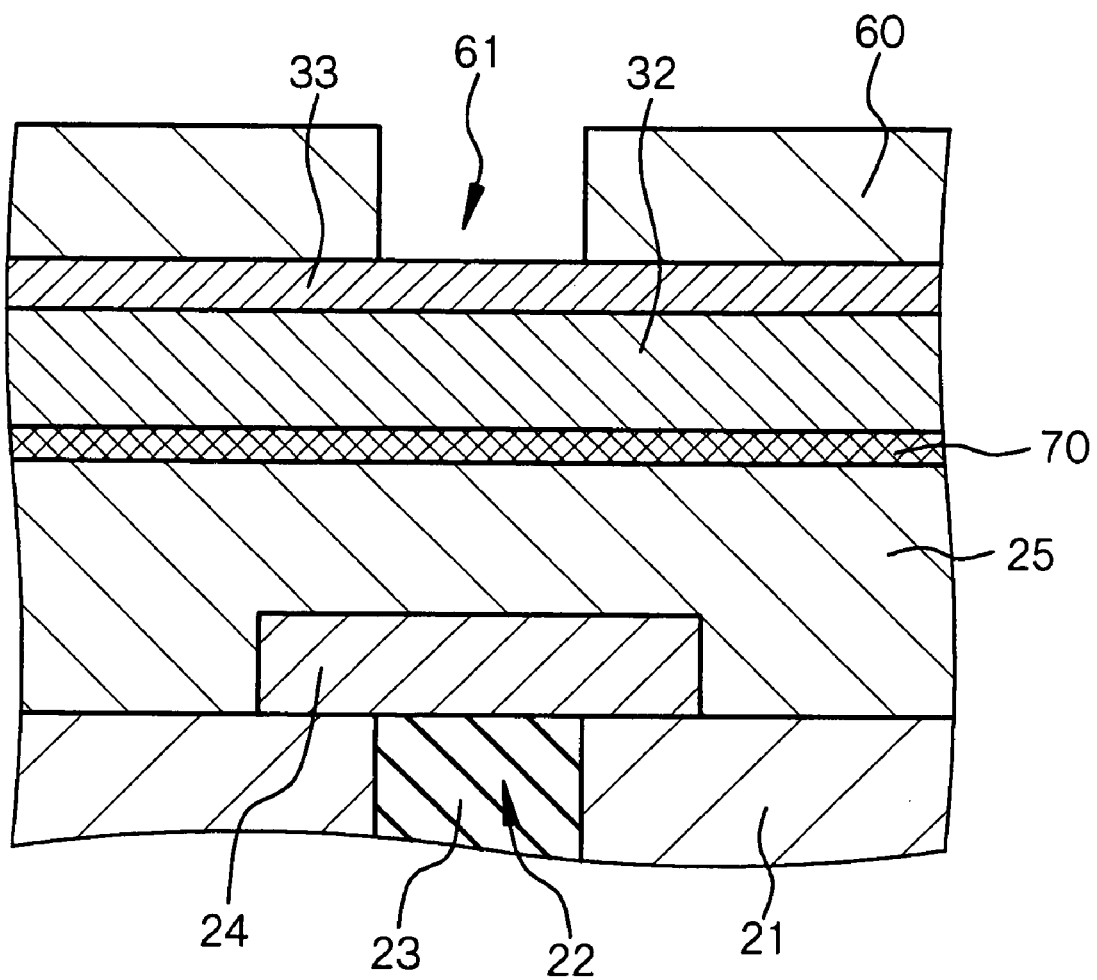
FIG. 13, following
Figure 14:
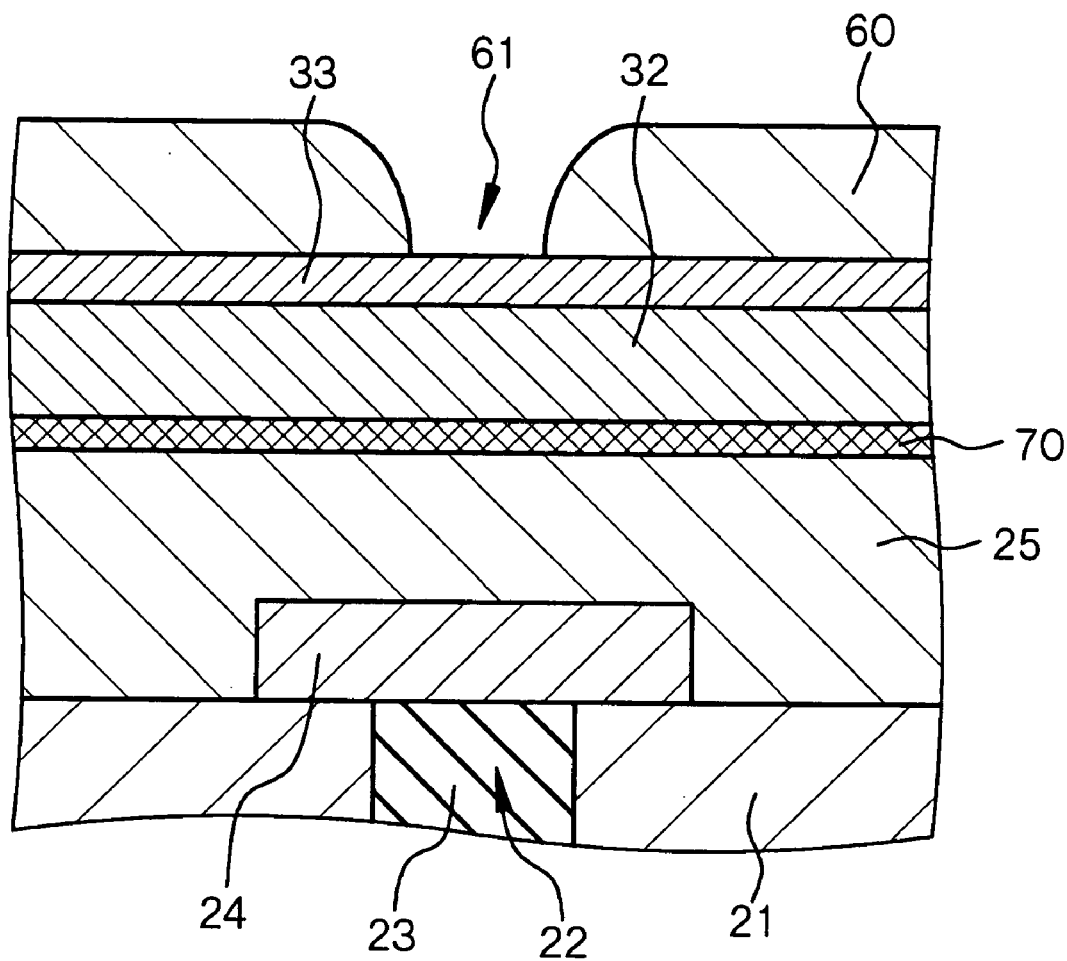
FIG. 14, following
Figure 15A:
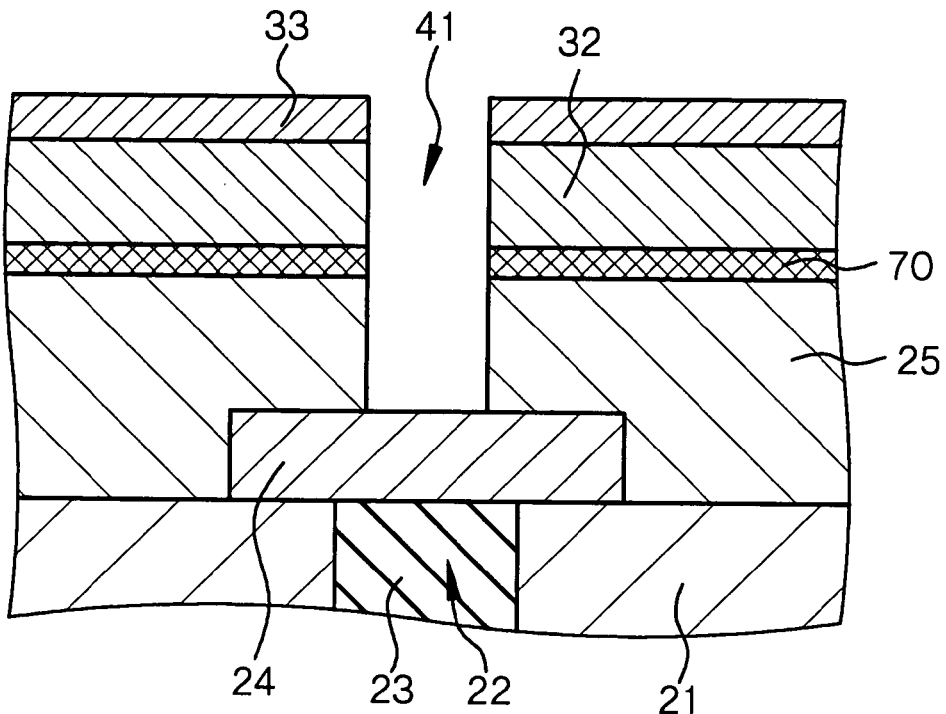
FIGS. 15A and 15B, following
Figure 15B:
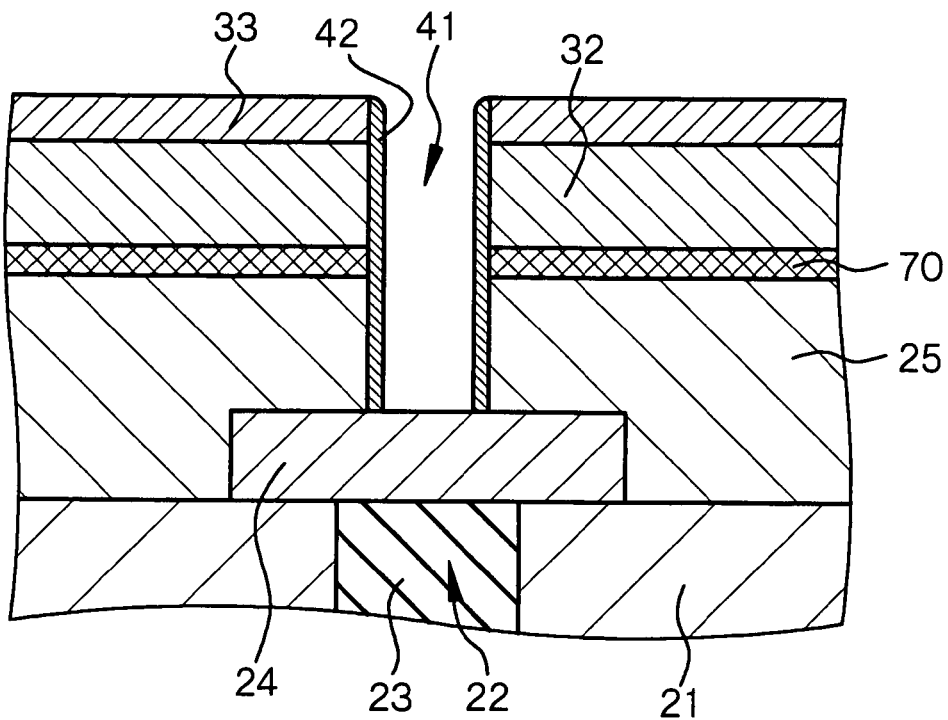
Figure 16:
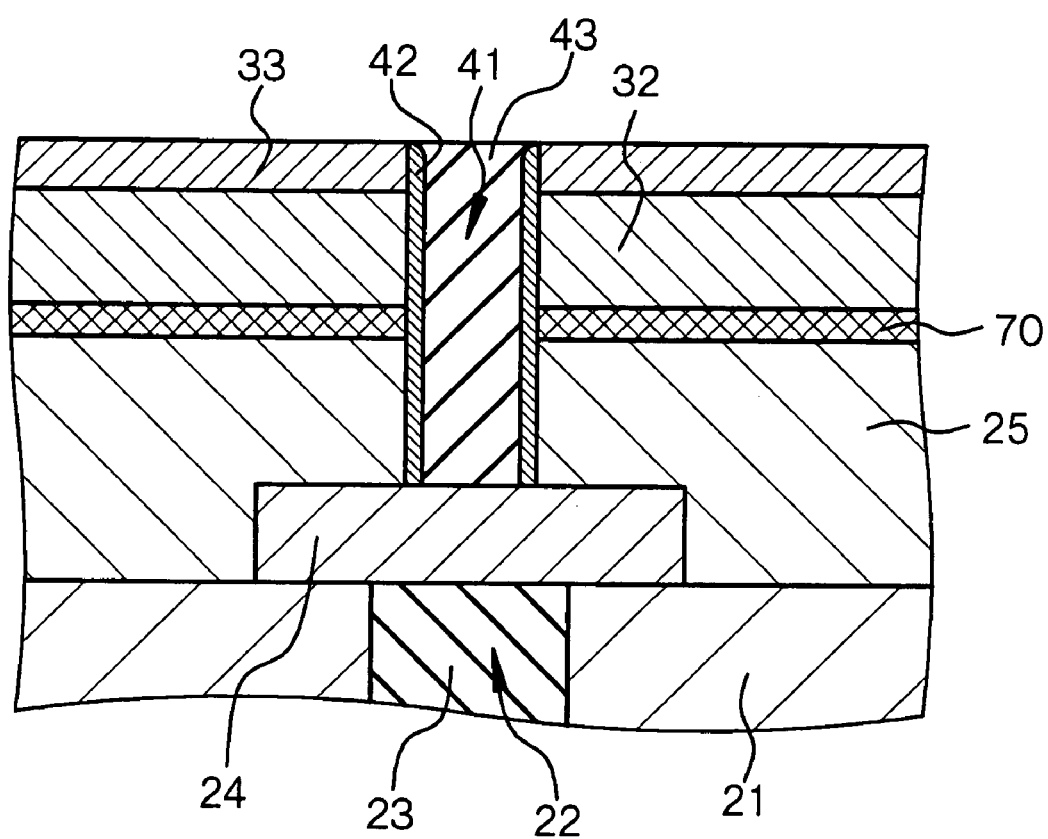
FIG. 16, following
Figure 17:
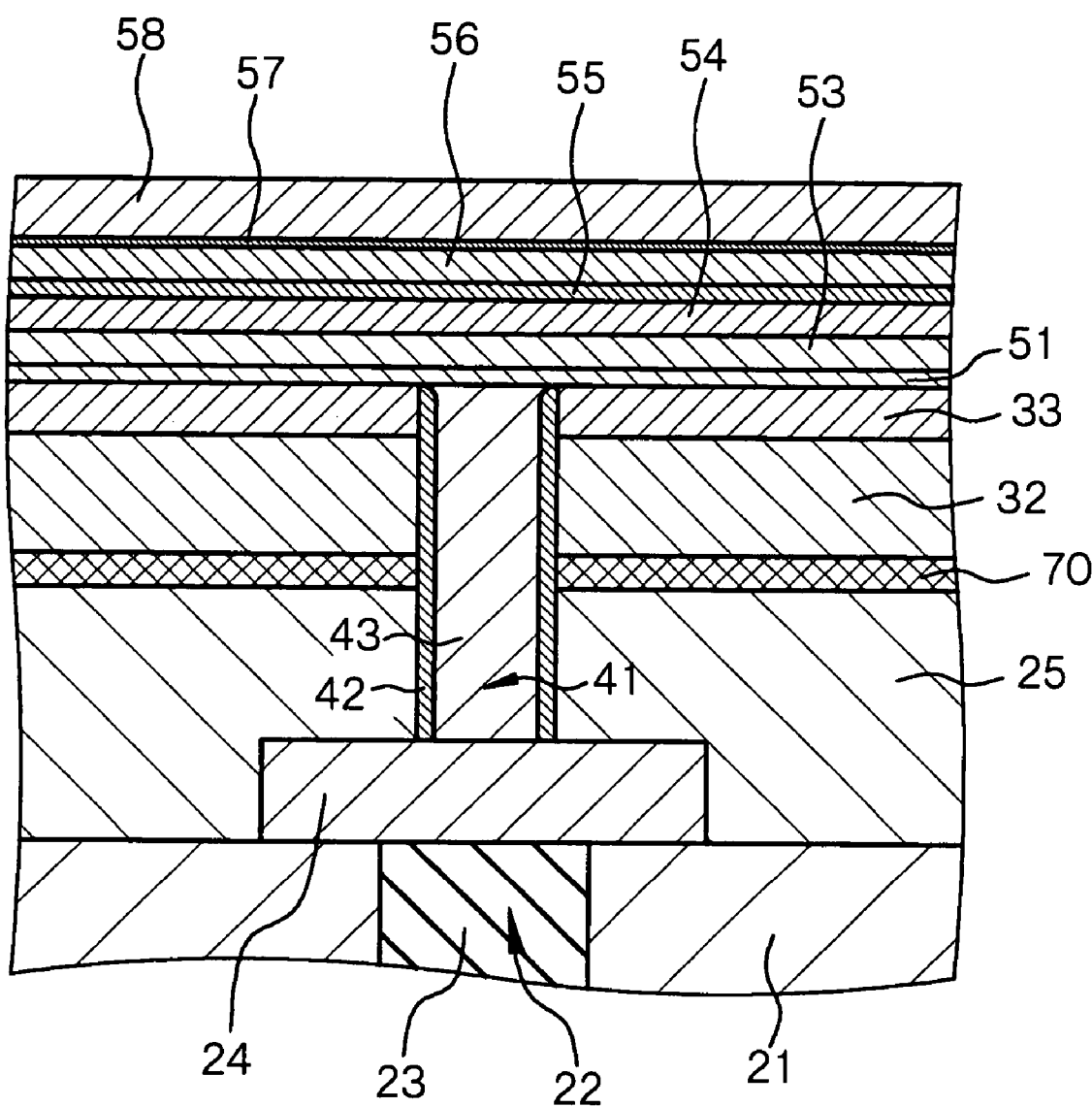
FIG. 17, following
Figure 18:
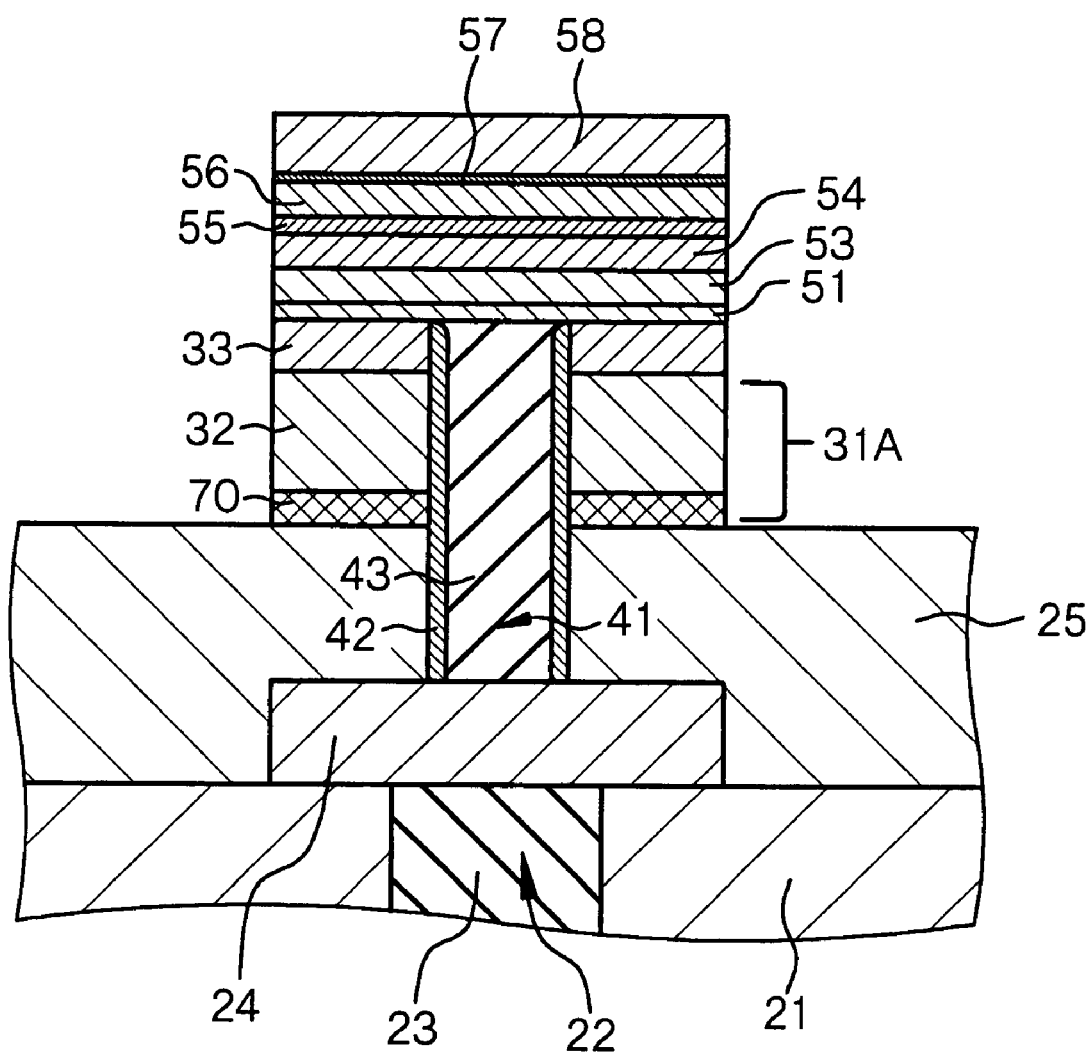
FIG. 18, following
Figure 19:
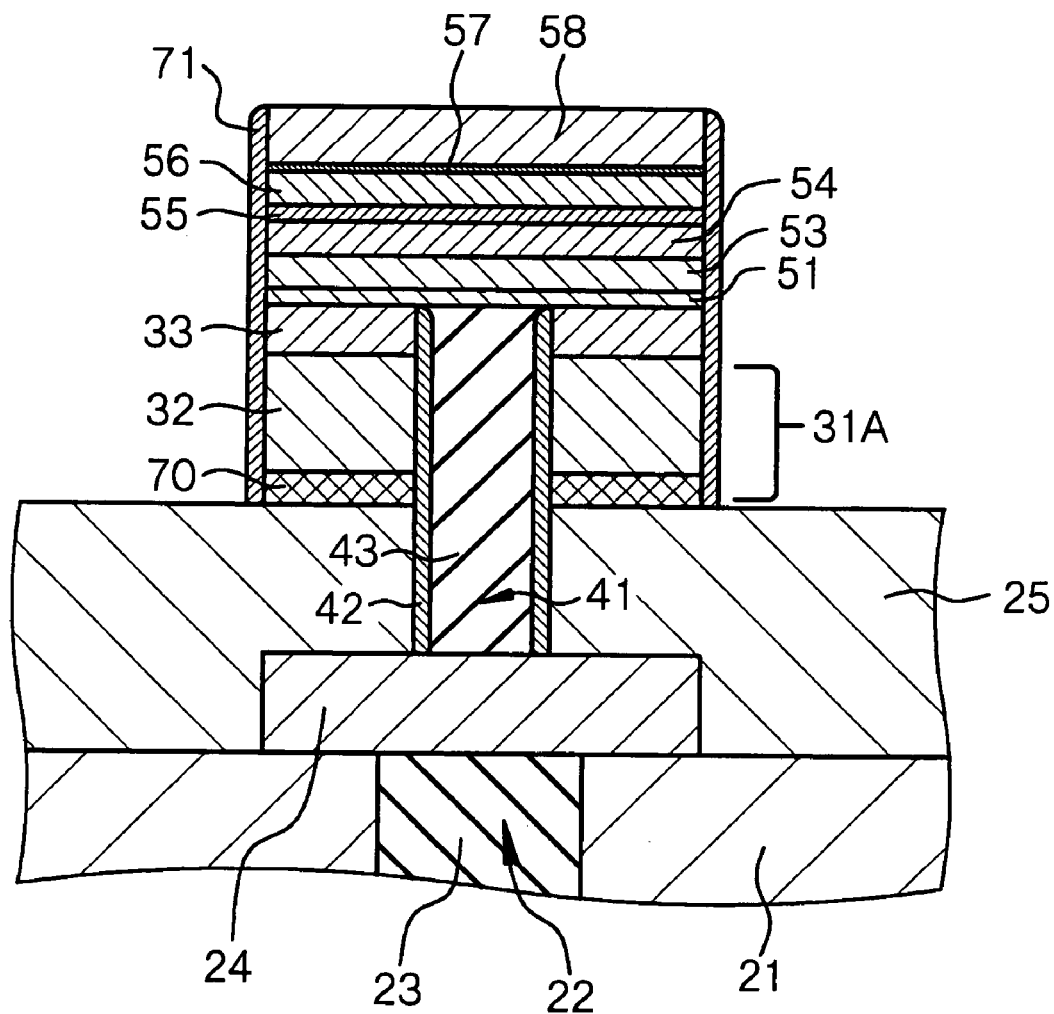
FIG. 19, following

Example 2 is concerned with the MRAM having the first constitution of the present invention and the manufacturing method of an MRAM according to the second aspect of the present invention. FIG. 10 shows a schematic partial cross-sectional view of the MRAM in Example 2, and FIG. 11 shows an enlarged schematic partial cross-sectional view of a circumferential portion of a tunnel magnetoresistance device.

In the MRAM of Example 2, the first wiring (write-in word line) 31A comprises a first high-permeability material layer 70 and the electrically conductive layer 32 which are positioned in this order from below. And, a sidewall 71 made of an insulating material is formed on the side surface of the tunnel magnetoresistance device 50, the side surface of the insulating film 30 and the side surface of the first wiring 31A along the first direction (direction perpendicular to the paper surface of the drawing). The sidewall 71 is covered with a second high-permeability material layer 73. The first high-permeability material layer 70 and the second high-permeability material layer 73 are made of an Ni—Fe alloy, and the sidewall 71 is made of alumina ($Al_2O_3$). The sidewall 71 is present between the lower portion of the second high-permeability material layer 73 and the side surface of the first high-permeability material layer 70. Since other structures can be the same as those of the MRAM explained in Example 1, a detailed explanation thereof will be omitted. In the MRAM of Example 2, the tunnel magnetoresistance device 50, the insulating film 33 and the first wiring 31A have the same widths along the second direction.

The manufacturing method of an MRAM in Example 2 will be explained below with reference to FIGS. 12A, 12B, 13, 14, 15A, 15B, 16, 17, 18, 19, 20A and 20B which are schematic partial cross-sectional views of the first insulating interlayer 21 and the like.

[Step-200]

First, the transistor for selection TR is formed in the semiconductor substrate 10, and then, the first insulating interlayer 21 (lower layer of the lower insulating interlayer) is formed on the entire surface. Then, the first opening portion 22 is formed through the first insulating interlayer 21, the first connecting hole 23 connected to the transistor for selection TR is formed in the first opening portion 22, and then, the second insulating interlayer 25 (upper layer of the lower insulating interlayer) is formed on the entire surface. These steps can be carried out substantially in the same manner as in [Step-100], [Step-105], [Step-110] and [Step-115] in Example 1, so that a detailed explanation will be omitted. In this manner, a structure shown in FIG. 12A can be obtained.

[Step-205]

Then, the first high-permeability material layer 70, the electrically conductive layer 32 and the insulating layer 33 are formed on the second insulating interlayer 25 (upper layer of the lower insulating interlayer). Specifically, a 20 nm thick Ti layer (not shown), the 20 nm thick first high-permeability material layer 70 and a 20 nm thick TiN layer (not shown) are formed on the second insulating interlayer 25 by sputtering methods, and then, the 0.3 $\mu$m thick electrically conductive layer 32 made of Al—Cu is formed by a sputtering method. A 10 nm thick Ti layer and a 0.1 $\mu$m thick TiN layer (these are not shown) are consecutively formed thereon by sputtering methods. Then, the 50 nm thick insulating film 33 made of alumina ($Al_2O_3$) is formed by a sputtering method. In this manner, a structure shown in FIG. 12B can be obtained.

[Step-210]

Then, the second opening portion 41 is formed through portions of at least the insulating film 33, the electrically conductive layer 32 and the first high-permeability material layer 70 (more specifically, portions of the insulating film 33, the electrically conductive layer 32, the first high-permeability material layer 70 and the second insulating interlayer 25) which portions are positioned above the first connecting hole 23 (more specifically, the landing pad 24). Then, the second connecting hole 43 electrically insulated from the electrically conductive layer 32 and connected to the first connecting hole 23 (more specifically, the landing pad 24) is formed in the second opening portion 41 (see FIGS. 13, 14, 15A, 15B and 16). Specifically, it is substantially sufficient to carry out a step similar to [Step-125] in Example 1.

[Step-215]

Then, the stacking structure of at least the first ferromagnetic layer 52, the tunnel barrier 55 and the second ferromagnetic layer 56 is formed on the insulating film 33. Specifically, it is substantially sufficient to carry out a step similar to [Step-130] in Example 1. In this manner, a structure shown in FIG. 17 can be obtained.

[Step-220]

Then, the stacking structure, the insulating film 33, the electrically conductive layer 32 and the first high-permeability material layer 70 are patterned in the form of a stripe extending in the first direction (direction perpendicular to the paper surface of the drawing) by lithography and etching techniques. In this manner, there can be obtained the first wiring 31A that is formed of the electrically conductive layer 32 and the first high-permeability material layer 70 and extends in the first direction (see FIG. 18). In this state, the first wiring 31A and the insulating film 33 extend in the direction perpendicular to the paper surface of the drawing, and the stacking structure formed on the insulating film 33 also extends in the direction perpendicular to the paper surface of the drawing.

[Step-225]

Then, the sidewall 71 is formed on the side surface of the stacking structure, the side surface of the insulating film 33, the side surface of the electrically conductive layer 32 and the side surface of the first high-permeability material layer 70. Specifically, an $Al_2O_3$ film is formed on the entire surface by a sputtering method, and then, $Al_2O_3$ film is etched back, whereby the sidewall 71 made of $Al_2O_3$ can be formed (see FIG. 19). The sidewall 71 can be also constituted of an $SiO_2$ film, an SiON film or an SiN film formed by a CVD method or an ALD method. The sidewall 71 has an average thickness of 20 nm.

[Step-230]

Figure 20A:
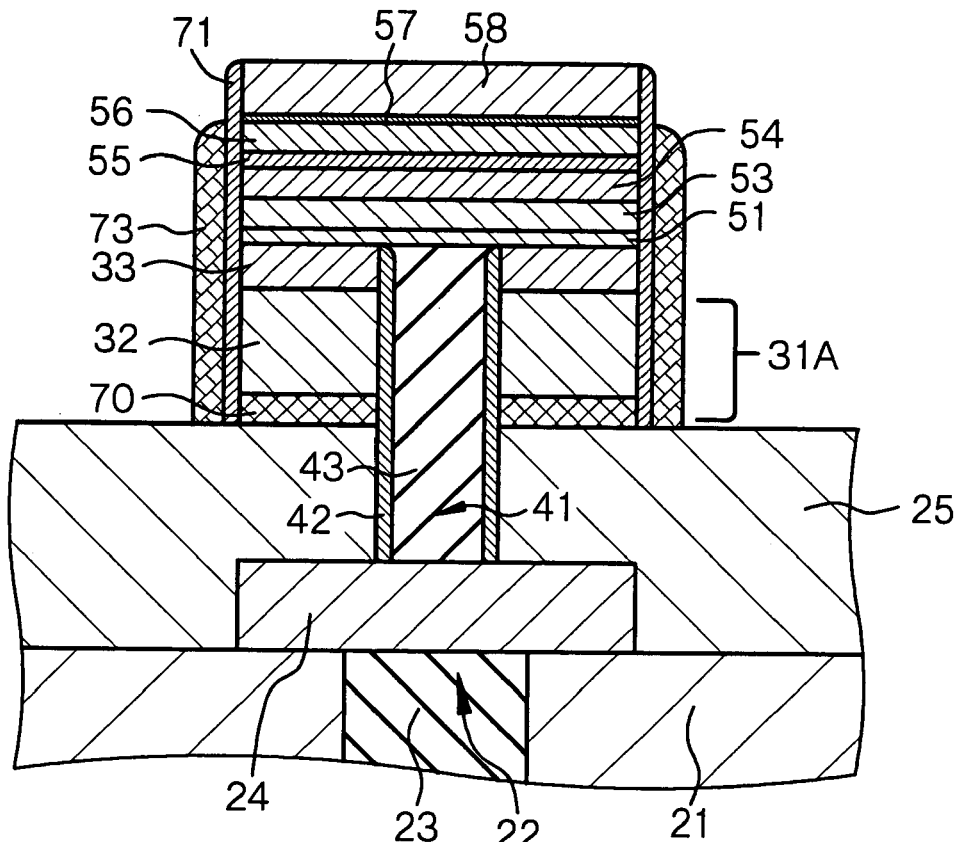
FIGS. 20A and 20B, following
Figure 20B:
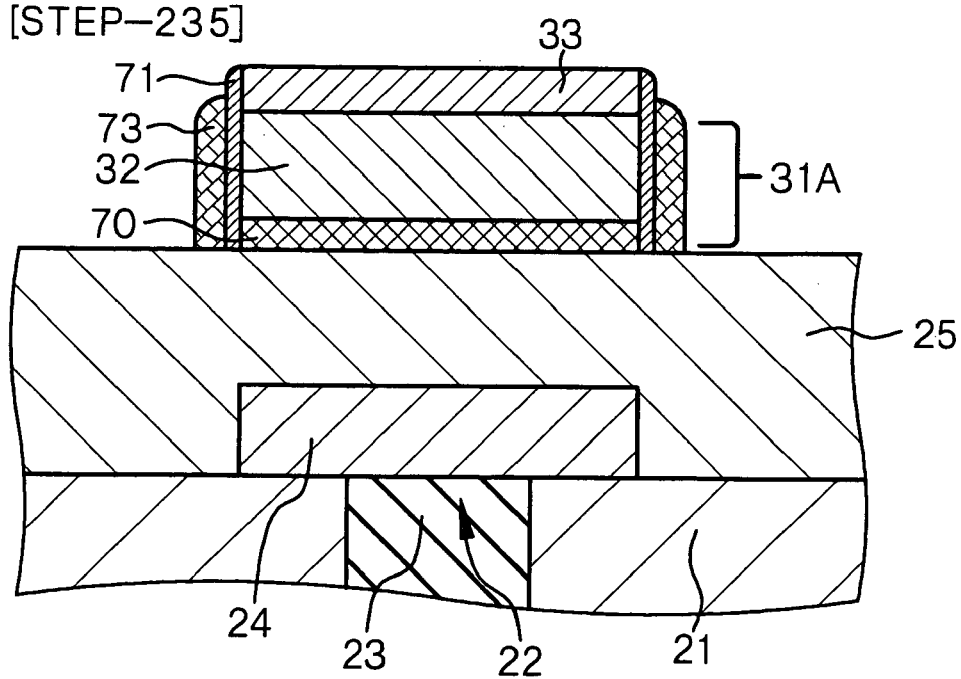

Then, the second high-permeability material layer 73 is formed on the sidewall 71 (see FIG. 20A). Specifically, a high-permeability material layer made of Ni—Fe is formed on the entire surface by a sputtering method, and then, the high-permeability material layer is etched back, whereby the second high-permeability material layer 73 can be formed on the sidewall 71.

[Step-235]

Then, the stacking structure patterned in the form of a stripe and the sidewalls 71 are selectively removed, and further, the second high-permeability material layer 73 is selectively removed, whereby there is formed the tunnel magnetoresistance device 50 having the tunnel barrier 55 sandwiched between the first and second ferromagnetic layers 53, 54 and 56. A portion where the tunnel magnetoresistance device 50 is formed has a schematic partial cross-sectional view as shown in FIG. 20A. The stacking structure patterned in the form of a stripe and the like are selectively removed, and the first wiring 31A and the insulating film 33 are left between the tunnel magnetoresistance device 50 and the tunnel magnetoresistance device 50, which state is shown as a schematic partial cross-sectional view in FIG. 20B.

[Step-240]

Then, an upper insulating interlayer (third insulating interlayer 59) is formed on the entire surface, and on the third insulating interlayer 59, there is formed the second wiring (bit line BL) that is electrically connected to the second ferromagnetic layer (specifically, connected to the electrically conductive layer 58) and which extends in the second direction crossing the first direction at right angles (leftward and rightward on the drawing). These steps can be carried out substantially in the same manner as in [Step-145] and [Step-150] in Example 1.

In the MRAM of Example 2, the tunnel magnetoresistance device 50, the insulating film 33 and the first wiring 31A have the same widths along the second direction as well, so that the minimum cell size can be materialized and that there is not caused the problem that the fluctuation of writing characteristics increases due to asymmetricity of the asteroid curve. Further, the sidewall 71 is formed on the side surface of the tunnel magnetoresistance device 50, the side surface of the insulating film 33 and the side surface of the first wiring 31A, and the second high-permeability material layer 73 is formed on the sidewall 71, so that magnetic fluxes can be effectively concentrated on the second ferromagnetic layer 56, and as a result, the current consumption can be fully reduced.

In the manufacturing method of an MRAM in Example 2, the stacking structure, the insulating film 33 and the first wiring 31A are patterned in the form of a stripe extending in the first direction in the above [Step-220], so that the lithography step is free of a mask alignment deviation, and as a result, the minimum cell size can be materialized. Further, the sidewall 71 is formed on the side surface of the stacking structure, the side surface of the insulating film 33 and the side surface of the first high-permeability material layer 70 in the above [Step-225], and the second high-permeability material layer 73 is formed on the sidewall 71 in the above [Step-230], so that magnetic fluxes can be effectively concentrated on the second ferromagnetic layer 56, and as a result, the current consumption can be fully reduced.

Figure 21:
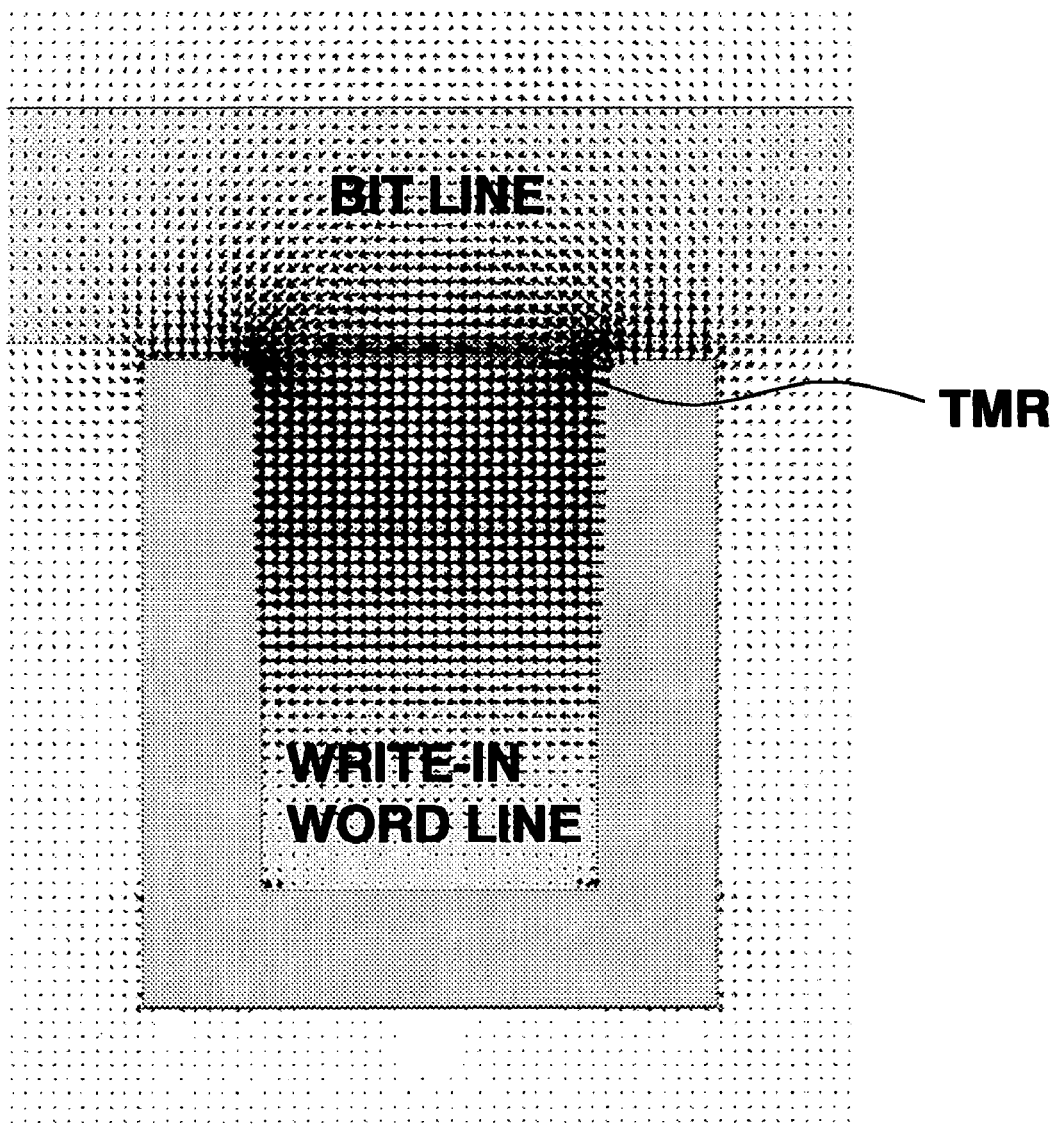
FIG. 21 shows a simulation result of a magnetic flux distribution in the vicinity of a tunnel magnetoresistance device in the nonvolatile magnetic memory device in Example 2.
Figure 38:
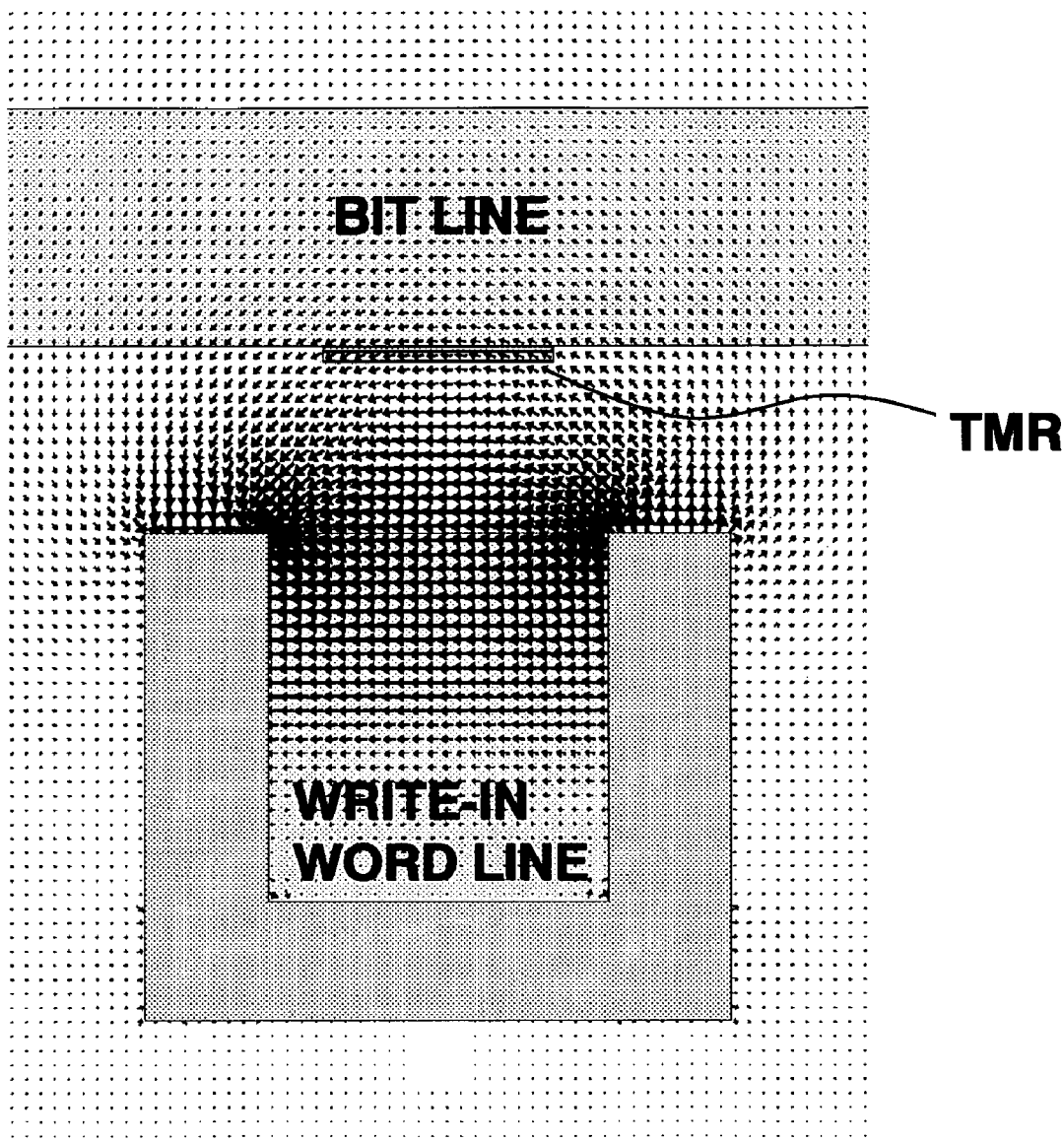
FIG. 38 shows a simulation result of a magnetic flux distribution in the vicinity of a tunnel magnetoresistance device in the conventional nonvolatile magnetic memory device having a structure shown in FIG. 36.

FIG. 21 shows a simulation result of a magnetic flux distribution in the vicinity of the tunnel magnetoresistance device 50 in the MRAM of Example 2. In FIG. 21, the tunnel magnetoresistance device 50 is shown as TMR. When FIG. 21 and FIG. 38 are compared, it is seen that magnetic fluxes are more concentrated on the tunnel magnetoresistance device 50 in the MRAM of Example 2.

Figure 22:
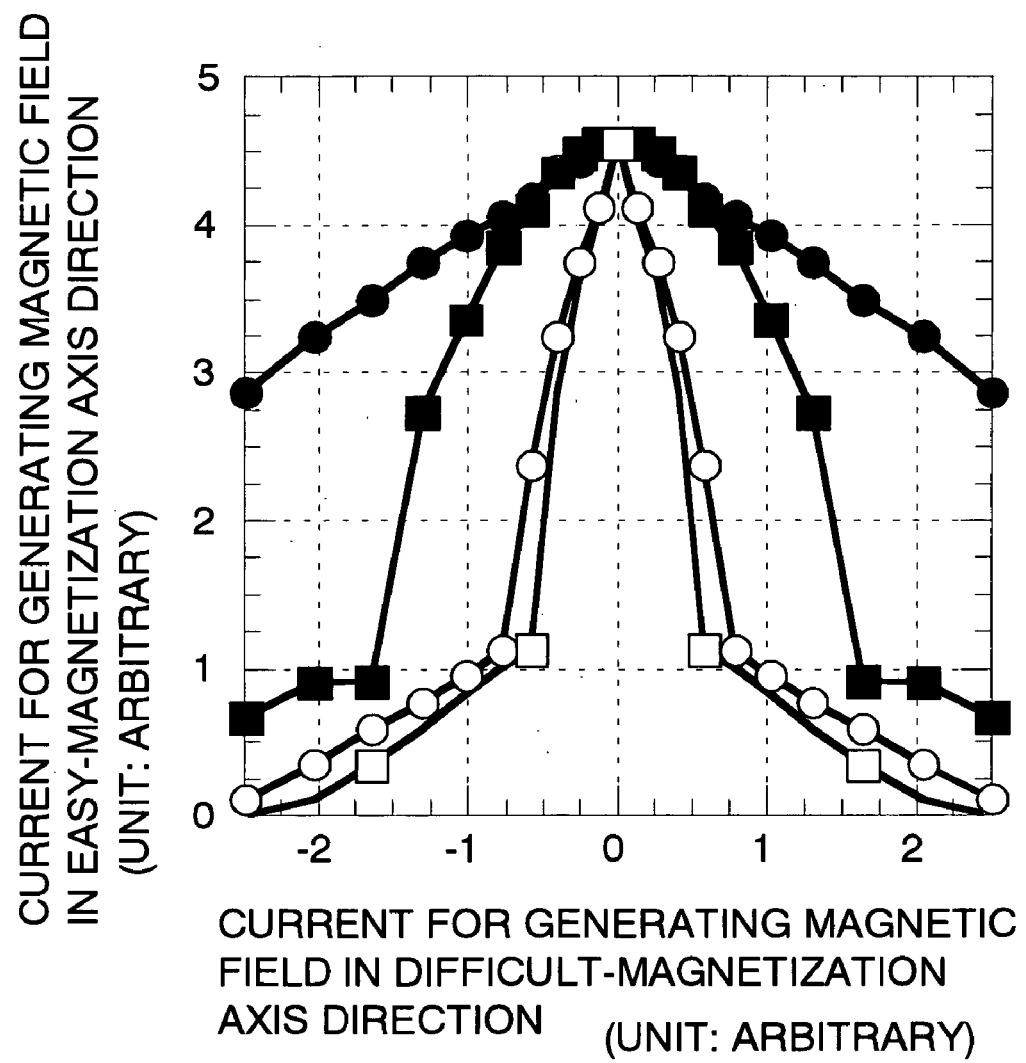
FIG. 22 shows graphs of part of the asteroid curve of a conventional nonvolatile magnetic memory device shown in FIG. 34, part of the asteroid curve of a nonvolatile magnetic memory device disclosed in U.S. Pat. No. 5,940,319 shown in FIG. 36, part of the asteroid curve of the nonvolatile magnetic memory device in Example 2 and part of the asteroid curve of the nonvolatile magnetic memory device in Example 3.
Figure 34:
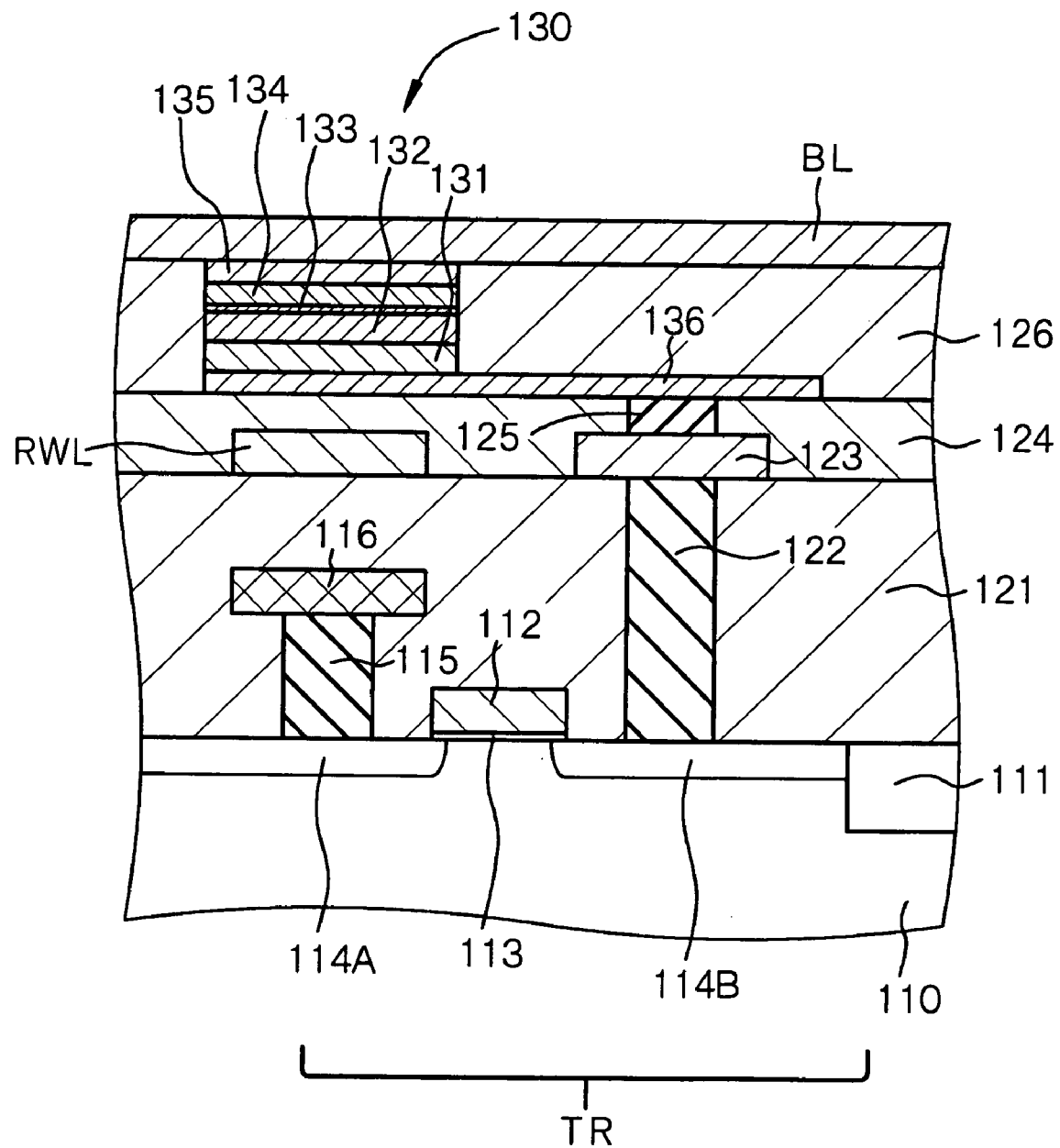
FIG. 34 is a schematic partial cross-sectional view of a conventional nonvolatile magnetic memory device.
Figure 35:
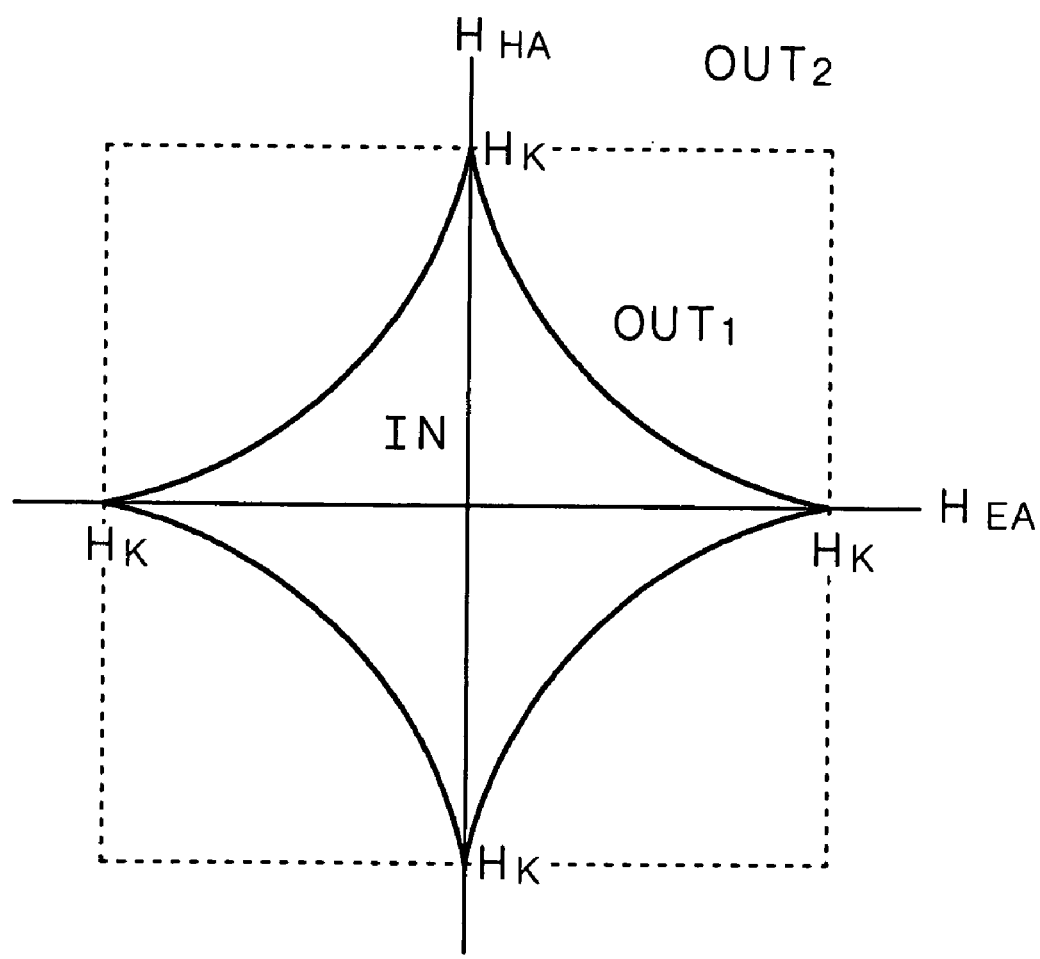
FIG. 35 schematically shows an asteroid curve of an MRAM in a nonvolatile magnetic memory device.
Figure 36:
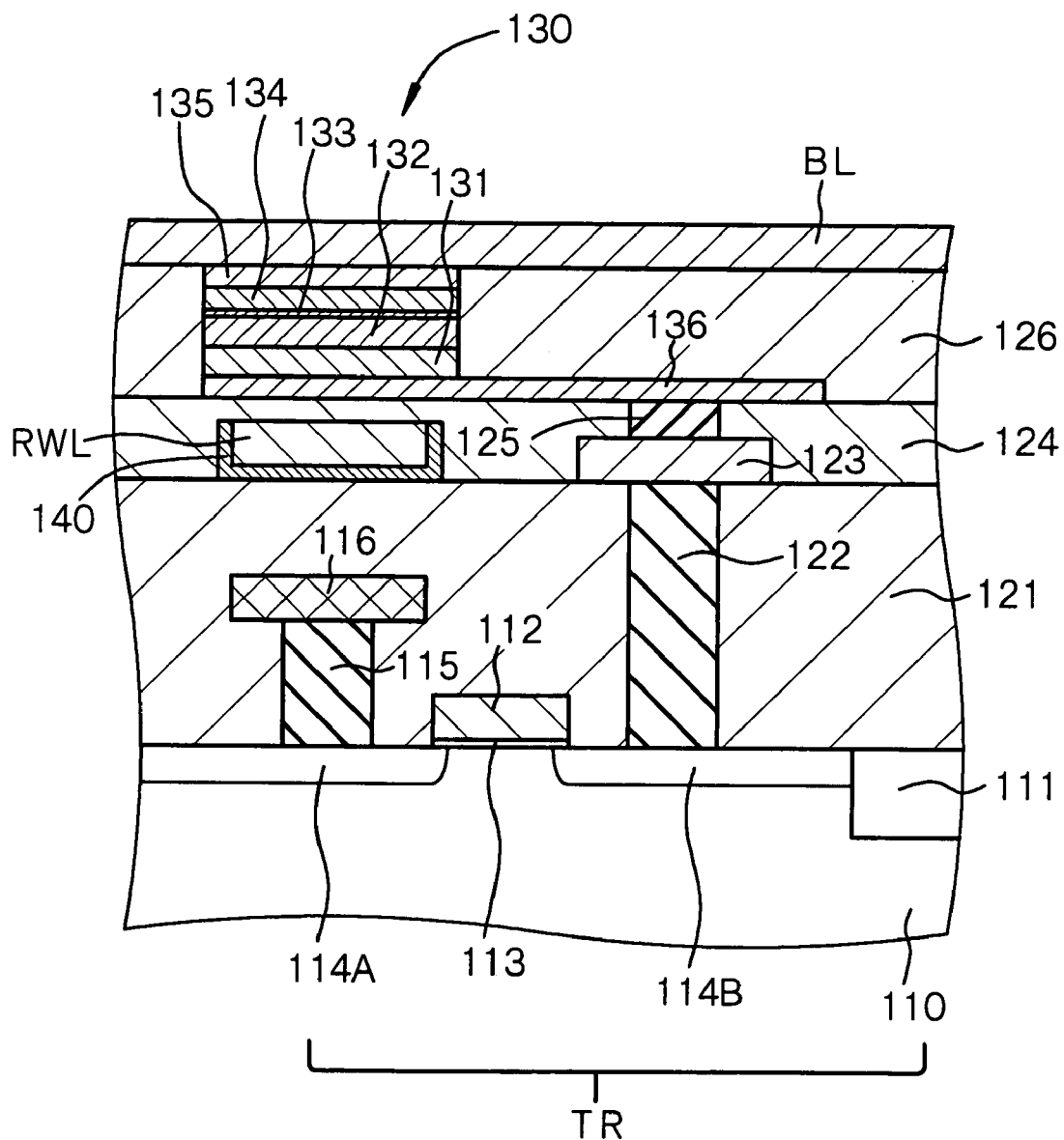
FIG. 36 is a schematic partial cross-sectional view of a conventional nonvolatile magnetic memory device.
Figure 37:
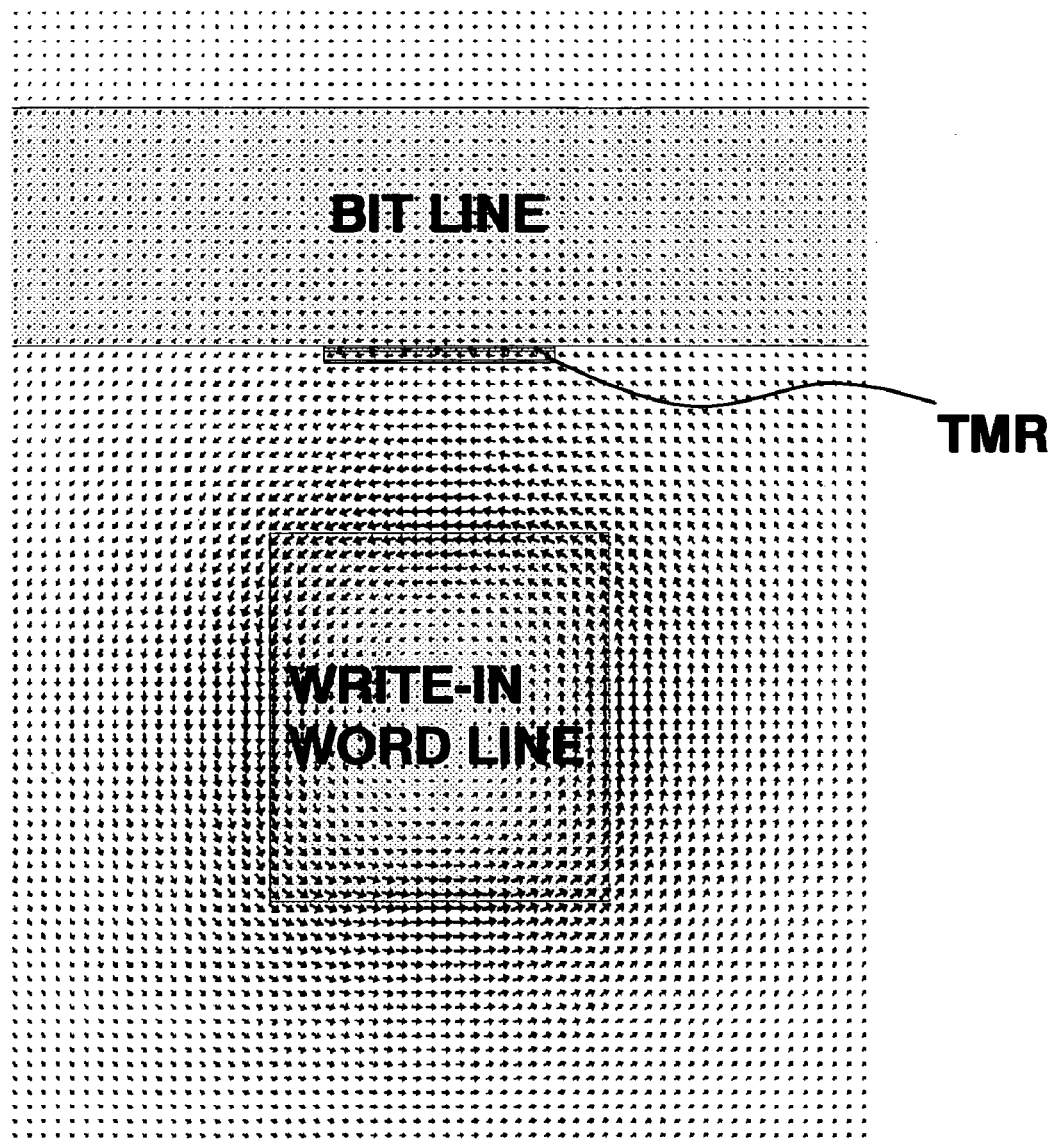
FIG. 37 shows a simulation result of a magnetic flux distribution in the vicinity of a tunnel magnetoresistance device in the conventional nonvolatile magnetic memory device having a structure shown in FIG. 34.

FIG. 22 shows graphs of part of the asteroid curve (black circles) of a conventional MRAM shown in FIG. 34, part of the asteroid curve (black squares) of the MRAM disclosed in U.S. Pat. No. 5,940,319 shown in FIG. 36, part of the asteroid curve (white circles) of the MRAM of Example 2 and part of the asteroid curve (white squares) of the MRAM of Example 3 to be explained next. The tunnel magnetoresistance device 50 was arranged to have a size of 0.4 µm (difficult-magnetization axis direction)×0.8 µm (easy-magnetization axis direction).

As is clear from FIG. 22, the second ferromagnetic layer (memory layer) in the MRAM of Example 2 has a lower threshold value of the magnetization direction inversion than the counterpart in the MRAM disclosed in U.S. Pat. No. 5,940,319 shown in FIG. 36, and that in the MRAM of the following Example 3 comes to have a far lower inversion threshold value.

EXAMPLE 3

Figure 23:
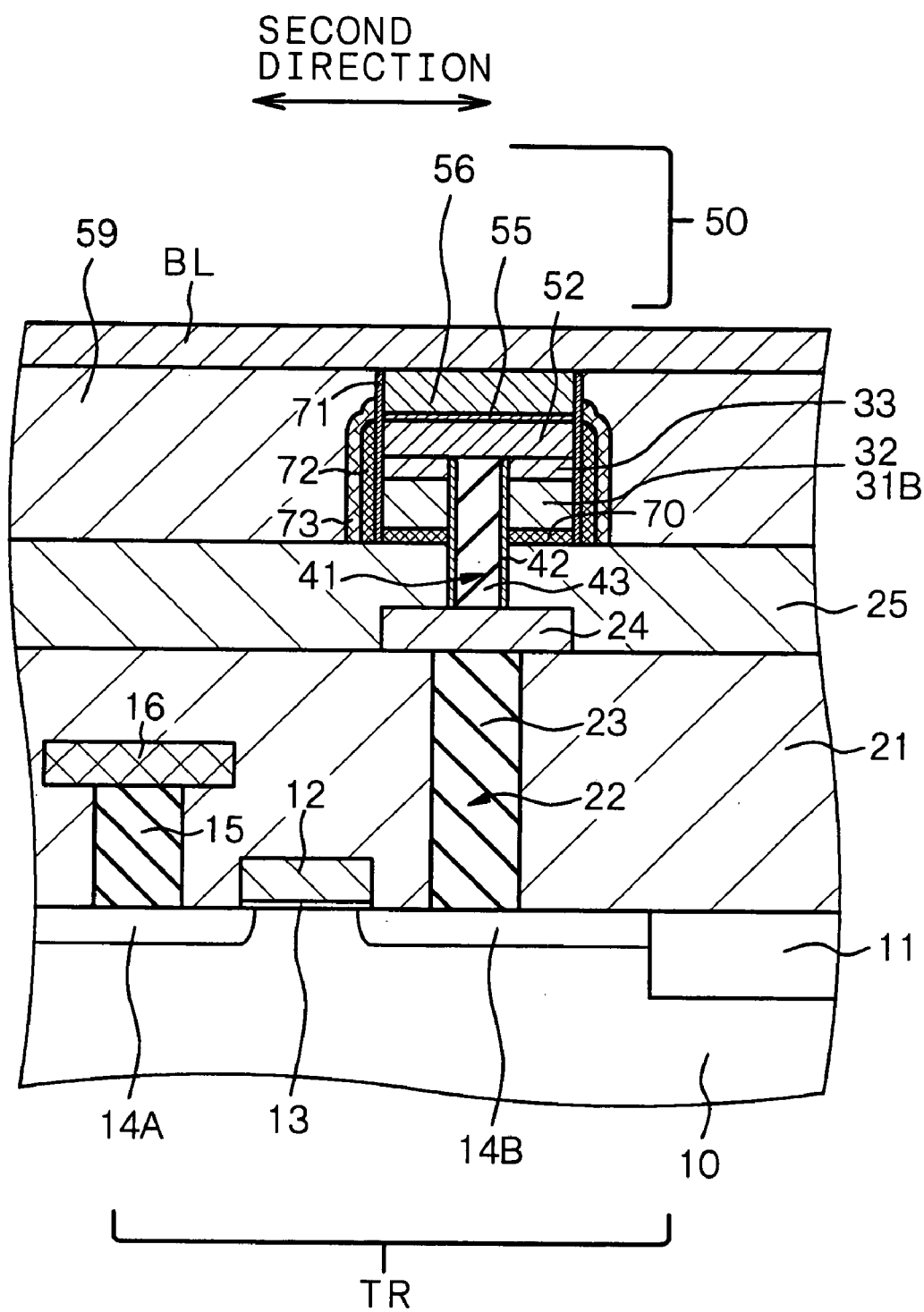
FIG. 23 is a schematic partial cross-sectional view of a nonvolatile magnetic memory device in Example 3.
Figure 24:
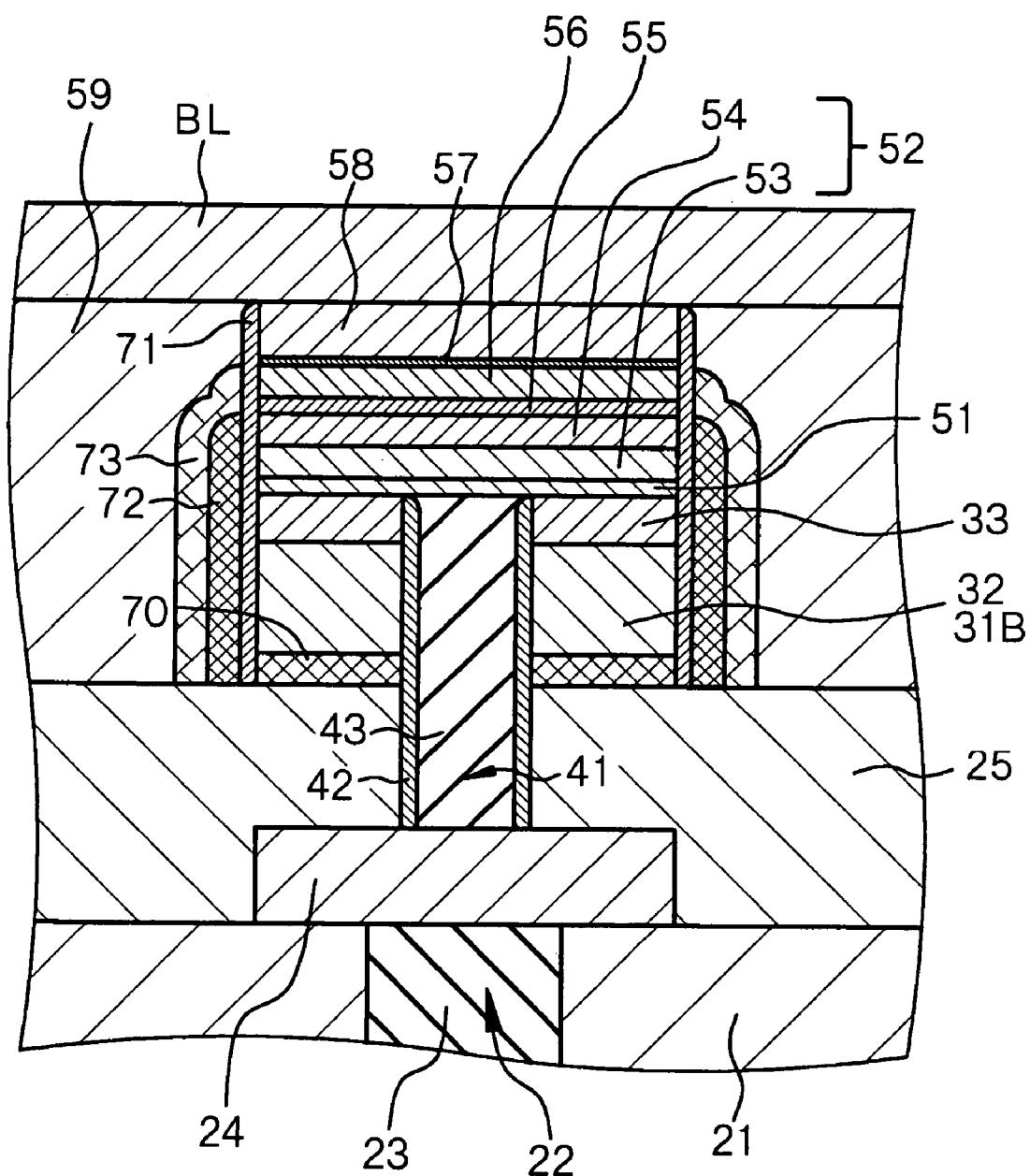
FIG. 24 is an enlarged schematic partial cross-sectional view of a circumferential portion of a tunnel magnetoresistance device of the nonvolatile magnetic memory device in Example 3.

Example 3 is concerned with the MRAM having the second-A constitution of the present invention and a variant of the manufacturing method of an MRAM according to the second aspect of the present invention. FIG. 23 shows a schematic partial cross-sectional view of the MRAM of Example 3, and FIG. 24 shows an enlarged schematic partial cross-sectional view of a circumferential portion of a tunnel magnetoresistance device.

In the MRAM of Example 3, the first wiring (write-in word line) 31B comprises the first high-permeability material layer 70 and the electrically conductive layer 32 which are positioned in this order from below. The first sidewall 71 made of an insulating material is formed on the side surface of the tunnel magnetoresistance device 50, the side surface of an insulating film 33 and the side surface of the first wiring 31B along the first direction (direction perpendicular to the paper surface of the drawing). Further, a second sidewall 72 made of an insulating material is formed on the first sidewall 71 so as to cover the side surface of the first ferromagnetic layer 52, the side surface of the insulating film 33 and the side surface of the first wiring 31B along the first direction. The first sidewall 71 and the second sidewall 72 are covered with the second high-permeability material layer 73. The first high-permeability material layer 70 and the second high-permeability material layer 73 are composed of an Ni—Fe alloy, the first sidewall 71 is composed of alumina ($Al_2O_3$), and the second sidewall 72 is composed of $SiO_2$. The first sidewall 71 and the second sidewall 72 are present between the lower portion of the second high-permeability material layer 73 and the side surface of the first high-permeability material layer 70. Since other structures can be the same as those of the MRAM explained in Example 1, a detailed explanation thereof will be omitted.

In the MRAM of Example 3, the first sidewall 71 is formed so as to cover the side surface of the stacking structure, the side surface of the insulating film 33, the side surface of the electrically conductive layer 32 and the side surface of the first high-permeability material layer 70 in a step similar to [Step-225] in Example 2, and then, the second sidewall 72 is formed so as to cover the side surface of the first ferromagnetic layer 52, the side surface of the insulating film 33, the side surface of the electrically conductive layer 32 and the side surface of the first high-permeability material layer 70. The first sidewall 71 can be formed in the same manner as in [Step-225] in Example 2. The second sidewall 72 can be formed by depositing an $SiO_2$ film on the entire surface by a CVD method, and then, etching back the $SiO_2$ film. The materials for constituting the first sidewall 71 and the second sidewall 72 are not limited to $Al_2O_3$ and $SiO_2$, and any material can be used so long as etching selectivity in etching-back on the formation of the second sidewall 72 can be secured. Further, when etching-back is carried out on the formation of the second sidewall 72, the etching amount of the $SiO_2$ film in the etching-back is adjusted such that the top portion of the second sidewall 72 is positioned lower than the second ferromagnetic layer 56.

Since the MRAM of Example 3 can be manufactured in the same manner as in Example 2 except for the above points, a detailed explanation will be omitted.

In the MRAM of Example 3, the first sidewall 71 is formed on the side surface of the tunnel magnetoresistance device 50, the side surface of the insulating film 33 and the side surface of the first wiring 31B, the second sidewall 72 is formed on the first sidewall 71 so as to cover the side surface of the first ferromagnetic layer 52, the side surface of the insulating film 33 and the side surface of the first wiring 31B, and the second high-permeability material layer 73 is formed on the first and second sidewalls 71 and 72, so that magnetic fluxes can be effectively concentrated on the second ferromagnetic layer 56, and as a result, the current consumption can be fully reduced. Further, since the sidewall is constituted of the first sidewall 71 and the second sidewall 72, the distance between the second high-permeability material layer 73 and the second ferromagnetic layer 56 can be decreased by fully decreasing the thickness of the first sidewall 71, so that magnetic fluxes can be far more effectively concentrated on the second ferromagnetic layer 56.

Figure 25:
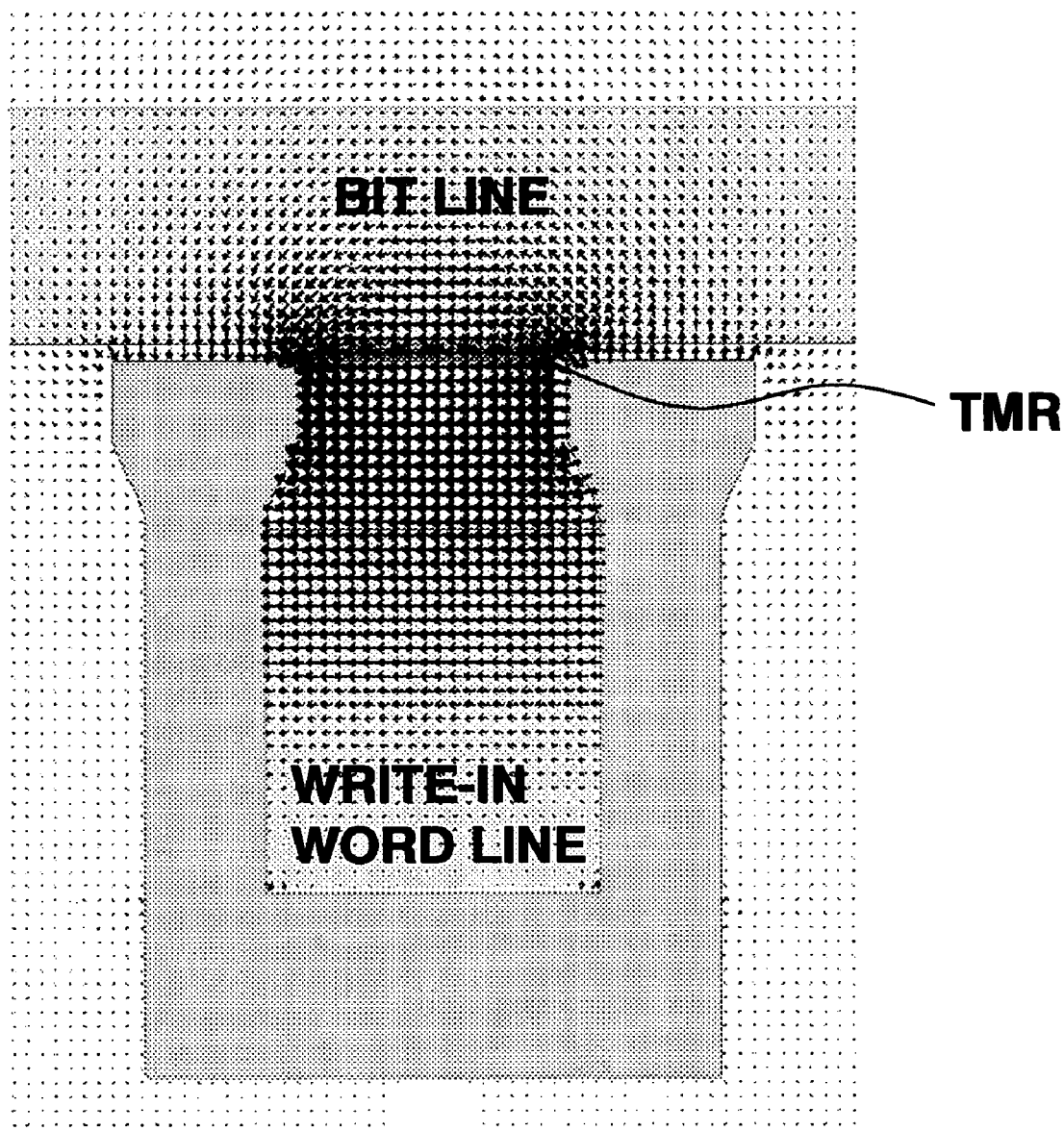
FIG. 25 shows a simulation result of a magnetic flux distribution in the vicinity of a tunnel magnetoresistance device in the nonvolatile magnetic memory device in Example 3.

FIG. 25 shows a simulation result of a magnetic flux distribution in the vicinity of the tunnel magnetoresistance device 50 in the MRAM of Example 3. In FIG. 25, the tunnel magnetoresistance device 50 is shown as TMR. When FIG. 25 and FIG. 21 are compared, it is seen that that magnetic fluxes are more concentrated on the tunnel magnetoresistance device 50 in the MRAM of Example 3. The first sidewall 71 was arranged to have an average thickness of 20 nm, and the second sidewall 72 was arranged to have an average thickness of 10 nm. As shown in FIG. 22, further, the second ferromagnetic layer (memory layer) 56 has a far lower threshold value of the magnetization direction inversion.

EXAMPLE 4

Figure 26:
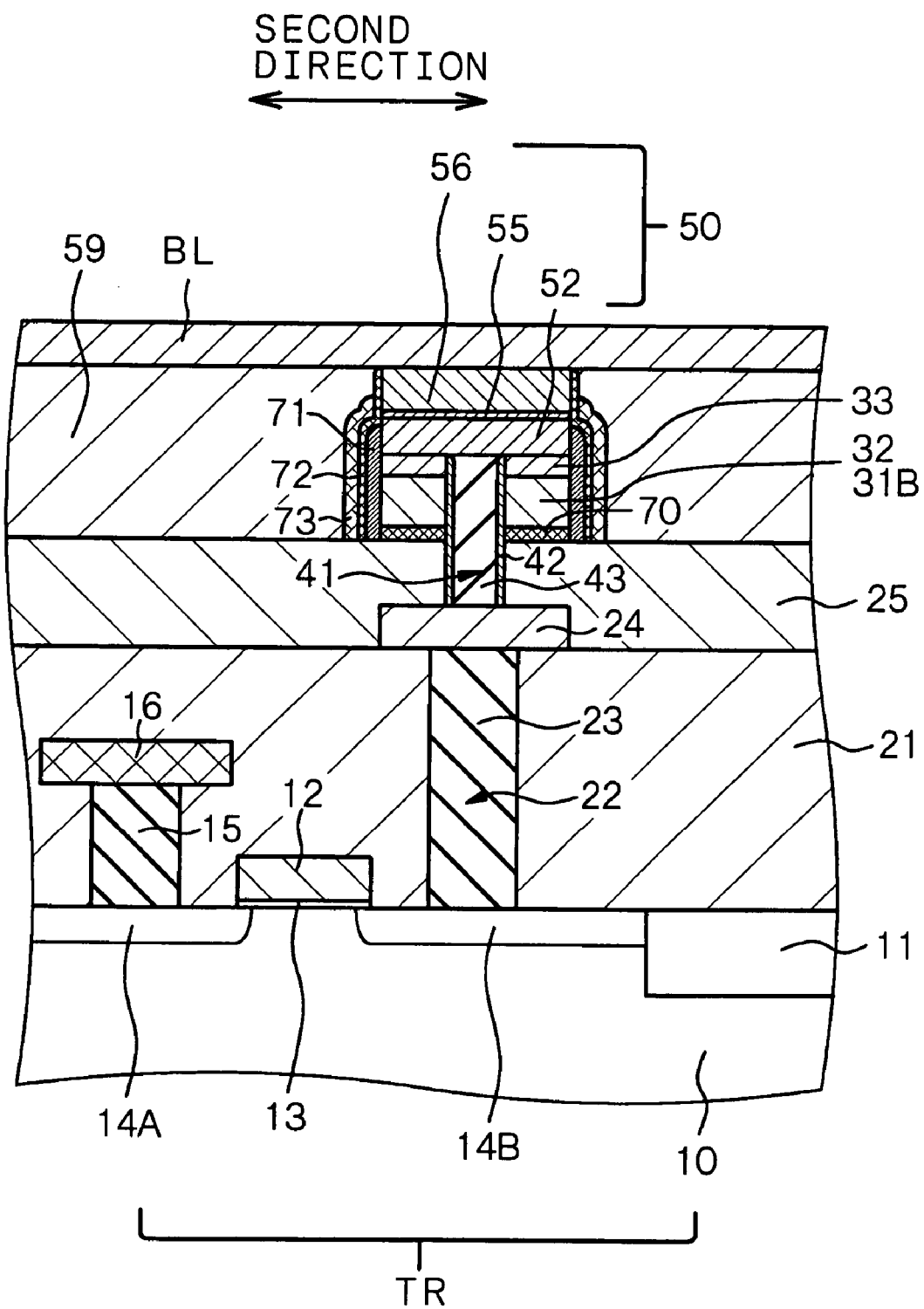
FIG. 26 is a schematic partial cross-sectional view of a nonvolatile magnetic memory device in Example 4.
Figure 27:
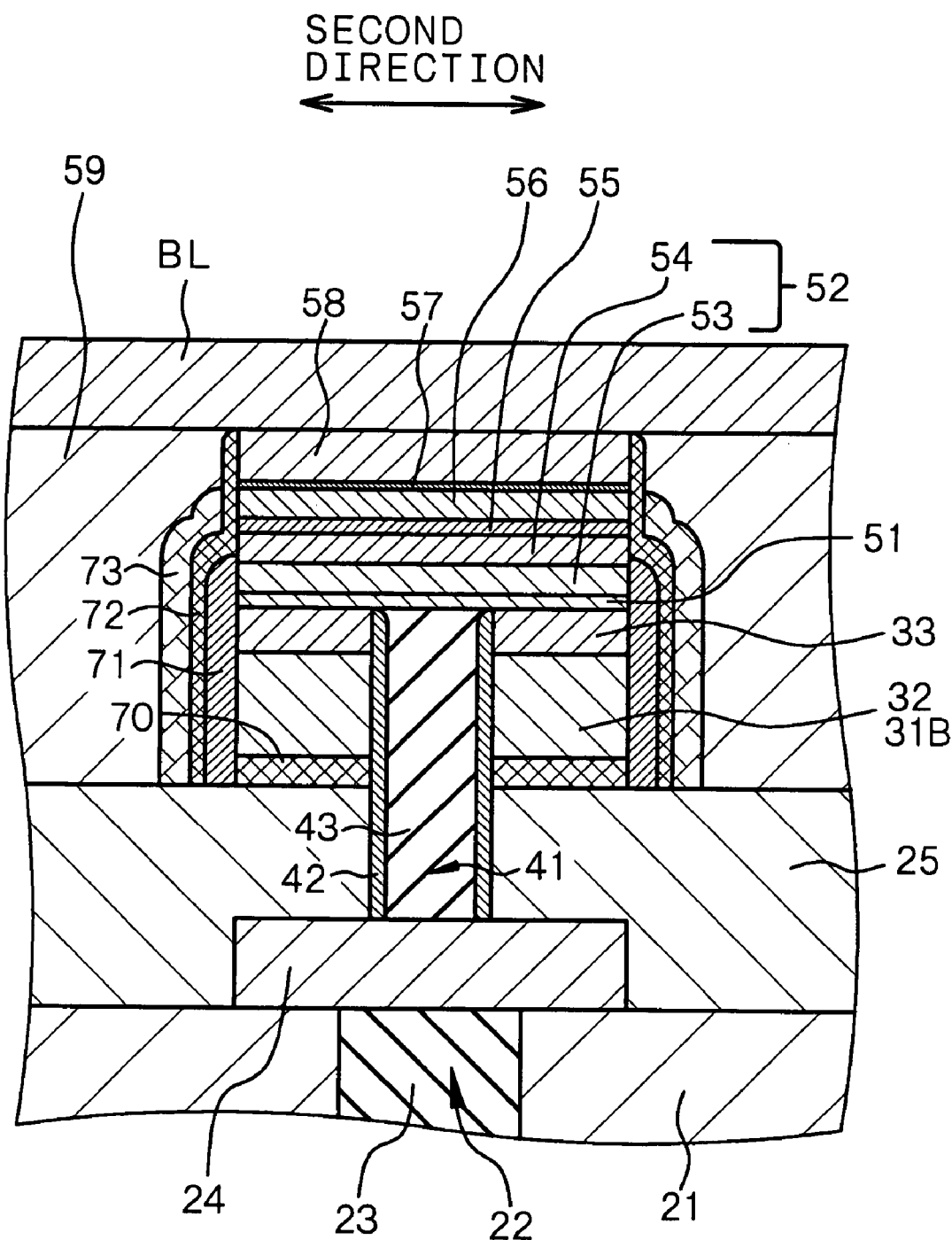
FIG. 27 is an enlarged schematic partial cross-sectional view of a circumferential portion of a tunnel magnetoresistance device of the nonvolatile magnetic memory device in Example 4.

Example 4 is concerned with the MRAM having the second-B constitution of the present invention and a variant of the manufacturing method of an MRAM according to the second aspect of the present invention. FIG. 26 shows a schematic partial cross-sectional view of the MRAM of Example 4, and FIG. 27 shows an enlarged schematic partial cross-sectional view of a circumferential portion of a tunnel magnetoresistance device.

In the MRAM of Example 4, the first wiring (write-in word line) 31B comprises the first high-permeability material layer 70 and the electrically conductive layer 32 which are positioned in this order from below. The first sidewall 71 made of an insulating material is formed on the side surface of the first ferromagnetic layer 52, the side surface of the insulating film 33 and the side surface of the first wiring 31B along the first direction (direction perpendicular to the paper surface of the drawing), and further, the second sidewall 72 made of an insulating material is formed on the first sidewall 71 so as to cover the side surface of the tunnel magnetoresistance device 50, the side surface of the insulating film 33 and the side surface of the first wiring 31B along the first direction. The second sidewall 72 is covered with the second high-permeability material layer 73. The first high-permeability material layer 70 and the second high-permeability material layer 73 are composed of an Ni—Fe alloy, the first sidewall 71 is composed of $SiO_2$, and the second sidewall 72 is composed of alumina ($Al_2O_3$). The first sidewall 71 and the second sidewall 72 are present between the lower portion of the second high-permeability material layer 73 and the side surface of the first high-permeability material layer 70. Since other structures can be the same as those of the MRAM explained in Example 1, a detailed explanation thereof will be omitted.

In the MRAM of Example 4, the first sidewall 71 is formed so as to cover the side surface of the first ferromagnetic layer 52, the side surface of the insulating film 33, the side surface of the electrically conductive layer 32 and the side surface of the first high-permeability material layer 70, and then, the second sidewall 72 is formed so as to cover the side surface of the stacking structure, the side surface of the insulating film 33, the side surface of the electrically conductive layer 32 and the side surface of the first high-permeability material layer 70. The first sidewall 71 and the second sidewall 72 can be formed substantially in the same manner as in Example 3. When etching-back is carried out on the formation of the first sidewall 71, the etching amount of the alumina film in the etching-back is adjusted such that the top portion of the first sidewall 71 is positioned lower than the second ferromagnetic layer 56.

Since the MRAM of Example 4 can be manufactured in the same manner as in Example 2 except for the above points, a detailed explanation will be omitted.

In the MRAM of Example 4, the first sidewall 71 is formed on the side surface of the first ferromagnetic layer 52, the side surface of the insulating film 33 and the side surface of the first wiring 31B, the second sidewall 72 is formed on the first sidewall 71 so as to cover the side surface of the stacking structure, the side surface of the insulating film 33 and the side surface of the first wiring 31B, and the second high-permeability material layer 73 is formed on the second sidewall 72, so that magnetic fluxes can be effectively concentrated on the second ferromagnetic layer 56, and as a result, the current consumption can be fully reduced. Further, since the sidewall is constituted of the first sidewall 71 and the second sidewall 72, the distance between the second high-permeability material layer 73 and the second ferromagnetic layer 56 can be decreased by fully decreasing the thickness of the second sidewall 72, so that magnetic fluxes can be far more effectively concentrated on the second ferromagnetic layer 56.

EXAMPLE 5

Figure 28:
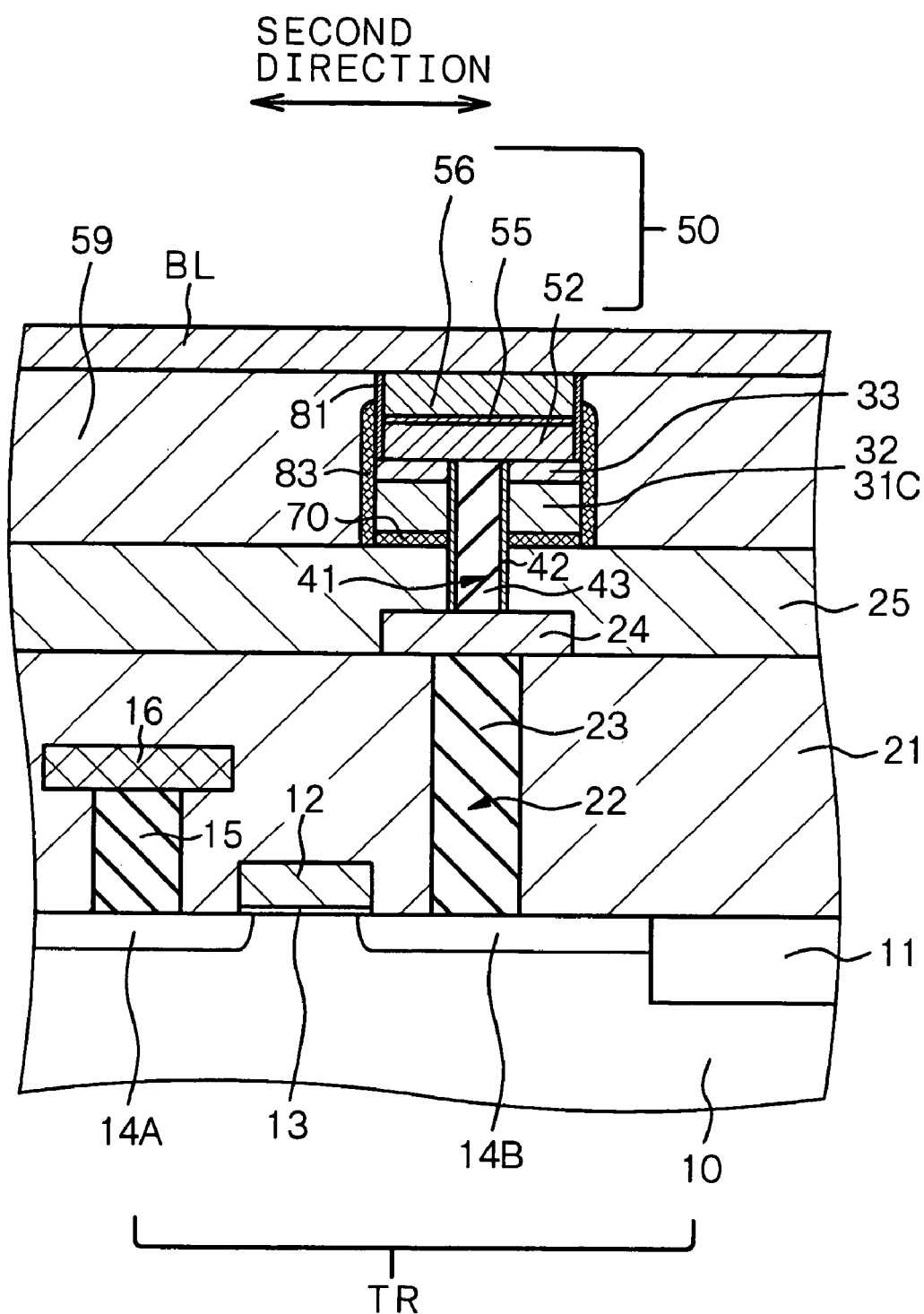
FIG. 28 is a schematic partial cross-sectional view of a nonvolatile magnetic memory device in Example 5.
Figure 29:
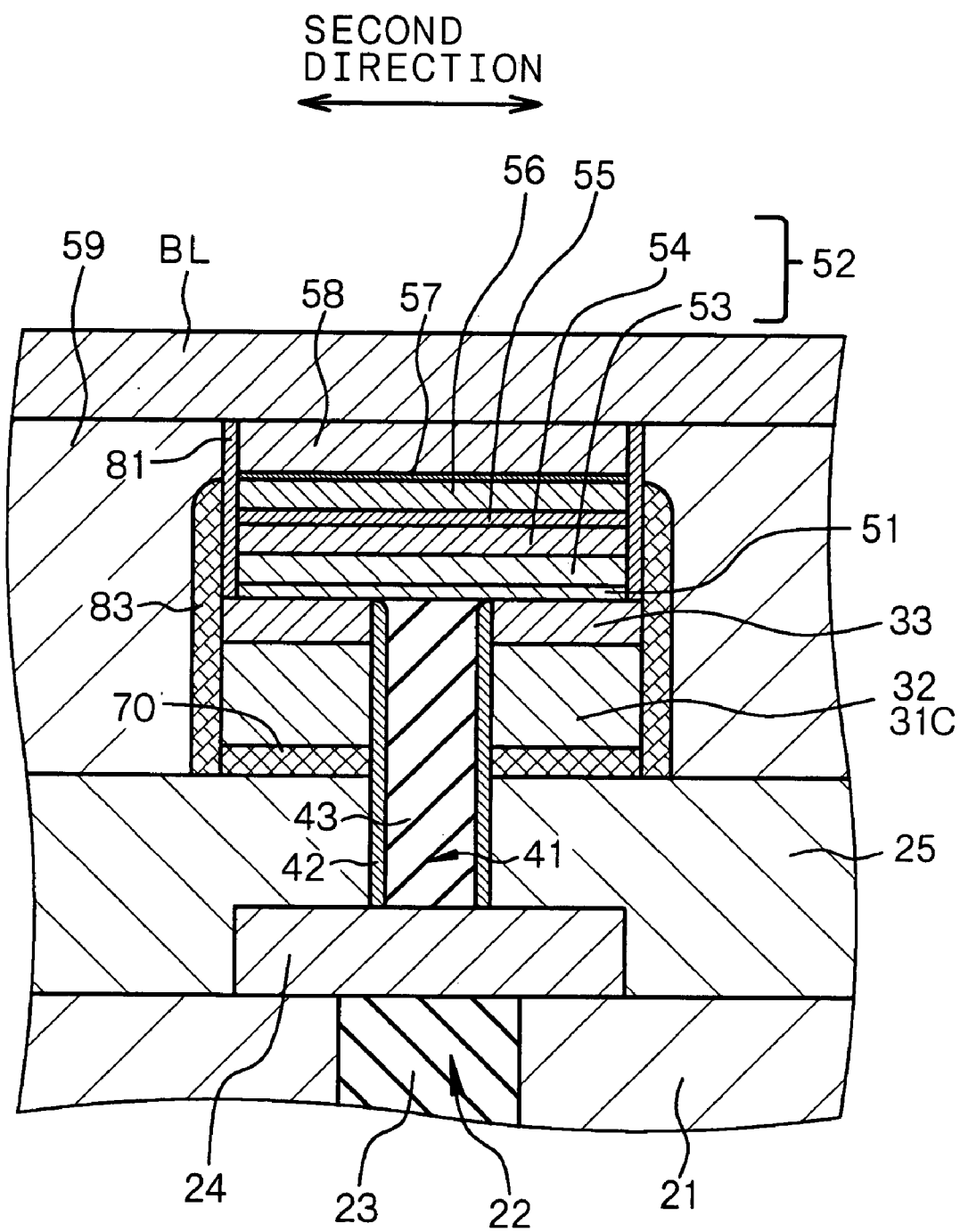
FIG. 29 is an enlarged schematic partial cross-sectional view of a circumferential portion of a tunnel magnetoresistance device of the nonvolatile magnetic memory device in Example 5.

Example 5 is concerned with the MRAM having the third constitution of the present invention and the manufacturing method of an MRAM according to the third aspect of the present invention. FIG. 28 shows a schematic partial cross-sectional view of the MRAM of Example 4, and FIG. 29 shows an enlarged schematic partial cross-sectional view of a circumferential portion of a tunnel magnetoresistance device.

In the MRAM of Example 5, the first wiring (write-in word line) 31C comprises the first high-permeability material layer 70 and the electrically conductive layer 32 which are positioned in this order from below. A sidewall 81 made of an insulating material is formed on the side surface of the tunnel magnetoresistance device 50 along the first direction (direction perpendicular to the paper surface of the drawing), and the sidewall 81, the side surface of the insulating film 33 and the side surface of the first wiring 31C are covered with a second high-permeability material layer 83. The first high-permeability material layer 70 and the second high-permeability material layer 83 are composed of an Ni—Fe alloy, and the sidewall 81 is composed of alumina ($Al_2O_3$). The lower portion of the second high-permeability material layer 83 and the side surface of the high-permeability material layer 70 are in contact with each other. That is, the sidewall 81 is not present in this portion. Since other structures can be the same as those of the MRAM explained in Example 1, a detailed explanation thereof will be omitted.

In the MRAM of Example 5, the tunnel magnetoresistance device 50 including the sidewalls 81, the insulating film 33 and the first wiring 31C have the same widths along the second direction.

The manufacturing method of an MRAM in Example 5 will be explained below with reference to FIGS. 30, 31, 32, 33A and 33B which are schematic partial cross-sectional views of the first insulating interlayer 21 and the like.

[Step-500]

First, the transistor for selection TR is formed in the semiconductor substrate 10, and then, the first insulating interlayer 21 (lower layer of the lower insulating interlayer) is formed on the entire surface. Then, the first opening portion 22 is formed through the first insulating interlayer 21, the first connecting hole 23 connected to the transistor for selection TR is formed in the first opening portion 22, and then, the second insulating interlayer 25 (upper layer of the lower insulating interlayer) is formed on the entire surface. These steps can be carried out substantially in the same manner as in [Step-100], [Step-105], [Step-110] and [Step-115] in Example 1, so that a detailed explanation thereof will be omitted.

[Step-505]

Then, the first high-permeability material layer 70, the electrically conductive layer 32 and the insulating film 33 are formed on the second insulating interlayer 25 (upper layer of the lower insulating interlayer). Specifically, a step similar to [Step-205] in Example 2 is carried out.

[Step-510]

Then, the second opening portion 41 is formed through at least portions of the insulating film 33, the electrically conductive layer 32 and the first high-permeability material layer 70 (more specifically, portions of the insulating film 33, the electrically conductive layer 32, the first high-permeability material layer 70 and the second insulating interlayer 25) which portions are positioned above the first connecting hole 23 (more specifically, the landing pad 24). Then, the second connecting hole 43 electrically insulated from the electrically conductive layer 32 and connected to the connecting hole 23 (more specifically, the landing pad 24) is formed in the second opening portion 41. Specifically, it is substantially sufficient to carry out a step similar to [Step-125] in Example 1.

[Step-515]

Then, the stacking structure formed of at least the first ferromagnetic layer 52, the tunnel barrier 55 and the second ferromagnetic layer 56 is formed on the insulating film 33. Specifically, it is substantially sufficient to carry out a step similar to [Step-130] in Example 1. In Example 5, a 50 nm thick protective layer 90 made of SiN is formed on the electrically conductive material layer 58.

[Step-520]

Figure 30:
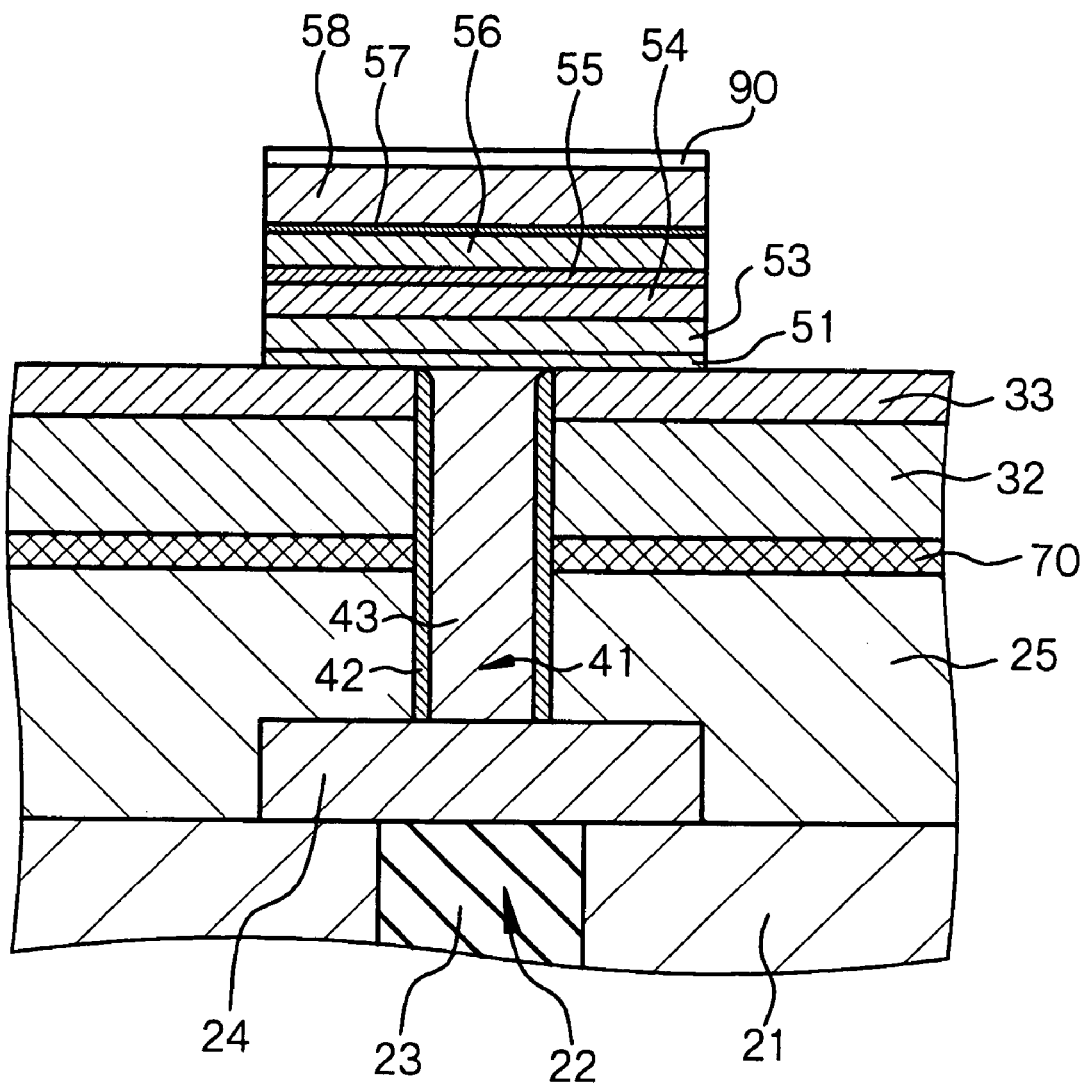
FIG. 30 is a schematic partial cross-sectional view of a first insulating interlayer, etc., for explaining a manufacturing method of a nonvolatile magnetic memory device in Example 5.

Then, the stacking structure is patterned in the form of a stripe extending in the first direction by lithography and etching techniques, to expose the insulating film 33 (see FIG. 30).

[Step-525]

Figure 31:
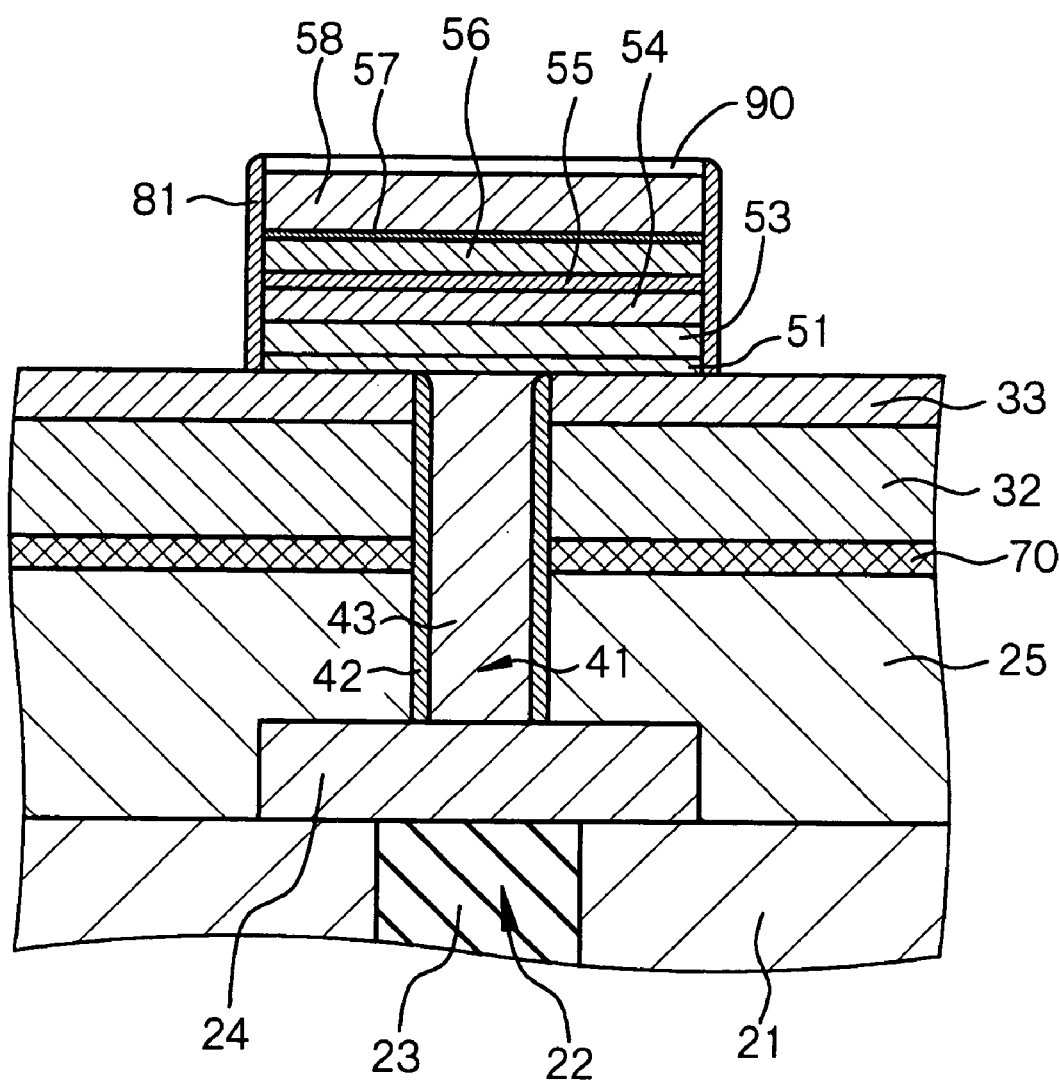
FIG. 31, following

Then, a 30 nm thick SiN film is formed on the entire surface by a plasma CVD method, and then, the SiN film is etched back to form the sidewall 81 made of SiN on the side surface of the stacking structure (see FIG. 31).

[Step-530]

Figure 32:
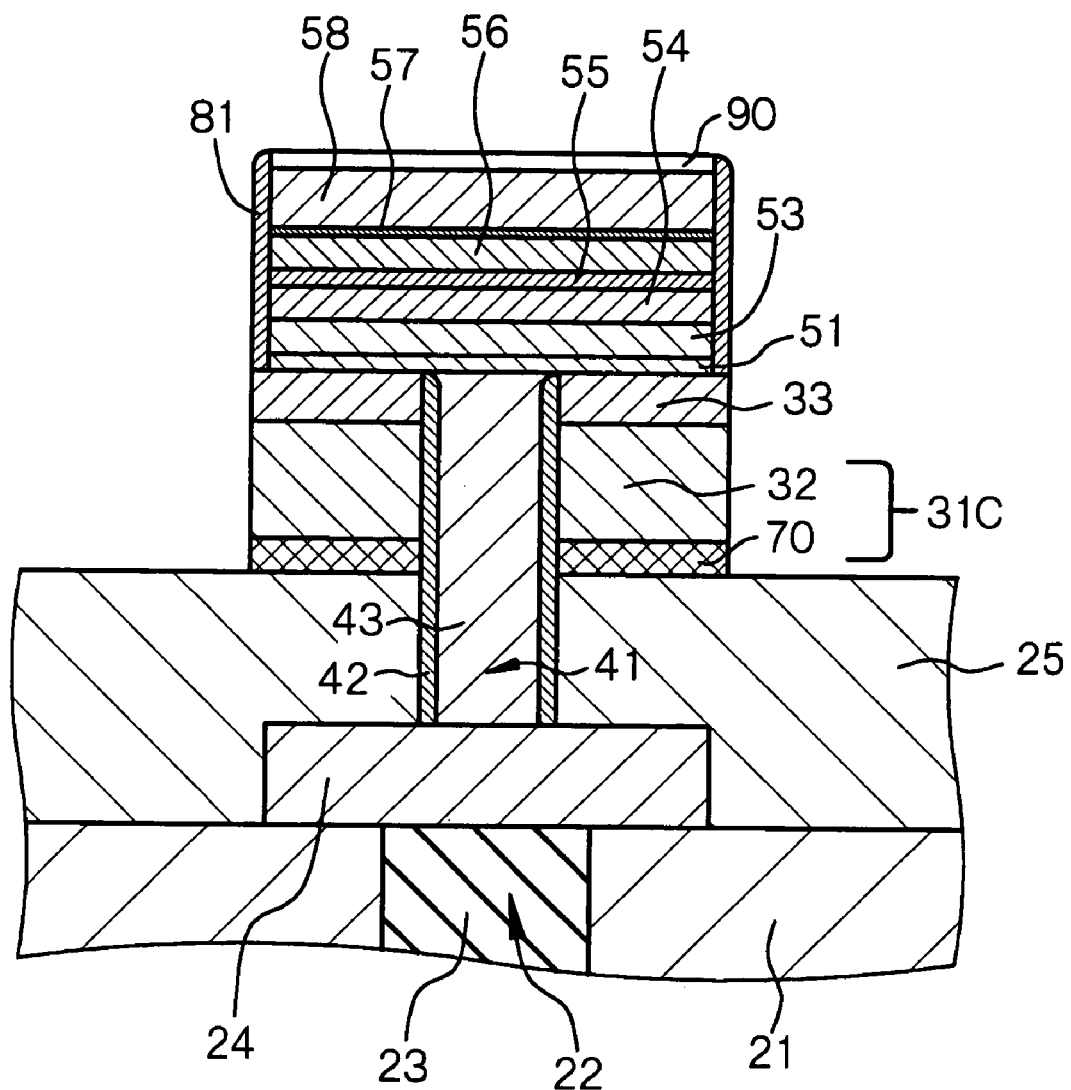
FIG. 32, following

Then, the insulating film 33, the electrically conductive layer 32 and the first high-permeability material layer 70 are patterned in a self-alignment manner in the form of a strip extending in the first direction with using the stacking structure (more specifically, the protective layer 90) and the sidewalls 81 as an etching mask (see FIG. 32). In this manner, there can be obtained the first wiring 31C that is formed of the electrically conductive layer 32 and the first high-permeability material layer 70 and extends in the first direction.

[Step-535]

Then, the second high-permeability material layer 83 is formed on the sidewall 81, the side surface of the insulating film 33, the side surface of the electrically conductive layer 32 and the side surface of the first high-permeability material layer 70 (see FIG. 33A) Specifically, it is sufficient to carry out a step similar to [Step-230] in Example 2.

[Step-540]

Figure 33A:
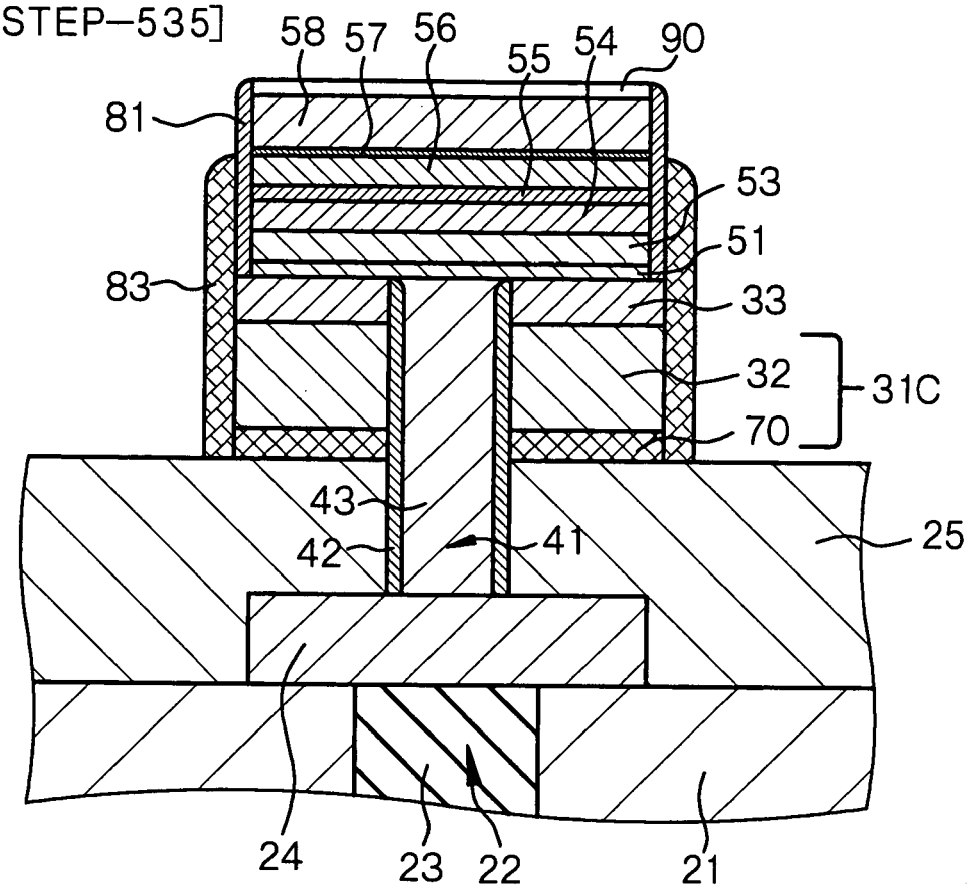
FIGS. 33A and 33B, following
Figure 33B:
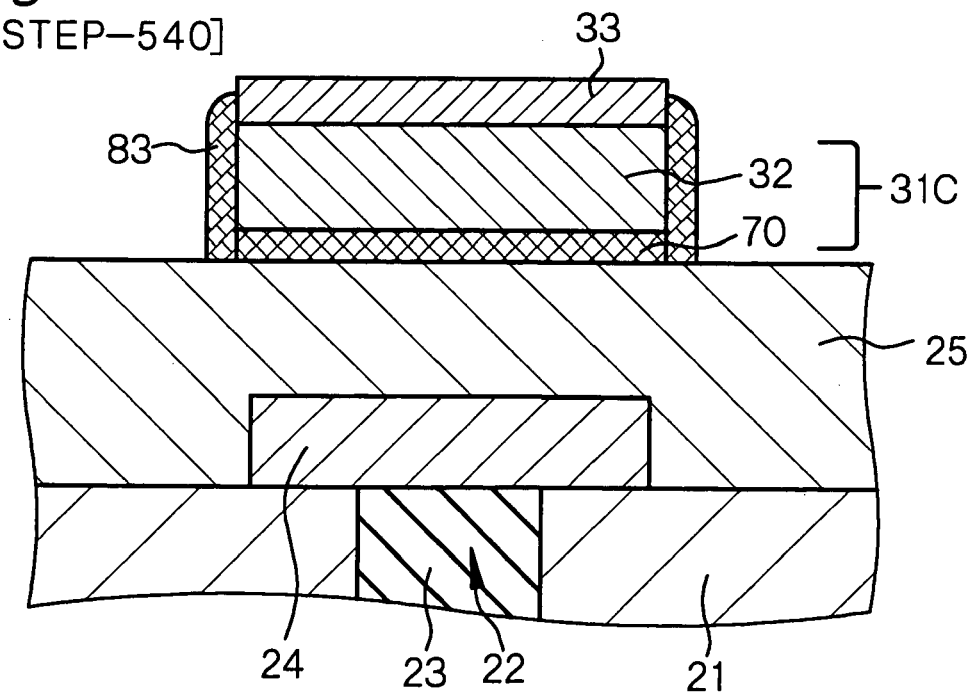

Then, the stacking structure patterned in the form of a stripe, the sidewalls 81 and the second high-permeability material layer 83 are selectively removed, whereby there is formed the tunnel magnetoresistance device 50 having the tunnel barrier 55 sandwiched between the first and second ferromagnetic layer layers 53, 54 and 56. The portion where the tunnel magnetoresistance device 50 is formed has a schematic partial cross-sectional view as shown in FIG. 33A. The stacking structure patterned in the form of a stripe and the like are selectively removed, and the first wiring 31C and the insulating film 33 are left between the tunnel magnetoresistance device 50 and the tunnel magnetoresistance device 50, which state is shown as a schematic partial cross-sectional view in FIG. 33B.

[Step-545]

Then, the upper insulating interlayer (third insulating interlayer 59) is formed on the entire surface, and on the third insulating interlayer 59, there is formed the second wiring (bit line BL) that is electrically connected to the second ferromagnetic layer (more specifically, the electrically conductive material layer 58) and extends in the second direction crossing the first direction at right angles (leftward and rightward on the drawing). These steps can be carried out substantially in the same manner as in [Step-145] and [Step-150] in Example 1.

In the MRAM of Example 5, the tunnel magnetoresistance device including the sidewalls 81, the insulating film 33 and the first wiring 31C have the same widths along the second direction, so that the minimum cell size can be materialized and that there is not caused the problem that the fluctuation of writing characteristics increases due to asymmetricity of the asteroid curve. Further, the sidewall 81 is formed on the side surface of the tunnel magnetoresistance device 50, and the second high-permeability material layer 83 is formed on the sidewall 81, so that magnetic fluxes can be effectively concentrated on the second ferromagnetic layer 56, and as a result, the current consumption can be fully reduced. Furthermore, the first high-permeability material layer 70 and the second high-permeability material layer 83 are in contact with each other, so that magnetic fluxes can be far more effectively concentrated on the second ferromagnetic layer 56.

In the manufacturing method of an MRAM according to Example 5, the stacking structure is patterned in the form of a stripe extending in the first direction in the above [Step-520], and in the above [Step-530], the insulating film 33, the electrically conductive layer 32 and the first high-permeability material layer 70 are patterned in a self-alignment manner in the form of a stripe extending in the first direction with using the protective layer 90 and the sidewalls 81 as an etching mask, so that the lithography step is free of a mask alignment deviation, and that the minimum cell size can be materialized. Further, the sidewall 81 is formed on the side surface of the stacking structure in the above [Step-525], and in the above [Step-535], the second high-permeability material layer 83 is formed on the sidewall 81, the side surface of the insulating film 33, the side surface of the electrically conductive layer 32 and the side surface of the first high-permeability material layer 70, so that the first high-permeability material layer 70 and the second high-permeability material layer 83 are in a state where they are in contact with each other, and as a result, magnetic fluxes can be effectively concentrated on the second ferromagnetic layer 56 and the current consumption can be fully reduced.

While the present invention has been explained with reference to Examples hereinabove, the present invention shall not be limited thereto. Those materials for constituting layers, the method of forming the layers and the MRAM structures explained in Examples are given as examples and can be modified and changed as required. The second insulating interlayer 25 may be omitted and the first connecting hole 23 and the second connecting hole 43 may be integrally formed as required. In this case, the step of forming the first connecting hole 23 can be omitted, and it is sufficient to form a second connecting hole connected to the transistor for selection.

In [Step-140] in Example 1, [Step-235] in Example 2 or [Step-540] in Example 5, the stacking structure patterned in the form of a stripe is selectively removed, thereby to form the tunnel magnetoresistance device 50 sandwiched between the first and second ferromagnetic layers 53, 54 and 56. In this case, the plan form of the tunnel magnetoresistance device 50 may be a rectangular form whose facing two sides are in parallel with the first direction or may be a rhombic or rhomboidal form whose facing two sides are in parallel with the first direction. In the latter case, the remaining two sides are no longer in parallel with the second direction, and the inversion speed of the magnetization direction of the second ferromagnetic layer (memory layer 56) can be increased.

In the nonvolatile magnetic memory device of the present invention, the tunnel magnetoresistance device, the insulating film and the first wiring have nearly the same widths along the second direction, so that the minimum cell size can be materialized and that there is not caused the problem that the fluctuation of writing characteristics increases due to asymmetricity of the asteroid curve. Further, the first wiring (write-in word line) is constituted of the first high-permeability material layer and the electrically conductive layer which are positioned in this order from below, and the side surface of the tunnel magnetoresistance device is indirectly covered with the second high-permeability material layer magnetically coupled to the first high-permeability material layer, so that magnetic fluxes can be effectively concentrated on the second ferromagnetic layer, and as a result, the current consumption can be fully reduced.

What is claimed is:

1. A nonvolatile magnetic memory device comprising;
   (A) a transistor for selection which is formed in a semiconductor substrate,
   (B) a lower insulating interlayer which covers the transistor for selection,
   (C) a first connecting hole which is formed in a first opening portion made through the lower insulating interlayer and is connected to the transistor for selection,
   (D) a first wiring which is formed on the lower insulating interlayer, is composed of an electrically conductive layer, and extends in a first direction,
   (E) a tunnel magnetoresistance device which is formed on the first wiring through an insulating film, and has a stacking structure formed of a first ferromagnetic layer, a tunnel barrier and a second ferromagnetic layer which are positioned in this order from below,
   (F) an upper insulating interlayer which covers the tunnel magnetoresistance device, the lower insulating interlayer and an extending portion of the first wiring, and
   (G) a second wiring which is formed on the upper insulating interlayer, is electrically connected to a top surface of the tunnel magnetoresistance device, and extends in a second direction different from the first direction,
   in which a lower surface of the tunnel magnetoresistance device is electrically connected to the first connecting hole through a second connecting hole which is formed in a second opening portion made through at least the insulating film and the first wiring and is electrically insulated from the first wiring, and
   the tunnel magnetoresistance device, the insulating film and the first wiring have nearly the same widths along the second direction.

2. The nonvolatile magnetic memory device according to claim 1, in which said first wiring comprises a first high-permeability material layer and said electrically conductive layer which are positioned in this order from below,
   a sidewall made of an insulating material is formed on each side surface of said tunnel magnetoresistance device, said insulating film and said first wiring along the first direction, and
   the sidewall is covered with a second high-permeability material layer.

3. The nonvolatile magnetic memory device according to claim 1, in which said first wiring comprises a first high-permeability material layer and said electrically conductive layer which are positioned in this order from below,
   a first sidewall made of an insulating material is formed on each side surface of said tunnel magnetoresistance device, said insulating film and said first wiring along the first direction,
   a second sidewall made of an insulating material is formed on said first sidewall so as to cover each side surface of said first ferromagnetic layer, said insulating film and said first wiring along the first direction, and
   said first sidewall and said second sidewall are covered with a second high-permeability material layer.

4. The nonvolatile magnetic memory device according to claim 1, in which said first wiring comprises a first high-permeability material layer and said electrically conductive layer which are positioned in this order from below,
   a first sidewall made of an insulating material is formed on each side surface of said first ferromagnetic layer, said insulating film and said first wiring along the first direction,
   a second sidewall made of an insulating material is formed on said first sidewall so as to cover each side surface of said tunnel magnetoresistance device, said insulating film and said first wiring along the first direction, and said second sidewall is covered with a second high-permeability material layer.

5. The nonvolatile magnetic memory device according to claim 1, in which said first wiring comprises a first high-permeability material layer and said electrically conductive layer which are positioned in this order from below, a sidewall made of an insulating material is formed on a side surface of said tunnel magnetoresistance device along the first direction, and said sidewall and each side surface of said insulating film and said first wiring are covered with a second high-permeability material layer.

* * * * *